US009893082B2

(12) United States Patent
Kim et al.

(10) Patent No.: US 9,893,082 B2
(45) Date of Patent: *Feb. 13, 2018

(54) SEMICONDUCTOR MEMORY DEVICE AND METHOD OF FABRICATING THE SAME

(71) Applicant: Samsung Electronics Co., Ltd., Suwon-si, Gyeonggi-do (KR)

(72) Inventors: Chaeho Kim, Seoul (KR); Sangryol Yang, Suwon-si (KR); Woong Lee, Seoul (KR); SeungHyun Lim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/250,091

(22) Filed: Aug. 29, 2016

(65) Prior Publication Data
US 2016/0365357 A1 Dec. 15, 2016

Related U.S. Application Data

(62) Division of application No. 14/960,776, filed on Dec. 7, 2015, now Pat. No. 9,478,561.

(30) Foreign Application Priority Data

Jan. 30, 2015 (KR) .................. 10-2015-0015310
Feb. 13, 2015 (KR) .................. 10-2015-0022401

(51) Int. Cl.
*H01L 27/115* (2017.01)
*H01L 29/423* (2006.01)
(Continued)

(52) U.S. Cl.
CPC .. *H01L 27/11582* (2013.01); *H01L 27/11565* (2013.01); *H01L 27/11573* (2013.01);
(Continued)

(58) Field of Classification Search
CPC ......... H01L 27/11526; H01L 27/11529; H01L 27/11551; H01L 27/11556;
(Continued)

(56) References Cited

U.S. PATENT DOCUMENTS 8,178,917 B2   5/2012   Tanaka et al.
8,350,314 B2   1/2013   Fukuzumi et al.
(Continued)

FOREIGN PATENT DOCUMENTS

KR    2010-0091900 A    8/2010
KR    2010-0107661 A    10/2010
(Continued)

*Primary Examiner* — Johannes P Mondt
(74) *Attorney, Agent, or Firm* — Harness, Dickey & Pierce

(57) ABSTRACT

A semiconductor memory device includes a stack including gate electrodes and insulating layers that are alternately and repeatedly stacked on a substrate. A cell channel structure penetrates the stack. The cell channel structure includes a first semiconductor pattern contacting the substrate and a first channel pattern on the first semiconductor pattern. The first semiconductor pattern extends to a first height from a surface of the substrate to a top surface of the first semiconductor pattern. A dummy channel structure on the substrate and spaced apart from the stack. The dummy channel structure includes a second semiconductor pattern contacting the substrate and a second channel pattern on the second semiconductor pattern. The second semiconductor pattern extends to a second height from the surface of the substrate to a top surface of the second semiconductor pattern. The first height is greater than the second height.

15 Claims, 41 Drawing Sheets

(51) Int. Cl.
*H01L 27/11582* (2017.01)
*H01L 27/11573* (2017.01)
*H01L 29/51* (2006.01)
*H01L 27/11575* (2017.01)
*H01L 27/11565* (2017.01)

(52) U.S. Cl.
CPC .. *H01L 27/11575* (2013.01); *H01L 29/42348* (2013.01); *H01L 29/513* (2013.01)

(58) Field of Classification Search
CPC ......... H01L 27/11565; H01L 27/11572; H01L 27/11573; H01L 27/11582; H01L 27/105; H01L 27/1052; H01L 29/42348; H01L 29/792
USPC ......... 438/268; 257/315, 324, 368, E21.645, 257/E21.655
See application file for complete search history.

(56) References Cited

U.S. PATENT DOCUMENTS

| | | | |
|---|---|---|---|
| 8,395,206 B2 | 3/2013 | Lee et al. | |
| 8,426,304 B2 | 4/2013 | Yoo et al. | |
| 8,592,890 B2 | 11/2013 | Watanabe et al. | |
| 8,644,046 B2 | 2/2014 | Seol et al. | |
| 8,749,078 B2 | 6/2014 | Murakami | |
| 2010/0090286 A1* | 4/2010 | Lee | H01L 27/11526 257/368 |
| 2010/0133599 A1* | 6/2010 | Chae | H01L 27/11578 257/315 |
| 2010/0248439 A1 | 9/2010 | Chung et al. | |
| 2011/0031546 A1 | 2/2011 | Uenaka et al. | |
| 2011/0073866 A1 | 3/2011 | Kim et al. | |
| 2011/0227141 A1 | 9/2011 | Jeong et al. | |
| 2012/0068253 A1 | 3/2012 | Oota et al. | |
| 2013/0100722 A1 | 4/2013 | Shin | |
| 2013/0248965 A1* | 9/2013 | Nakai | H01L 29/788 257/315 |
| 2014/0063890 A1 | 3/2014 | Lee et al. | |

FOREIGN PATENT DOCUMENTS

| | | |
|---|---|---|
| KR | 2011-0015337 A | 2/2011 |
| KR | 2011-0034816 A | 4/2011 |

* cited by examiner

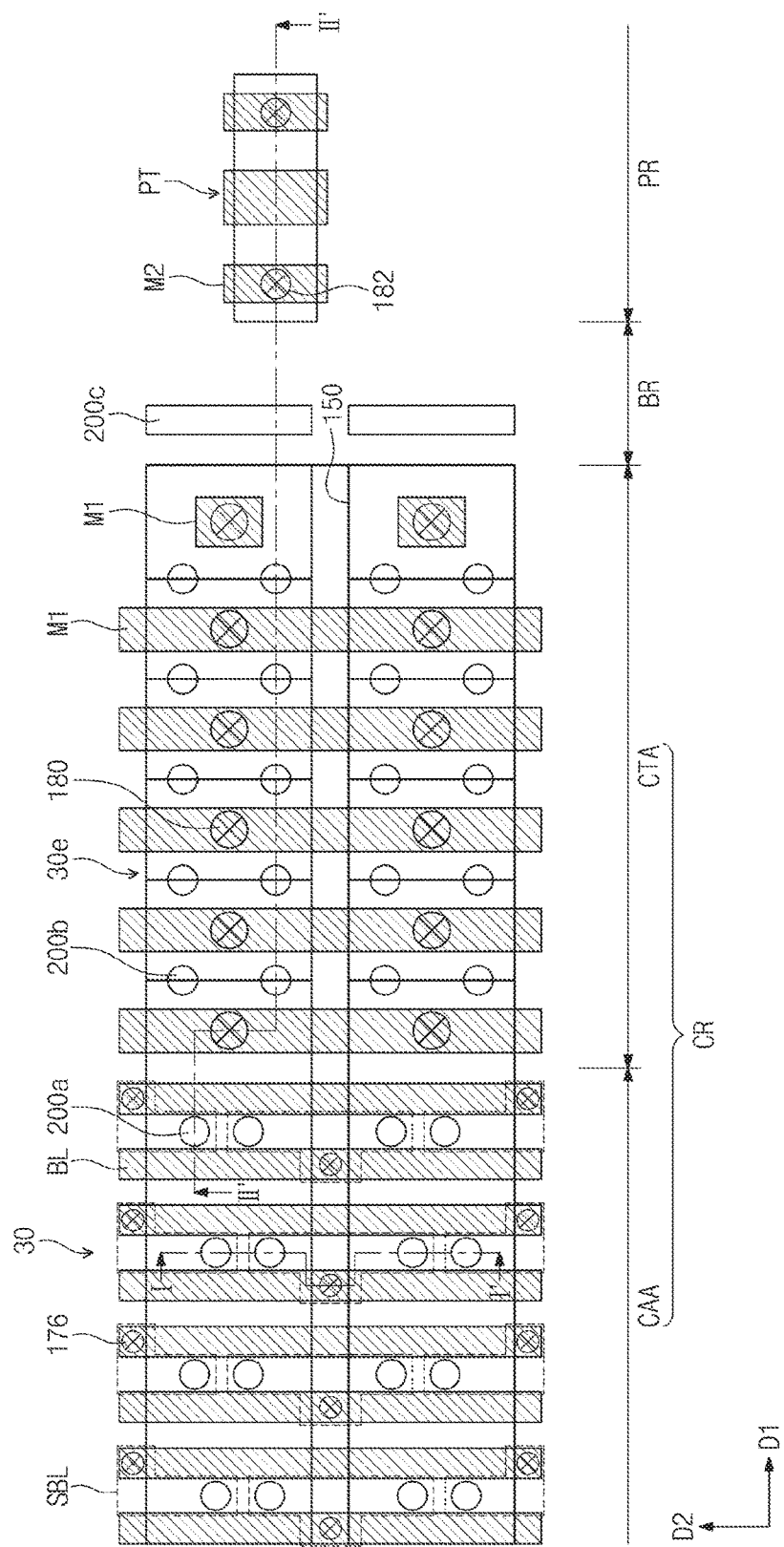

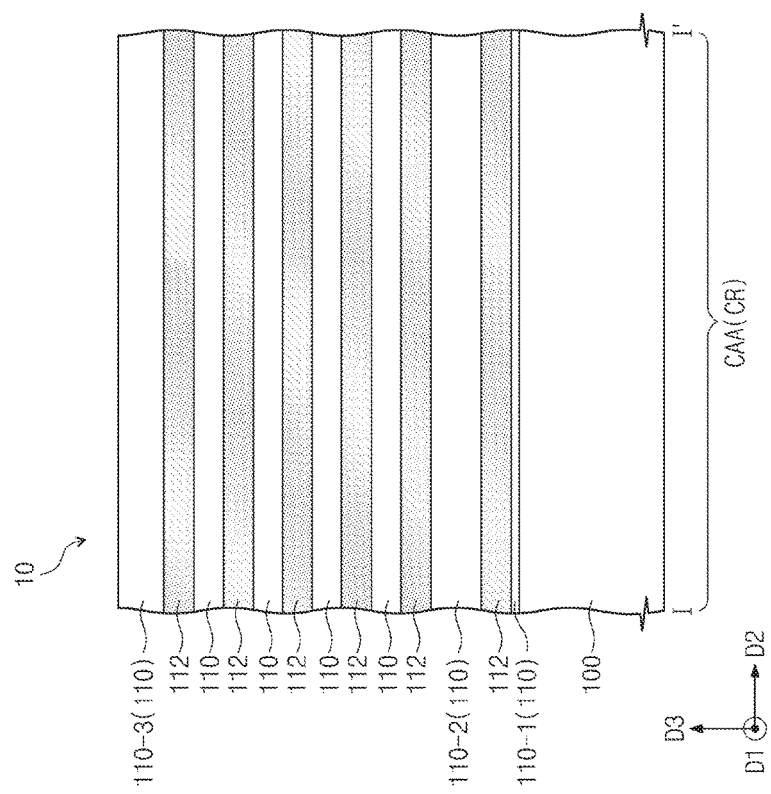

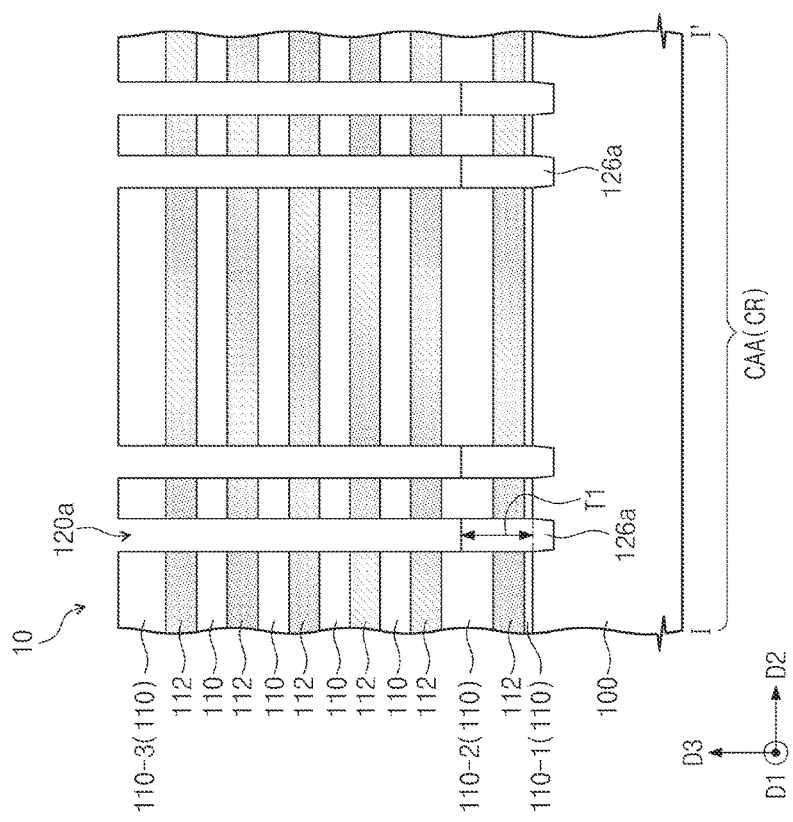

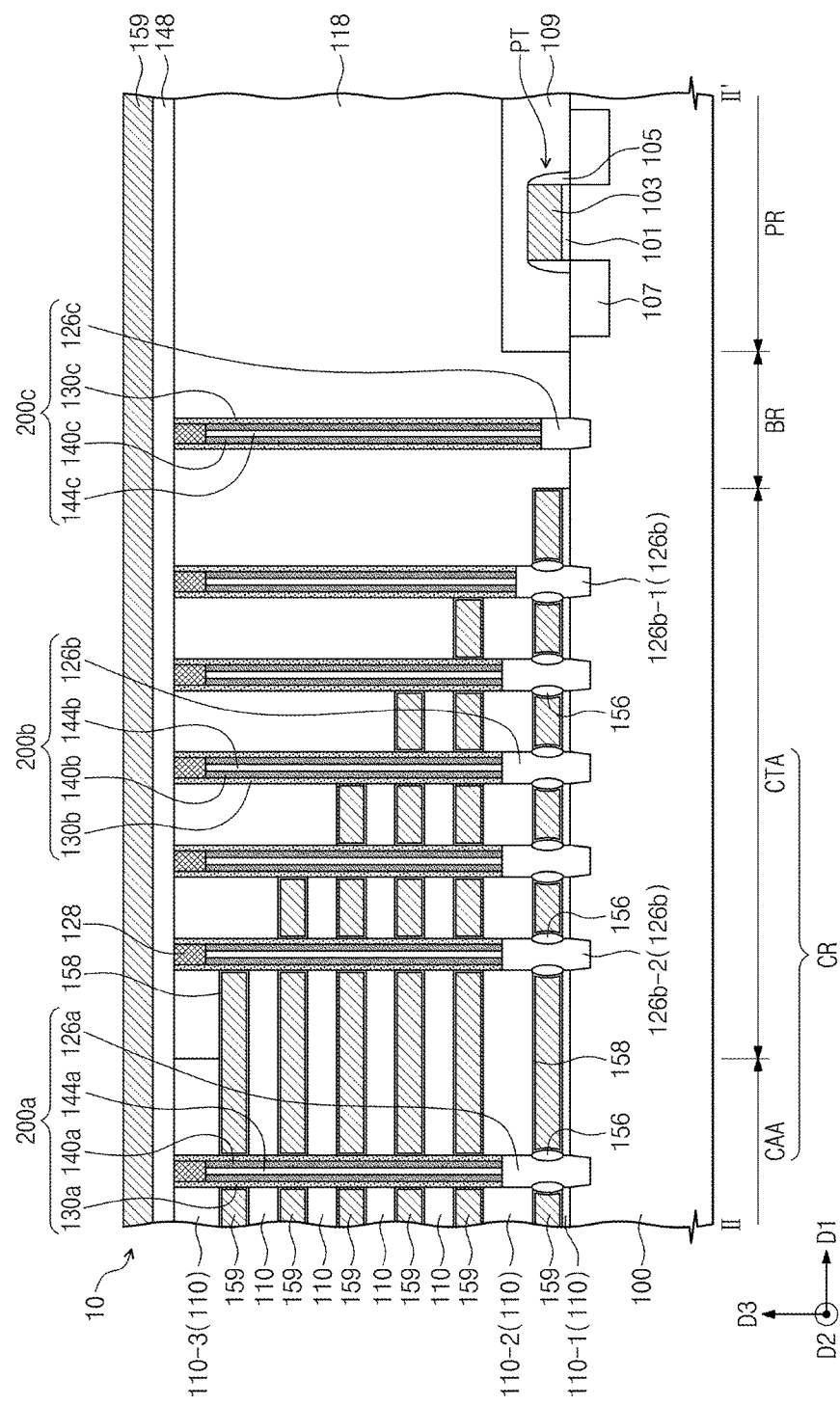

SEMICONDUCTOR MEMORY DEVICE AND METHOD OF FABRICATING THE SAME

CROSS-REFERENCE TO RELATED APPLICATIONS

This U.S. non-provisional patent application is a divisional of U.S. application Ser. No. 14/960,776, filed on Dec. 7, 2015, which claims priority under 35 U.S.C. § 119 to Korean Patent Application No. 10-2015-0015310, filed on Jan. 30, 2015, and No. 10-2015-0022401, filed on Feb. 13, 2015 in the Korean Intellectual Property Office, the entire contents of each of the above-referenced applications are hereby incorporated by reference.

BACKGROUND

Example embodiments of inventive concepts relate to a semiconductor memory device and/or a method of fabricating the same, and in particular, to a semiconductor memory device with improved reliability and increased integration density and/or a method of fabricating the same.

In semiconductor devices, increasing integration may lower costs and improve performance. Currently, in a two-dimensional memory semiconductor device or a planar memory semiconductor device, integration is largely affected by a technique of forming a fine pattern, because integration is mainly determined by an area that a unit memory cell occupies. However, since ultrahigh-priced equipment is required to form a fine pattern, increasing integration of a two-dimensional memory semiconductor device is still economically limited.

To overcome such a limitation, three-dimensional memory devices (that is, including three-dimensionally arranged memory cells) have been proposed.

SUMMARY

Example embodiments of inventive concepts provide a semiconductor memory device with improved reliability and increased integration density.

Example embodiments of inventive concepts provide a method of fabricating a semiconductor memory device with improved reliability and increased integration density.

According to example embodiments of inventive concepts, a semiconductor memory device may include a substrate; a stack on the substrate, the stack including gate electrodes and insulating layers that are alternately and repeatedly stacked on the substrate; a cell channel structure penetrating the stack, the cell channel structure including a first semiconductor pattern contacting the substrate and a first channel pattern on the first semiconductor pattern, the first channel pattern contacting the first semiconductor pattern, the first semiconductor pattern extending to a first height from a surface of the substrate to a top surface of the first semiconductor pattern; and a first dummy channel structure on the substrate, the first dummy channel structure being spaced apart from the stack, the first dummy channel structure including a second semiconductor pattern contacting the substrate and a second channel pattern on the second semiconductor pattern, the second channel pattern contacting the second semiconductor pattern. The second semiconductor pattern may extend to a second height from the surface of the substrate to a top surface of the second semiconductor pattern. The first height is greater than the second height.

In example embodiments, the semiconductor memory device may further include a bit line connected to the cell channel structure.

In example embodiments, the cell channel structure may further include a first data storing pattern between the stack and the first channel pattern. The first dummy channel structure may further include a second storing pattern in contact with a sidewall of the second channel pattern. A material in the first channel pattern may be the same as a material in the second channel pattern. A material in the first data storing pattern may be the same as a material in the second data storing pattern.

In example embodiments, the substrate may include a cell region including a cell array region and a connection region, a peripheral region spaced apart from the cell region, and a boundary region between the cell region and the peripheral region. The stack may be on the cell region. The stack may extend from the cell array region to the connection region in a first direction. The stack may have an edge part that has a stepwise structure on the connection region.

In example embodiments, the semiconductor memory device may further include a mold insulating layer that covers the edge part of the stack. The mold insulating layer may be on the connection region, the boundary region, and the peripheral region. The first dummy channel structure may penetrate the mold insulating layer. The first dummy channel structure may contact the substrate.

In example embodiments, the semiconductor memory device may further include a second dummy channel structure on the connection region. The second dummy channel structure may penetrate the mold insulating layer and the edge part of the stack. The second dummy channel structure may include a third semiconductor pattern and a third channel pattern. The third channel pattern may be on the third semiconductor pattern. The third channel pattern may contact the third semiconductor pattern.

In example embodiments, the first dummy channel structure in plan view may have one of a circular shape, an oval shape, and a bar shape.

In example embodiments, the semiconductor memory device may further include a peripheral circuit device on the peripheral region. The peripheral circuit device may include a peripheral gate insulating layer, a peripheral gate electrode, and peripheral source/drain regions.

In example embodiments, the semiconductor memory device may further include a gate dielectric layer contacting a sidewall of the first semiconductor pattern. The gate dielectric layer may not be adjacent to a sidewall of the second semiconductor pattern.

According to example embodiments of inventive concepts, a semiconductor memory device may include a substrate including a cell region including a cell array region and a connection region, a peripheral region spaced apart from the cell region, and a boundary region between the connection region of the cell region and the peripheral region; stacks on the cell region, the stacks spaced apart from each other in a first direction, each of the stacks including gate electrodes and insulating layers that are alternately and repeatedly stacked on the substrate and having an edge part on the connection region; cell channel structures penetrating the stacks on the cell array region, each of the cell channel structures including a first channel pattern that is on a first semiconductor pattern and is in contact with the first semiconductor pattern; first dummy channel structures penetrating the stacks on the connection region, each of the first dummy channel structures including a second channel pattern that is on a second semiconductor pattern and is in contact with the second semiconductor pattern; and a second dummy channel structure on the boundary region, the second dummy channel structure including a third channel pattern that is on a third semiconductor pattern and is in contact with the third semiconductor pattern.

In example embodiments, the first semiconductor pattern may extend to a first height from a surface of the substrate to a top surface of the first semiconductor pattern. The second semiconductor pattern of at least one of the first dummy channel structures adjacent to the third semiconductor pattern may further include a first sub-semiconductor pattern, and the first sub-semiconductor pattern may extend to a second height from the surface of the substrate to a top surface of the first sub-semiconductor pattern. The third semiconductor pattern may extend to a third height from the surface of the substrate to a top surface of the third semiconductor pattern. The second and third heights may be smaller than the first height.

In example embodiments, the second semiconductor patterns of at least one of the first dummy channel structures adjacent to the first semiconductor patterns may further include a second sub-semiconductor pattern, and the second sub-semiconductor pattern may extend to a fourth height from the surface of the substrate to a top surface of the second sub-semiconductor pattern. The fourth height may be greater than the second and third heights.

In example embodiments, the semiconductor memory device may further include a peripheral circuit device on the peripheral region and peripheral contacts connected to the peripheral circuit device on the peripheral region. The peripheral circuit device may include a peripheral gate insulating layer, a peripheral gate electrode, and peripheral source/drain regions.

In example embodiments, the semiconductor memory device may further include a mold insulating layer on the peripheral region, the boundary region, and the connection region. The mold insulating layer may cover the edge parts of the stacks. The first and second dummy channel structures of the stacks may penetrate the mold insulating layer.

In example embodiments, each of the cell channel structures may further include a first data storing pattern in contact with a sidewall of the first channel pattern. Each of the first dummy channel structures may further include a second data storing pattern in contact with a sidewall of the second channel pattern, and the second dummy channel structure may further include a third data storing pattern in contact with a sidewall of the third channel pattern. The first, second, and third channel patterns may include a same channel material, and the first, second, and third data storing pattern may include a same data storing material.

In example embodiments, the device may further include a plurality of second dummy channel structures on the boundary region. The plurality of second dummy channel structures may include the second dummy channel structure. The second dummy channel structures each in plan view may have one of a circular shape and an oval shape. The plurality of second dummy channel structures may be arranged in at least one row in the first direction in plan view.

In example embodiments, the second dummy channel structure may have a bar shape in plan view, and the second dummy channel structure may extend in the first direction.

According to example embodiments of inventive concepts, a semiconductor memory device may include a substrate; a stack on the substrate, the stack including gate electrodes and insulating layers that are alternately and repeatedly stacked on the substrate; a cell channel structure penetrating the stack, the cell channel structure including a first semiconductor pattern contacting the substrate and a first channel pattern on the first semiconductor pattern, the first channel pattern being in contact with the first semiconductor pattern; a first dummy channel structure on the substrate, the first dummy channel structure being spaced apart from the stack, the first dummy channel structure including a second semiconductor pattern contacting the substrate and a second channel pattern that on the second semiconductor pattern, the second channel pattern being in contact with the second semiconductor pattern; and a gate dielectric layer contacting a sidewall of the first semiconductor pattern. The gate dielectric layer is not adjacent to the sidewall of the second semiconductor pattern.

In example embodiments, the sidewall of the first semiconductor pattern may have a concave portion, and the sidewall of the second semiconductor pattern may not include a concave portion.

In example embodiments, the first semiconductor pattern may extend to a first height from a surface of the substrate to a top surface of the first semiconductor pattern, and the second semiconductor pattern may extend to a second height from the surface of the substrate to a top surface of the second semiconductor pattern. The first height may be greater than the second height.

According to example embodiments of inventive concepts, a semiconductor memory device may include a substrate including a cell region including a cell array region and a connection region, and a peripheral region spaced apart from the cell region; a stack on the cell region, the stack including gate electrodes and insulating layers that are alternately and repeatedly stacked on the substrate, the stack having a stepwise edge part on the connection region; a cell channel structure penetrating the stack on the cell array region, the cell channel structure including a first semiconductor pattern and a first channel pattern that is on the first semiconductor pattern and is in contact with the first semiconductor pattern; and dummy channel structures penetrating the stack on the connection region. Each of the dummy channel structures includes a second channel pattern that is on a second semiconductor pattern and is in contact with the second semiconductor pattern. The first semiconductor pattern may extend to a first height from a surface of the substrate to a top surface of the first semiconductor pattern. One of the dummy channel structures disposed farthest from the cell channel structure may include a sub-semiconductor pattern. The sub-semiconductor pattern may extend to a second height from the surface of the substrate to a top surface of the second semiconductor pattern. The second height may be smaller than the first height.

According to example embodiments of inventive concepts, a method of fabricating a semiconductor memory device may include forming a stack including gate electrodes and insulating layers that are alternately and repeatedly stacked on a cell region of a substrate, the substrate including the cell region, a peripheral region, and a boundary region between the cell region and the peripheral region; forming a cell channel structure penetrating the stack on the cell region, the cell channel structure including a first semiconductor pattern contacting the substrate and a first channel pattern on the first semiconductor pattern, the first channel pattern contacting the first semiconductor pattern; forming a mold insulating layer on the peripheral region and the boundary region; and forming a first dummy channel structure penetrating the mold insulating layer on the boundary region, the first dummy channel structure being spaced apart from the stack, the first dummy channel structure including a second semiconductor pattern contacting the substrate and a second channel pattern on the second semiconductor pattern, the second channel pattern contacting the second semiconductor pattern. The second semiconductor pattern may extend to a second height from the surface of the substrate to a top surface of the second semiconductor pattern. The first height may be greater than the second height.

In example embodiments, the forming a cell channel structure may include forming a first data storing pattern between the stack and the first channel pattern.

In example embodiments, the forming a first dummy channel structure may include forming a second data storing pattern between the mold insulating layer and the second channel pattern. The first channel pattern and the second channel pattern may include a same channel material. The first data storing pattern and the second data storing pattern may include a same data storing material.

In example embodiments, the cell region may include a cell array region and a connection region adjacent to the cell array region. The stack may include an edge part with a stepwise structure on the connection region. The mold insulating layer may cover the edge part of the stack.

In example embodiments, the method may further include forming a second dummy channel structure penetrating the edge part of the stack on the connection region. The forming a second dummy channel structure may include forming a third semiconductor pattern in contact with the substrate and a third channel pattern on the third semiconductor pattern.

In example embodiments, the method may further include forming a peripheral circuit device on the peripheral region. The forming a peripheral circuit device may include forming a peripheral gate insulating layer and a peripheral gate electrode stacked on the substrate and source/drain region in the substrate adjacent to sidewalls of the peripheral gate electrode.

In example embodiments, the method may further include forming a gate dielectric layer contacting a sidewall of the first semiconductor pattern. The gate dielectric layer may not be formed adjacent to a sidewall of the second semiconductor pattern.

According to example embodiments of inventive concepts, a method of fabricating a semiconductor memory device may include forming a mold structure on a cell region of a substrate, the mold structure including insulating layers and sacrificial layers that are alternately and repeatedly stacked on the cell region, the substrate including the cell region, a peripheral region, and a boundary region between the cell region and the peripheral region, the cell region including a cell array region and a connection region; forming a mold insulating layer on the connection region, the boundary region, and peripheral region, the mold insulating layer covering a portion of the mold structure; forming a cell channel structure penetrating the mold structure on the cell region, the cell channel structure including a first semiconductor pattern contacting the substrate and a first channel pattern on the first semiconductor pattern, the first channel pattern contacting the first semiconductor pattern; forming first dummy channel structures penetrating the mold insulating layer and the mold structure on the connection region, each of the first dummy channel structures including a second semiconductor pattern contacting the substrate and a second channel pattern on the second semiconductor pattern, the second channel pattern contacting the second semiconductor pattern; and forming a second dummy channel structure penetrating the mold insulating layer on the boundary region. The second dummy channel structure includes a third semiconductor pattern contacting the substrate and a third channel pattern on the third semiconductor pattern. The third channel pattern contacts the third semiconductor pattern.

In example embodiments, the first semiconductor pattern may extend to a first height from a surface of the substrate to a top surface of the first semiconductor pattern. The second semiconductor patterns of at least one of the first dummy channel structures adjacent to the third semiconductor pattern may further include a first sub-semiconductor pattern. The first sub-semiconductor pattern may extend to a second height from the surface of the substrate to a top surface of the first sub-semiconductor pattern. The third semiconductor pattern may extend to a third height from the surface of the substrate to a top surface of the third semiconductor pattern. The second height may be smaller than the first height. The third height may be smaller than the first height.

In example embodiments, the second semiconductor pattern of at least one of the first dummy channel structures adjacent to the first semiconductor patterns may further include a second sub-semiconductor pattern. The second sub-semiconductor pattern may extend to a fourth height from the surface of the substrate to a top surface of the second sub-semiconductor pattern. The fourth height may be greater than the second and third heights.

In example embodiments the forming a cell channel structure may further include forming a first data storing pattern in contact with a sidewall of the first channel pattern. The forming first dummy channel structures may further include forming second data storing patterns in contact with sidewalls of the second channel patterns. The forming a second dummy channel structure may further include forming a third data storing pattern in contact with a sidewall of the third channel pattern. The first, second, and third channel patterns may be formed of a same channel material. The first, second, and third data storing patterns may be formed of a same data storing material.

In example embodiments, the method may further include forming a plurality of second dummy channel structures. The forming a plurality of second dummy channel structures may include the forming the second dummy channel structure. The forming a plurality of second dummy channel structures may include forming the plurality of the second dummy channel structures arranged in a direction, and forming the second dummy channel structures such that each of the second dummy channel structures has one of a circular shape and an oval shape.

In example embodiments, the method may further include forming a plurality of second dummy channel structures. The forming a plurality of second dummy channel structures may include the forming the second dummy channel structure. The forming a plurality of second dummy channel structures may include forming the plurality of second dummy channel structures arranged in a direction. Each of the second dummy channel structures may have a bar shape.

In example embodiments, the method may further include forming a peripheral circuit device on the peripheral region and forming a peripheral protection layer covering the peripheral circuit device. The forming a peripheral circuit device may include forming a peripheral gate insulating layer on the substrate, forming a peripheral gate electrode on the peripheral gate insulating layer, and forming source/drain regions in the substrate adjacent to both sidewalls of the peripheral gate electrode. The forming a mold insulating layer may include forming the mold insulating layer such that the mold insulating layer covers the peripheral protection layer.

In example embodiments the method may further include forming a gate dielectric layer contacting sidewalls of the first and second semiconductor patterns. The gate dielectric layer may not be adjacent to a sidewall of the third semiconductor pattern.

In example embodiments, the method may further include forming gate electrodes, forming a trench penetrating the mold structure, forming openings by selectively removing the sacrificial layers of the mold structure exposed by the trench, forming a gate conductive layer in the openings, and patterning the gate conductive layer.

According to example embodiments, a semiconductor memory device may include a substrate including a cell region including a cell array region and a connection region, a peripheral region spaced apart from the cell region, and a boundary region between the cell region and the peripheral region; a stack on the cell region; and a plurality of channel structures spaced apart from each other on the substrate. The stack may include gate electrodes and insulating layers that are alternately and repeatedly stacked on each other on the substrate. The plurality of channel structures may each include a channel pattern on top of a semiconductor pattern. The plurality of channel structures may include cell channel structures on the cell array region. The cell channel structures may extend vertically through the stack. A bottom of the channel pattern of the cell channel structures may be spaced apart from a surface of the substrate by a first height. The plurality of channel structures may include a dummy channel structure on the boundary region. A bottom of the channel pattern of the dummy channel structure may be spaced apart from the surface of the substrate by a second height that is less than the first height.

In example embodiments, some of the plurality of channel structures may include gate dielectric layers contacting sidewalls of the semiconductor patterns. Some of the gate dielectric layers may contact sidewalls of the semiconductor patterns of the cell channel structures. None of the gate dielectric layers may be adjacent to a sidewall of the semiconductor pattern of the dummy channel structure.

In example embodiments, the plurality of channel structure may include at least one first dummy channel structure on the connection region. The dummy channel structure on the boundary region may be a second dummy channel structure. The semiconductor patterns of the cell channel structures may extend from the surface of the substrate to the first height. The semiconductor patterns of the second dummy channel structure may extend from the surface of the substrate to the second height. The semiconductor pattern of one first dummy channel structure of the at least one first dummy channel structure may extend from the surface of the substrate to a height that is between the first height and the second height.

In example embodiments, the device may include a mold insulating layer covering an edge part of the stack and the boundary region. The dummy channel structure may penetrate the mold insulating layer. The cell channel structures may be arranged so they do not penetrate the mold insulating layer.

In example embodiments, the device may further include bit lines connected to the cell channel structures. The plurality of channel structures may include data storing patterns surrounding the channel patterns of the plurality of channel structures.

BRIEF DESCRIPTION OF THE DRAWINGS

Example embodiments will be more clearly understood from the following brief description taken in conjunction with the accompanying drawings. The accompanying drawings represent non-limiting, example embodiments as described herein. The drawings are not necessarily to scale, emphasis instead being placed upon illustrating principles of inventive concepts. In the drawings:

FIGS. 2A through 2C are enlarged views of a AR portion of FIG. 1 and schematic plan views to illustrate a semiconductor memory device according to example embodiments of inventive concepts.

FIG. 3 is a sectional view taken along line I-I' of FIG. 2, and FIGS. 4 and 5 are sectional views taken along line II-II' of FIG. 2.

FIGS. 8A through 18A and FIGS. 8B through 18B are sectional views illustrating a method for fabricating a semiconductor memory device according to example embodiments of inventive concepts. FIGS. 8A through 18A are sectional views corresponding to line I-I' of FIG. 2, and FIGS. 8B through 18B are sectional views corresponding to line II-II' of FIG. 2.

DETAILED DESCRIPTION

Figure 1:
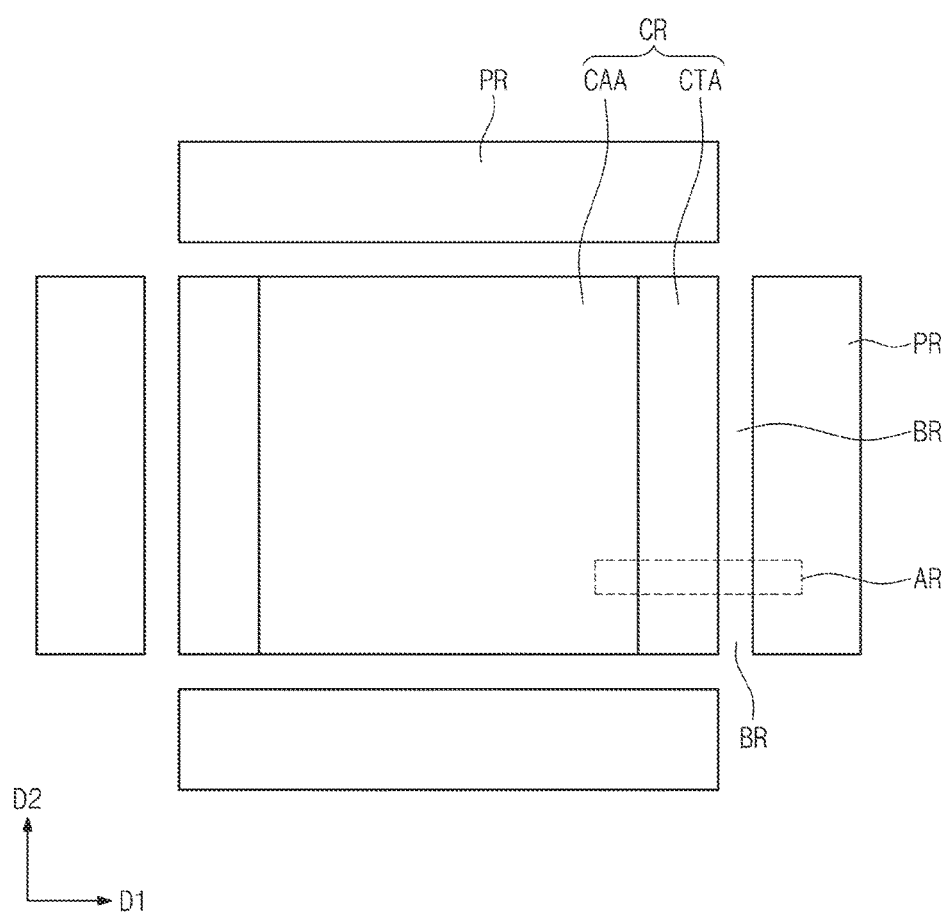
FIG. 1 is a schematic plan view illustrating a semiconductor memory device according to example embodiments of inventive concepts.

Example embodiments of inventive concepts will now be described more fully with reference to the accompanying drawings, in which some example embodiments are shown. Example embodiments of inventive concepts may, however, be embodied in many different forms and should not be construed as being limited to the embodiments set forth herein; rather, these embodiments are provided so that this disclosure will be thorough and complete, and will fully convey the scope of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. For example, an etched region or an implanted region illustrated as a rectangle may have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, example embodiments of inventive concepts will be described in detail with reference to accompanying drawings.

FIG. 1 is a schematic plan view illustrating a semiconductor memory device according to example embodiments of inventive concepts.

Referring to FIG. 1, according to example embodiments of inventive concepts, a cell region CR may be disposed in a central region of a semiconductor memory device. The cell region CR may include a cell array region CAA and a connection region CTA. Memory cells may be arranged in arrays in the cell array region CAA.

Gate contacts in contact with gate electrodes (or word lines) may be disposed in the connection region CTA. A peripheral region PR may be disposed around the cell region CR. Peripheral circuits controlling or operating the memory cells may be disposed in the peripheral region PR. For example, the peripheral circuits may include a row decoder or a sense amplifier. A boundary region BR may be disposed between the cell region CR and the peripheral region PR. For example, the boundary region BR may be disposed between the connection region CTA and the peripheral region PR.

Figure 2A:
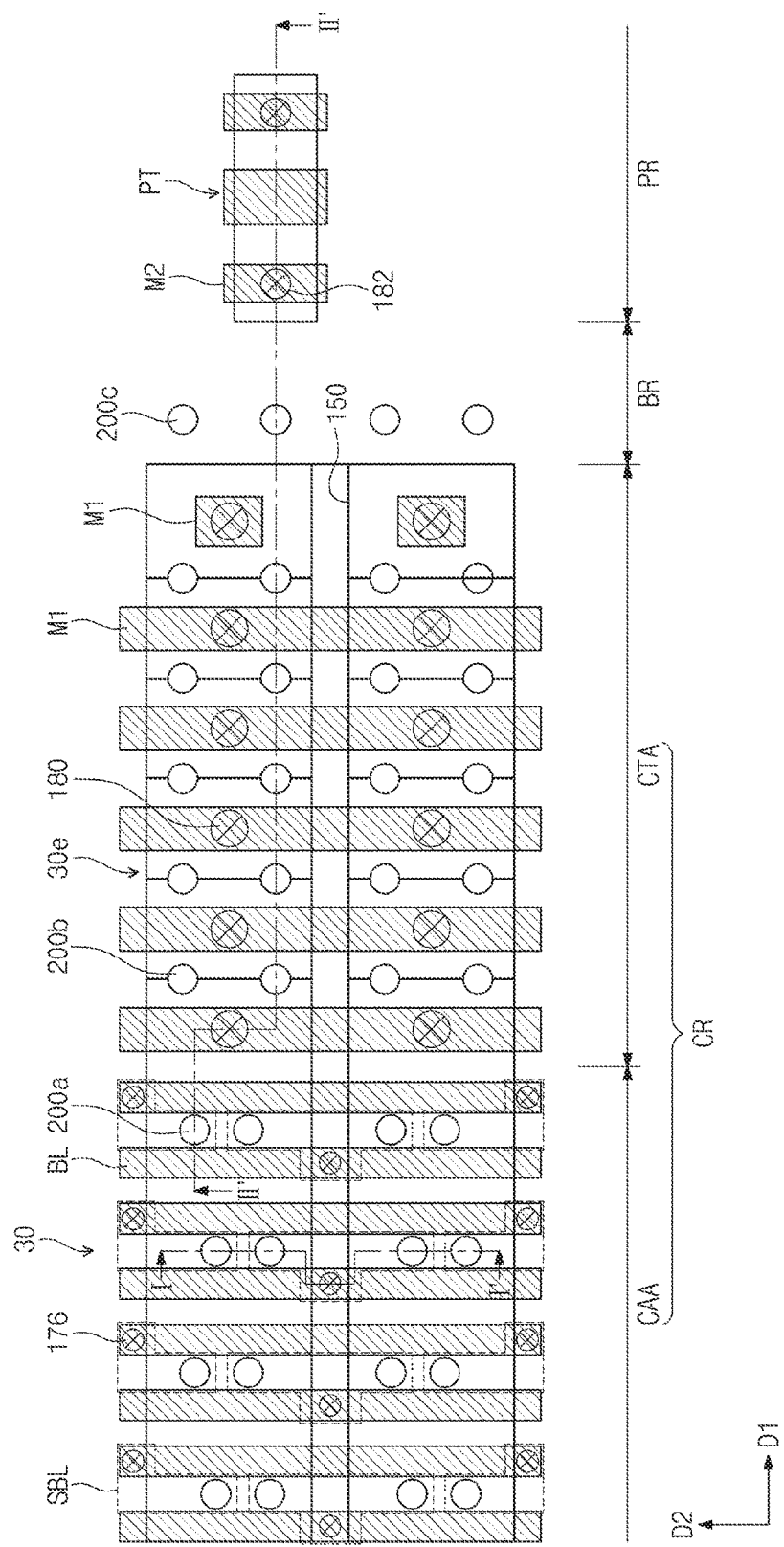
Figure 2C:
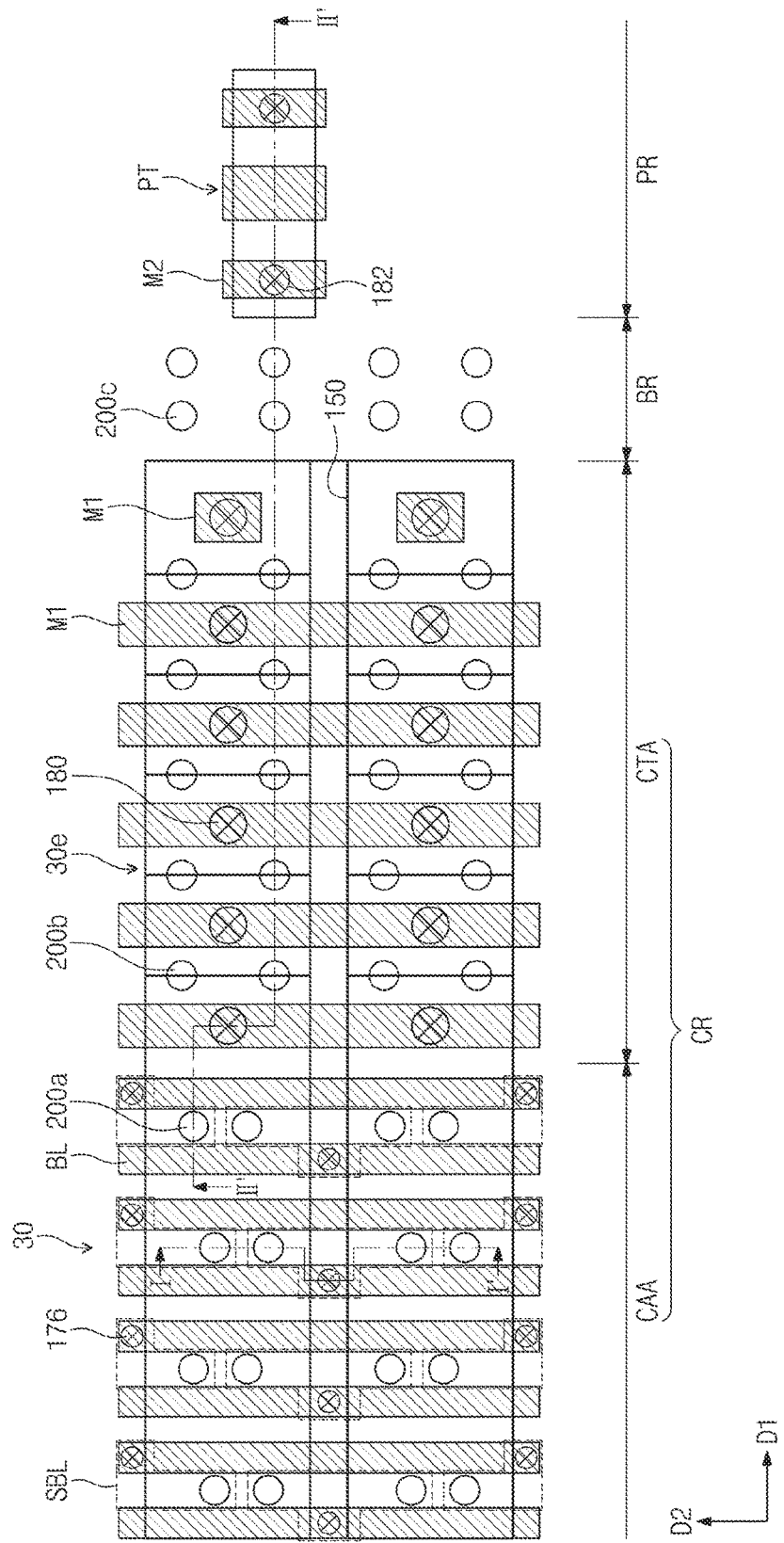
Figure 3:
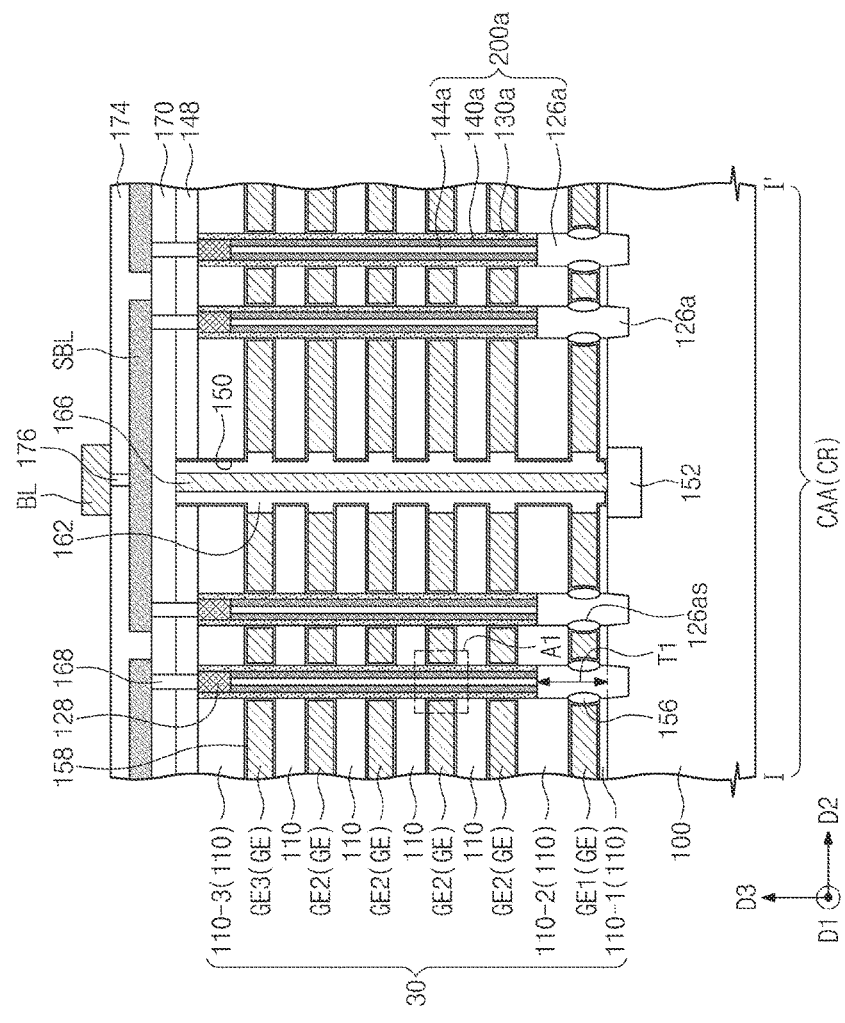
FIGS. 3 through 5 are sectional views to illustrate a semiconductor memory device according to example embodiments of inventive concepts.
Figure 4:
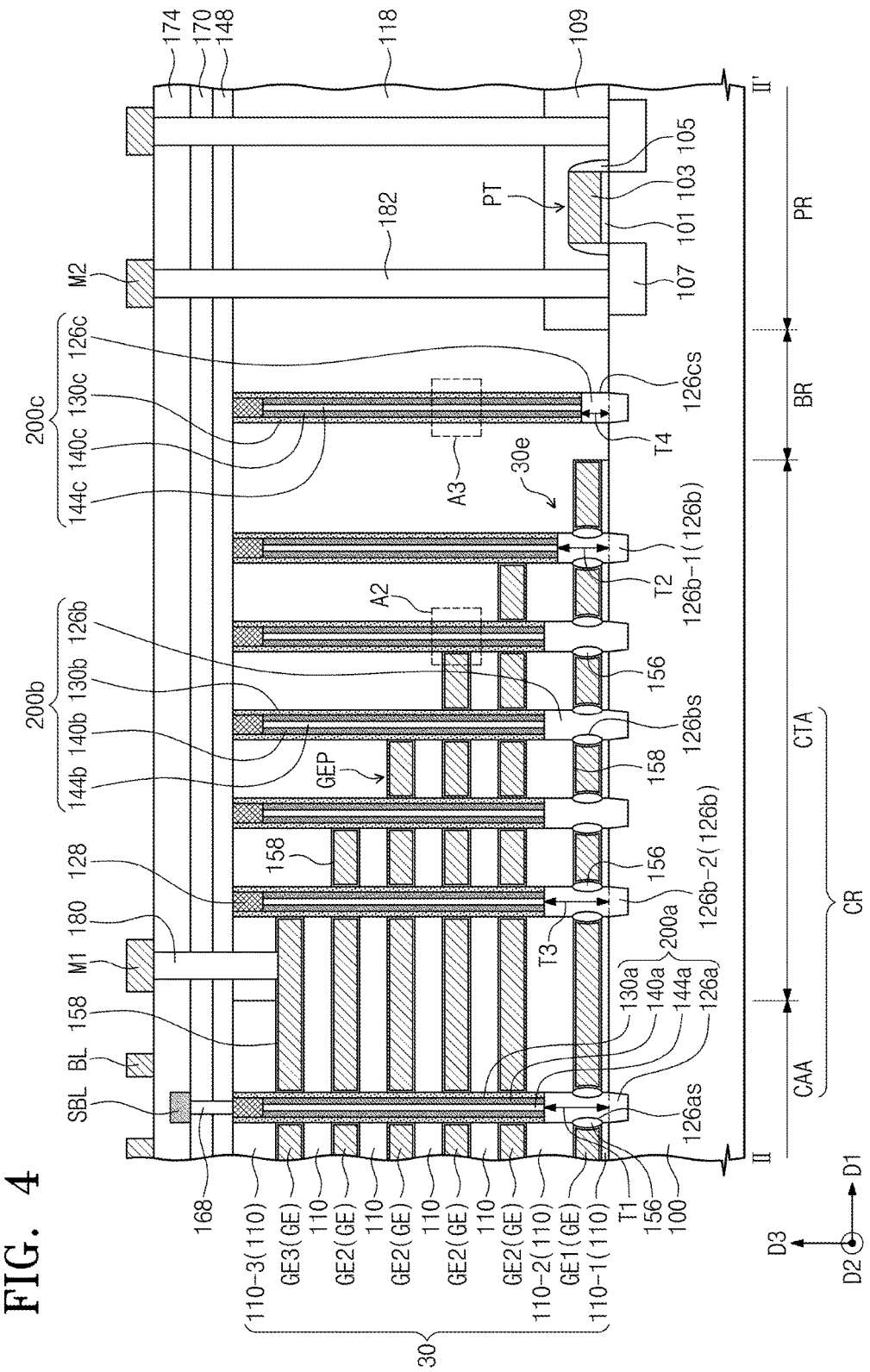
Figure 5:
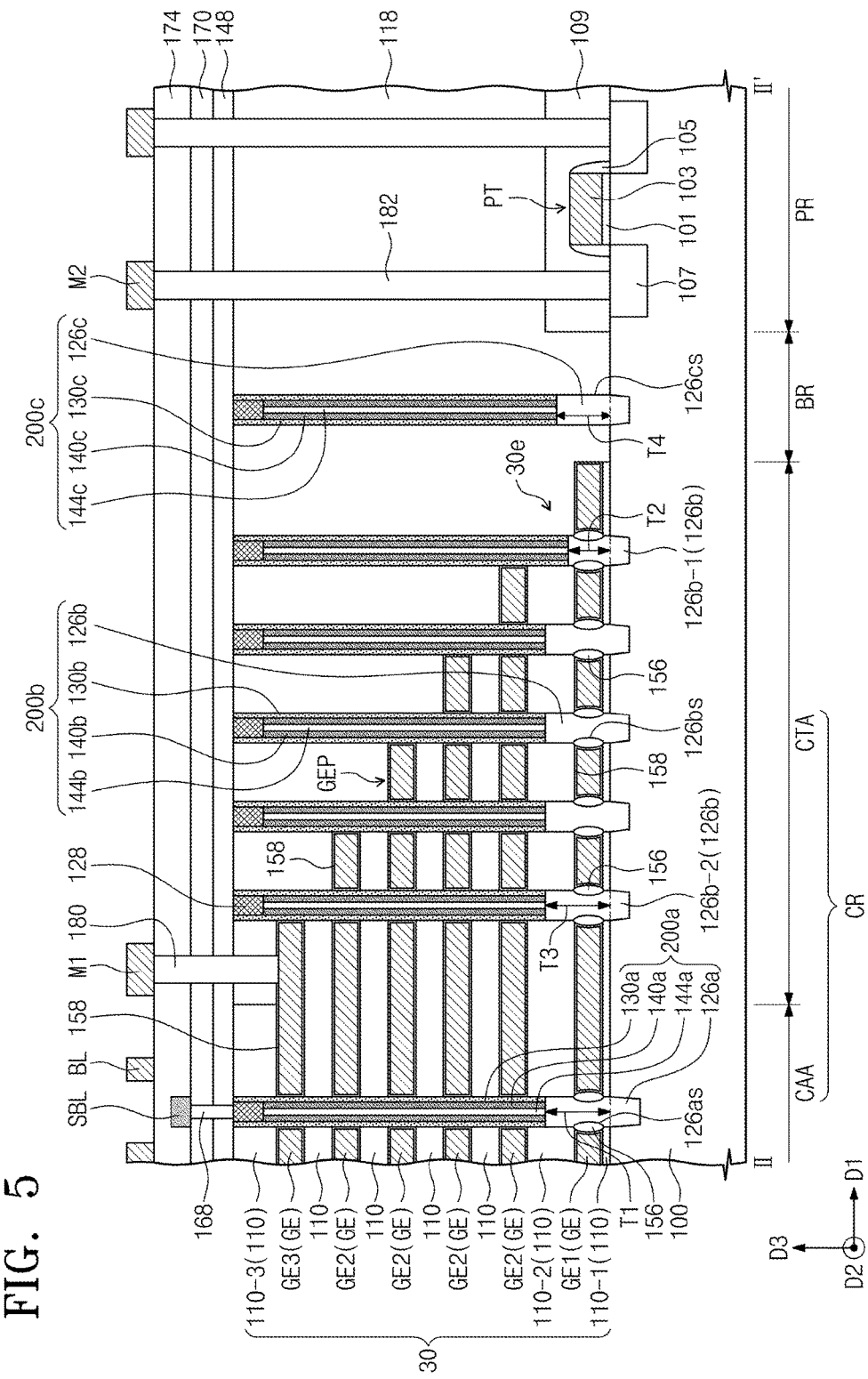
Figure 6A:
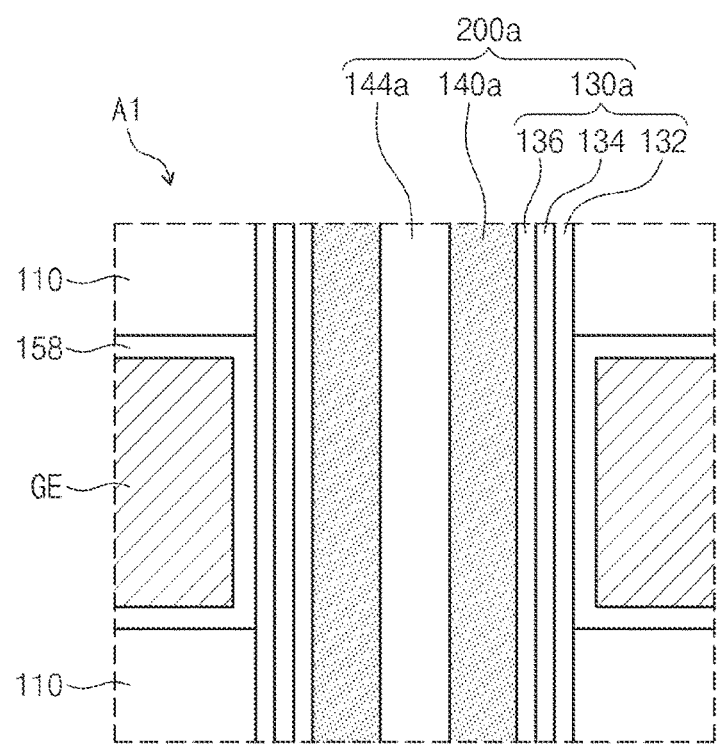
FIGS. 6A through 6C are enlarged sectional views of a portion A1 of FIG. 3, a portion A2 of FIG. 4, and a portion A3 of FIG. 4, respectively.
Figure 6B:
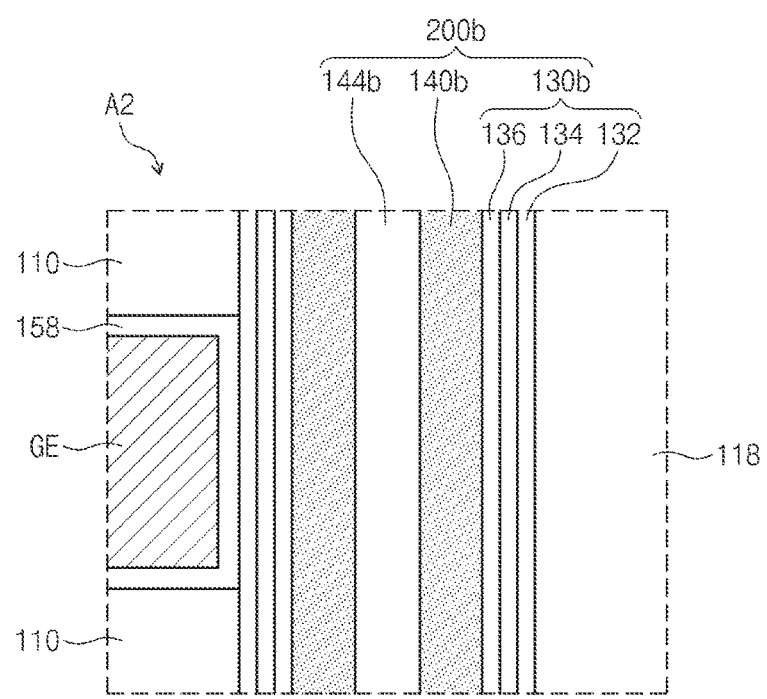
Figure 6C:
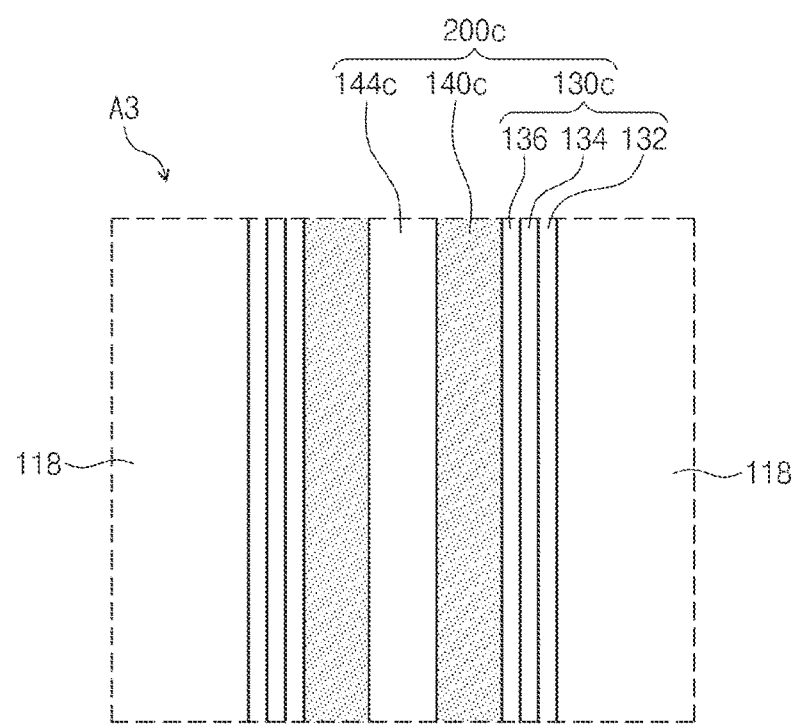

FIGS. 2A through 2C are enlarged views of a AR portion of FIG. 1 and schematic plan views to illustrate a semiconductor memory device according to example embodiments of inventive concepts. FIGS. 3 through 5 are sectional views to illustrate a semiconductor memory device according to example embodiments of inventive concepts. FIG. 3 is a sectional view taken along line I-I' of FIG. 2, and FIGS. 4 and 5 are sectional views taken along line II-II' of FIG. 2. FIGS. 6A through 6C are enlarged sectional views of a portion A1 of FIG. 3, a portion A2 of FIG. 4 and a portion A3 of FIG. 4, respectively. FIGS. 7A through 7D are schematic plan views to illustrate a semiconductor memory device according to example embodiments of inventive concepts.

Referring to FIGS. 2A, 3 through 5, according to example embodiments of inventive concepts, a semiconductor memory device may include stacks 30 on a substrate 100, cell channel structures 200a penetrating each stack 30, a common source region 152 in the substrate 100 between stacks 30, first and second dummy channel structures 200b, 200c spaced apart from the cell channel structures 200a, and at least one peripheral circuit device PT. The substrate 100 may include the cell region CR that includes the cell array region CAA and the connection region CTA adjacent to the cell array region CAA, the peripheral region PR spaced apart from the cell region CR, and the boundary region BR provided between the cell region CR and the peripheral region PR.

The substrate 100 may be formed of or include a semiconductor material. For example, the substrate 100 may be a single-crystalline silicon wafer, a single-crystalline germanium wafer, or a single-crystalline silicon-germanium wafer. In example embodiments, the substrate 100 may be SOI (Semiconductor on Insulator) wafer. For example, the substrate 100 may include a semiconductor substrate, an insulating layer that is disposed on the semiconductor substrate to cover transistors provided on the semiconductor substrate, and a semiconductor layer (e.g., a silicon layer, a silicon-germanium layer, or a germanium layer) disposed on the insulating layer. The substrate 100 may be, for example, a p-type semiconductor substrate, but example embodiments of inventive concepts may not be limited thereto. Further, the substrate 100 may include a well region (not shown).

The peripheral circuit device PT may be disposed on the peripheral region PR. The peripheral circuit device PT may include a peripheral gate insulating layer 101, a peripheral gate electrode 103 on the peripheral gate insulating layer 101, and source/drain regions 107 adjacent to both sidewalls of the peripheral gate electrode 103. The peripheral gate insulating layer 101 may be disposed on the substrate 100, and may include or be formed of oxide material (e.g., silicon oxide), high-k dielectric material, or a combination thereof. The peripheral gate electrode 103 may be formed of or include, for example, silicon (e.g., polysilicon), metal silicides (e.g., tungsten silicide (WSi), nickel silicide (NiSi), cobalt silicide (CoSi), titanium silicide (TiSi), or tantalum silicide (TaSi)), metals (e.g., tungsten or aluminum), or any combination thereof. Peripheral gate spacers 105 may be formed on both sidewalls of the peripheral gate electrode 103. Source/drain regions 107 may be disposed in the substrate 100, and may include N-type impurities (e.g., phosphorous (P)) or P-type impurities (e.g., boron (B)). The peripheral circuit device PT may be, for example, a high voltage transistor or a low voltage transistor. A peripheral protection layer 109 may be disposed on the peripheral region PR to cover the peripheral circuit device PT. The peripheral protection layer 109 may include or be formed of silicon oxide or silicon nitride.

The stacks 30 may be disposed on the cell region CR. For example, stacks 30 may extend from the cell array region CAA to the connection region CTA in a first direction D1. The stacks 30 may be disposed to be spaced apart from one another in a second direction D2 across the first direction D1. For example, the stacks 30 may be isolated from one another in the second direction D2 by a trench 150 extending in the first direction D1. The first and second directions D1, D2 may be parallel to, for example, the main surface of the substrate 100.

Each of the stacks 30 may include gate electrodes GE and insulating layers 110 that are alternately and repeatedly stacked on the substrate 100. In each stack 400, thicknesses of some of the insulating layers 110 may be greater or less than thicknesses of others of the insulating layers 110. For example, a lowermost insulating layer 110-1 may be thinner than the remaining ones of the insulating layers 110. Further, a second insulating layer 110-2 from the substrate 100 or an uppermost insulating layer 110-3 may be thicker than the remaining ones of the insulating layers 110. Each of the insulating layers 110 may include or be formed of, for example, silicon oxide. In example embodiments, Each of the insulating layers 110 may include or be formed of, for example, silicon nitride Each of the gate electrodes GE may include a conductive material. For example, each of gate electrodes GE may include or be formed of at least one of a semiconductor layer, a metal silicide layer, a metal layer, a metal nitride layer, and/or any combination thereof. In example embodiments, the semiconductor layer for gate electrodes GE may be a doped silicon layer. The metal silicide layer for gate electrodes GE may include at least one of cobalt silicide, titanium silicide, tungsten silicide, or tantalum silicide. The metal layer for the gate electrodes GE may include at least one of tungsten, nickel, cobalt, titanium, or tantalum. The metal nitride layer for the gate electrodes GE may include at least one of titanium nitride, tungsten nitride, or tantalum nitride.

In example embodiments, the three-dimensional semiconductor memory device may be a three-dimensional NAND FLASH memory device, and in this case, the gate electrodes GE may be used as control gate electrodes of memory cells. For example, the gate electrodes GE2, except for the uppermost and lowermost ones of the gate electrodes GE3, GE1, may be used as the control gate electrodes and word lines connecting the control gate electrodes horizontally to each other. The gate electrodes GE may be coupled with the cell channel structures 200a to constitute the memory cells. Accordingly, vertical memory cell strings, each of which includes vertically-stacked memory cells, may be provided on the cell array region CAA. The lowermost and uppermost gate electrodes GE1, GE3 may be used as gate electrodes of selection transistors SST, GST. For example, the uppermost gate electrode GE3 may serve as a gate electrode of a string selection transistor SST for controlling electric connection between a bit line BL and the cell channel structures 200a, and the lowermost gate electrode GE1 may serve as a gate electrode of a ground selection transistor GST for controlling electric connection between the common source region 152 and the cell channel structures 200a.

Each of the stacks 30 may have an edge part 30e formed in a stepwise structure. For example, on the connection region CTA, each of gate electrodes GE may have a pad part GEP extending in the first direction D1 from the cell array region CAA. In example embodiments, a vertical height of the edge part 30e of each of the stacks 30 may decrease stepwise in a direction away from the cell array region CAA. That is, a horizontal length of the gate electrodes GE in the first direction D1 may decrease in a direction away from the substrate 100. A mold insulating layer 118 may be disposed on the connection region CAA, the boundary region BR, and the peripheral region PR to cover the stacks 30. For example, the mold insulating layer 118 may cover the edge parts 30e of the stacks 30 (e.g., the pad parts GEP of the gate electrodes GE). The mold insulating layer 118 may be substantially in contact with the substrate 100 on the boundary region BR. The mold insulation layer 118 may be disposed on the peripheral protection layer 109 and may cover the peripheral circuit device PT. The mold insulation layer 118 may include or be formed of oxide or low-k dielectric material.

The cell channel structures 200a may be connected to the substrate 100 by passing through the stacks 30. That is, the cell channel structures 200a may penetrate the stacks 30 to be in contact with the substrate 100 and may extend in a third direction D3 perpendicular to the main surface of the substrate 100. The third direction D3 may be orthogonal to both of the first and second direction D1, D2. The cell channel structures 200a may be surrounded by the stacks 30. For example, the cell channel structures 200a may be surrounded by the gate electrodes GE of each of the stacks 30. When viewed in plan view, the cell channel structures 200a may be arranged to form a plurality of rows in the first direction D1 and a plurality of columns in the second direction D2. As shown in FIG. 2A, two rows of the cell channel structures 200a that are arranged in a zigzag form in the first direction D1 may be repeatedly arranged along the second direction D2. That is, two rows of the cell channel structures 200a may penetrate each of the stacks 30. In example embodiments, one row or more than three rows of the cell channel structures 200a that are arranged in a zigzag form in the first direction D1 may be repeatedly arranged along the second direction D2.

Each of the cell channel structures 200a may include a first semiconductor pattern 126a, a first channel pattern 140a, and a first data storing pattern 130a. Further, each of the cell channel structures 200a may include a first insulating gap-filling pattern 144a. The first channel pattern 140a, and a first data storing pattern 130a, and the first insulating gap-filling pattern 144a may be disposed on the first semiconductor pattern 126a.

The first semiconductor pattern 126a may be in direct contact with the substrate 100 and extend into the substrate 100. For example, a portion of the first semiconductor pattern 126a may be buried in the substrate 100 and the other portion of the first semiconductor pattern 126a may be protruded upwardly from a surface of the substrate 100 to have a pillar shape. The first semiconductor pattern 126a may have a first height T1 that is a maximum height from the surface of the substrate 100 to a top surface of the first semiconductor pattern 126a. The first height T1 may be greater than a thickness of the lowermost gate electrode GE1. For example, the top surface of the first semiconductor pattern 126a may be positioned at a level higher than a top surface of the lowermost gate electrode GE1. The top surface of the first semiconductor pattern 126a may be positioned at a level lower than a top surface of the second insulating layer 110-2 from the substrate 100. The first semiconductor pattern 126a may include or be formed of silicon. For example, the first semiconductor pattern 126a may be an epitaxial pattern including or formed of single-crystalline silicon or poly-crystalline silicon. In example embodiments, the first semiconductor pattern 126a may include or be formed of at least one of germanium (Ge), silicon germanium (SiGe), III-V compound semiconductor, II-VI compound semiconductor. For example, the first semiconductor pattern 126a may include or be formed of undoped semiconductor material, or semiconductor material doped with dopants of which conductivity is the same as that of the substrate 100.

A gate dielectric layer 156 may be disposed on a sidewall 126as of the first semiconductor pattern 126a. The gate dielectric layer 156 may be disposed between the lowermost gate electrode GE1 and the first semiconductor pattern 126a. The gate dielectric layer 156 may include or formed of silicon oxide (e.g., thermal silicon oxide). The gate dielectric layer 156 may have a convex shape. The gate dielectric layer 156 may have a maximum thickness ranging from, for example, 40 Å to 200 Å. The first semiconductor pattern 126a may include the sidewall 126as of which a portion is concave. For example, a portion of the sidewall 126as of the first semiconductor pattern 126a may be concaved by the gate dielectric layer 156. For example, a maximum concave depth of each of the sidewall 126as of the first semiconductor pattern 126a may be in a range from about 20 Å to about 100 Å.

The first channel pattern 140a may be disposed on the first semiconductor pattern 126a and extend in the third direction D3. The first channel pattern 140a may be in contact with the first semiconductor pattern 126a. The first channel pattern 140a may be disposed between the first data storing pattern 130a and the first insulating gap-filling pattern 144a. The first channel pattern 140a may have a top-open structure. In example embodiments, the first channel pattern 140a may be a top- and bottom-open structure, a hollow cylindrical structure, or a macaroni-shaped structure. In example embodiments, the first channel pattern 140a may be provided in the form of a solid pillar, and in this case, the first insulating gap-filling pattern 144a may not be provided in the cell channel structure 200a. The first channel pattern 140a may include or be formed of a poly-crystalline, amorphous, or single-crystalline semiconductor material. The first channel pattern 140a may include at least one of silicon (Si), germanium (Ge), silicon germanium (SiGe), gallium arsenic (GaAs), indium gallium arsenic (InGaAs), aluminum gallium arsenic (AlGaAs), and/or a combination thereof. The first channel pattern 140a may include an undoped semiconductor material or a doped semiconductor material having the same conductivity type as the substrate 100.

The first data storing pattern 130a may be disposed between each stack 30 and the first channel pattern 140a. The first data storing pattern 130a may be disposed on the first semiconductor pattern 126a and extend in the third direction D3. The first data storing pattern 130a may be a top- and bottom-open structure. The first data storing pattern 130a may include a thin layer in which data can be stored. For example, the first data storing pattern 130a may be configured in such a way that data therein can be changed using a voltage difference between the cell channel structure 200a and the gate electrodes GE or using a Fowler-Nordheim tunneling effect caused by such a voltage difference. However, inventive concepts are not limited thereto. In example embodiments, the first data storage pattern 130a may include a thin layer capable of storing data based on another operation principle (e.g., a thin layer used for a phase change memory device or a thin layer used for a variable resistance memory device).

As shown in FIG. 6A, the first data storing pattern 130a may include a first blocking insulating layer 132 adjacent to the gate electrodes GE, a tunnel insulating layer 136 in contact with the first channel pattern 140a, and a charge storing layer 134 therebetween. The tunnel insulating layer 136 may include or be formed of silicon oxide. The charge storing layer 134 may be a trap insulating layer or an insulating layer with conductive nano dots. The trap insulating layer may include or be formed of, for example, silicon nitride. The first blocking insulating layer 132 may include or be formed of silicon oxide and/or high-k dielectric material (e.g., aluminum oxide or hafnium oxide). The first blocking insulating layer 132 may be provided in the form of a single layer or a plurality of layers. In example embodiments, the first blocking insulating layer 132 may be a single layer made of silicon oxide. In example embodiments, the first blocking insulating layer 132 may be provided to have a multi-layered structure including an aluminum oxide layer and/or a hafnium oxide layer.

In addition, a second blocking insulating layer 158 may be provided between the gate electrodes GE and the cell channel structures 200a and between the insulating layers 110 and the gate electrodes GE. For example, the second blocking insulating layer 158 may include a portion interposed between the gate electrodes GE and the cell channel structures 200a and another portion covering top and bottom surfaces of the gate electrodes GE. The second blocking insulating layer 158 may be provided in the form of a single layer or a plurality of layers. Furthermore, the second blocking insulating layer 158 may include or be formed of high-k dielectric material (e.g., aluminum oxide or hafnium oxide). In example embodiments, the formation of the second blocking insulating layer 158 may be omitted.

The first insulating gap-filling pattern 144a may be disposed on the first semiconductor pattern 126a and extend in the third direction D3. The first insulating gap-filling pattern 144a may be configured to fill an inner space of the first channel pattern 140a. The first insulating gap-filling pattern 144a may include or be formed of silicon oxide or silicon nitride.

The first dummy channel structures 200b may be disposed on the connection region CTA, and the second dummy channel structures 200c may be disposed on the boundary region BR. The first and second dummy channel structures 200b, 200c may be inactive channel structures.

The first dummy channel structures 200b may be disposed on the substrate through the mold insulating layer 118 and each of stacks 30. Each of the first channel structures 200b may pass through the stepwise edge part 30e of each of the stacks 30. For example, each of the first dummy channel structures 200b may penetrate an end portion of the pad part GEP of a corresponding one of the gate electrodes GE, at least one gate electrode GE and at least one insulating layer 110 disposed thereunder, and the mold insulating layer 118 disposed thereon. In example embodiments, the first dummy channel structures 200b, which are closest to the cell array region CAA, may penetrate the mold insulating layer 118, an end portion of the pad part GEP of the uppermost gate electrode GE3, the gate electrodes GE below the uppermost gate electrode GE3, and insulating layers 110 below the uppermost gate electrode GE3, thereby being in contact with the substrate 100. The first dummy channel structures 200b, which are farthest from the cell array region CAA (or closest to the boundary region BR), may penetrate the mold insulating layer 118, an end portion of the pad part GEP of the second gate electrode GE2 from the substrate 100, the second insulating layer 110-2 from the substrate 100, the lowermost gate electrode GE1, and the lowermost insulating layer 110-1, thereby being in contact with the substrate 100. In example embodiments, the first dummy channel structures 200b, which are closest to the boundary region BR, may penetrate the mold insulating layer 118, an end portion of the pad part GEP of the lowermost gate electrode GE1, and the lowermost insulating layer 110-1, thereby being in contact with the substrate 100. In each of stacks 30, the first dummy channel structures 200b may be arranged to form two rows parallel to the first direction D1. However, inventive concepts are not limited thereto. In example embodiments, in each of the stacks, the first dummy channel structures 200b may be arranged in one row or more than three rows in the first direction D1.

Each of the first dummy channel structures 200b may include a second semiconductor pattern 126b, a second channel pattern 140b, a second data storing pattern 130b, and a second insulating gap-filling pattern 144b. The second channel pattern 140b, the second data storing pattern 130b, and the second insulating gap-filling pattern 144b may be disposed on the second semiconductor pattern 126b and extend in the third direction D3.

The second semiconductor pattern 126b may be in direct contact with the substrate 100 and extend into the substrate 100. For example, a portion of the second semiconductor pattern 126b may be buried in the substrate 100 and the other portion of the second semiconductor pattern 126b may be protruded upwardly from a surface of the substrate 100 to have a pillar shape. In example embodiments, some of the second semiconductor patterns 126b (e.g., the second semiconductor patterns 126b closest to the boundary region BR) may be extended deeply into the substrate 100. The second semiconductor patterns 126b may be disposed in lower portion of a corresponding one of the stacks 30.

A top surface of the second semiconductor patterns 126b may be positioned at a level higher than the top surface of the lowermost gate electrode GE1. The top surface of the second semiconductor patterns 126b may be positioned at a level lower than the top surface of the second insulating layer 110-2 from the substrate 100. The second semiconductor pattern 126b may include a first sub-semiconductor pattern 126b-1 and a second sub-semiconductor pattern 126b-2. The first sub-semiconductor pattern 126b-1 may be closest to the boundary region BR (e.g., a third semiconductor pattern 126c), and may be farthest from the cell array region CAA (e.g., the first semiconductor pattern 126a). The second sub-semiconductor pattern 126b-2 may be closest to the cell array region CAA (e.g., the first semiconductor pattern 126a). The first sub-semiconductor pattern 126b-1 may have a second height T2 that is a maximum height from the substrate 100 to a top surface of the first sub-semiconductor pattern 126b-1. The second sub-semiconductor pattern 126b-2 may have a third height T3 that is a maximum height from the substrate 100 to a top surface of the second sub-semiconductor pattern 126b-2. The second and third heights T2, T3 may be greater than the thickness of the lowermost gate electrode GE1. The third height T3 may be substantially equal to the first height T1 of the first semiconductor pattern 126a. The second height T2 may be smaller than the first and third heights T1, T3. The second semiconductor pattern 126b may include or be formed of the same material as the first semiconductor pattern 126a.

The gate dielectric layer 156 may be disposed on a sidewall 126bs of the second semiconductor pattern 126b. The gate dielectric layer 156 may be disposed between the lowermost gate electrode GE1 and the first semiconductor pattern 126a. The gate dielectric layer 156 may include or formed of oxide (e.g., thermal silicon oxide). The gate dielectric layer 156 may have a convex shape. The second semiconductor pattern 126b may include the sidewall 126bs of which a portion is concave. For example, a portion of the sidewall 126bs of the second semiconductor pattern 126b may be concaved by the gate dielectric layer 156. For example, a maximum concave depth of each of the sidewall 126bs of the second semiconductor pattern 126b may be in a range from about 20 Å to about 100 Å. As result, the first sub-semiconductor pattern 126b-1 of the second semiconductor pattern 126b may have the top surface that is positioned at a higher level than a top surface of the first gate electrode GE1. Thus, since the gate dielectric layer 156 may be properly formed without defects on the sidewall 126bs of the first sub-semiconductor pattern 126b-1, improved insulation characteristics between the lowermost gate electrode GE1 and the first sub-semiconductor pattern 126b-1 may be secured. Accordingly, leakage currents through the first sub-semiconductor pattern 126b-1 may be limited (and/or prevented), so a semiconductor device with a high reliability may be embodied.

The second channel pattern 140b may be in contact with the second semiconductor pattern 126b. The second channel pattern 140b may be disposed between the second data storing pattern 130b and the second insulating gap-filling pattern 144b. The second channel pattern 140b may include or be formed of the same material as the first channel pattern 140a. The second channel pattern 140b may have the substantially same structure or shape as the first channel pattern 140a in sectional view.

The second data storing pattern 130b may be disposed between the stack 30 and the second channel pattern 140b and between the mold insulation layer 118 and the second channel pattern 140b. The second data storing pattern 130b may include or be formed of the same materials as the first data storing pattern 130a. The second data storing pattern 130b may have the substantially same structure or shape as the first data storing pattern 130a in plan view. As shown in FIG. 6B, the second data storing pattern 130b may include a first blocking insulating layer 132 adjacent to the gate electrodes GE, a tunnel insulating layer 136 in contact with the second channel pattern 140b, and a charge storing layer 134 therebetween. At least a portion of a side of the first blocking insulating layer 132 may be adjacent to the gate electrodes GE, and at least a portion of other side of the first blocking insulating layer 132 may be in contact with the mold insulating layer 118.

In addition, the second blocking insulating layer 158 may disposed between the gate electrodes GE and the first dummy channel structures 200b and between insulating layers 110 and the gate electrodes GE. In example embodiments, the formation of the second blocking insulating layer 158 may be omitted.

The second insulating gap-filling pattern 144b may be disposed on the second semiconductor pattern 126b and extend in the third direction D3. The second insulating gap-filling pattern 144b may be configured to fill an inner space of the second channel pattern 140b. The second insulating gap-filling pattern 144b may include or be formed of the same material as the first insulating gap-filling pattern 144a. The second insulating gap-filling pattern 144b may have the substantially same structure or shape as the first insulating gap-filling pattern 144a in sectional view. The second insulating gap-filling pattern 144b may include or be formed of silicon oxide or silicon nitride.

Figure 7A:
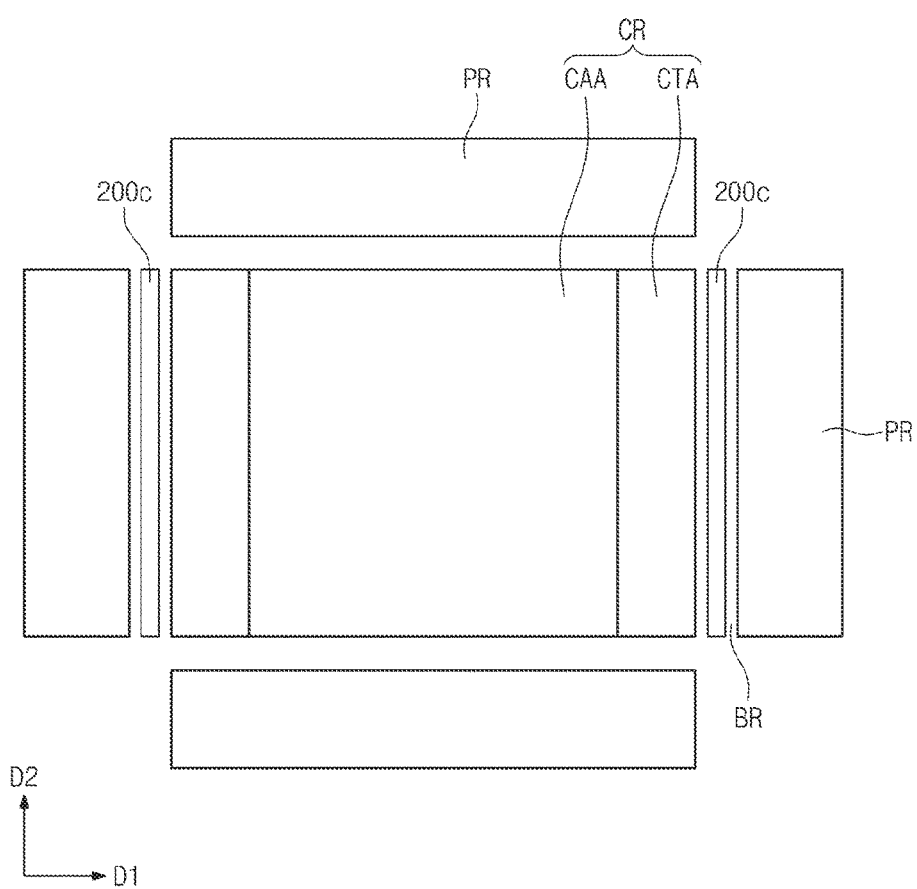
FIGS. 7A through 7D are schematic plan views to illustrate a semiconductor memory device according to example embodiments of inventive concepts.
Figure 7B:
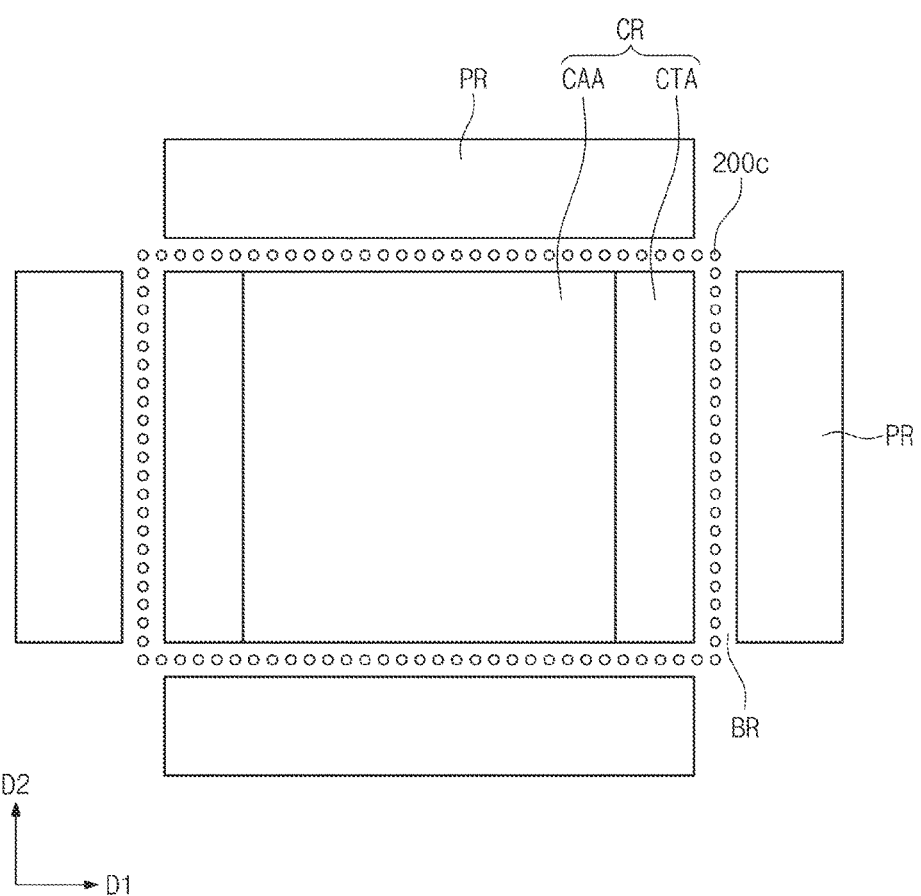
Figure 7C:
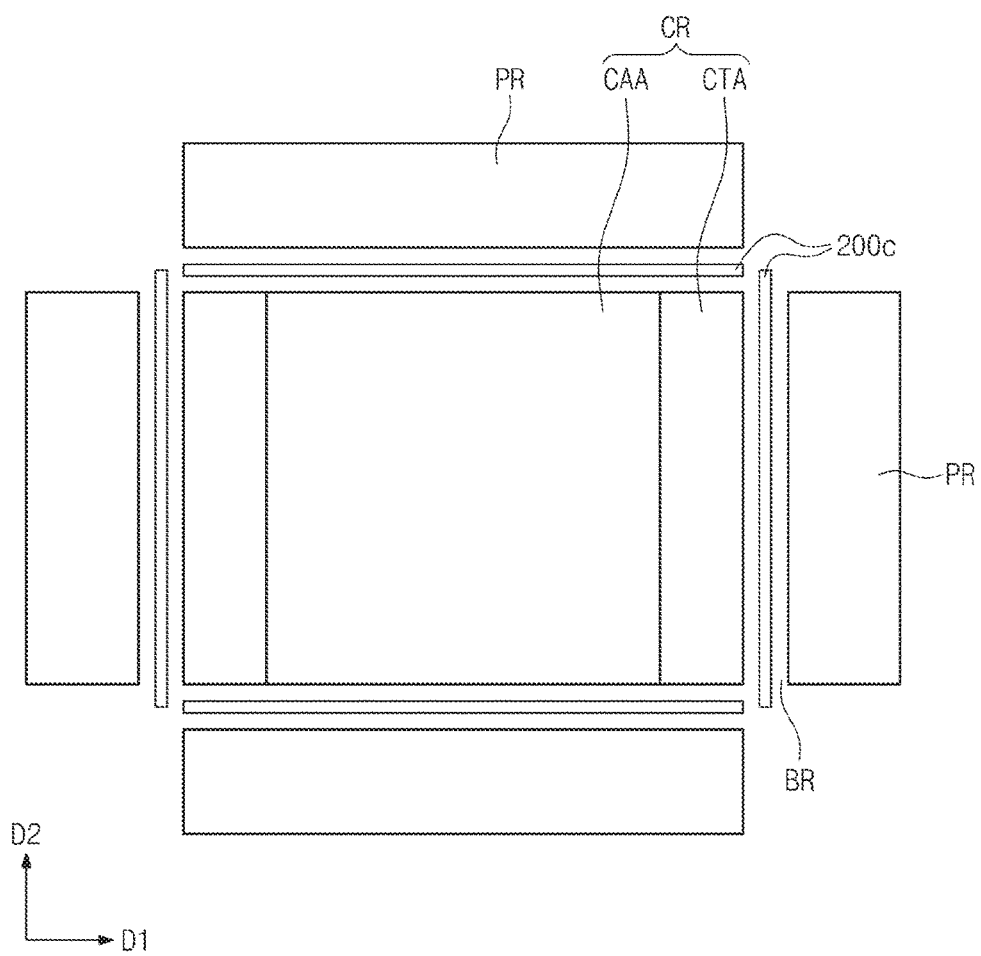
Figure 7D:
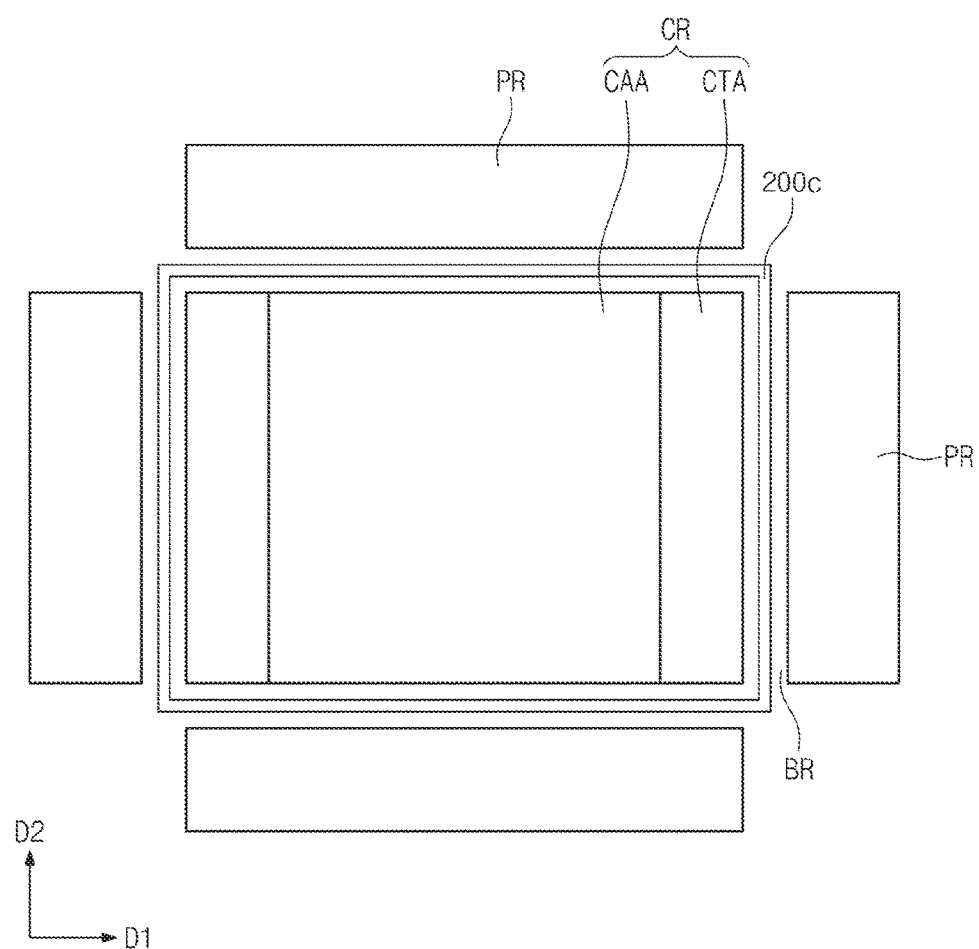

The second dummy channel structures 200c may penetrate the mold insulating layer 118 on the boundary region BR. The second dummy channel structures 200c may be in contact with the substrate 100. When viewed in plan view, each of the second dummy channel structures 200c may have a substantially circular or oval shape as shown in FIG. 2A, or may have a bar shape (or linear shape) as shown in FIG. 2B. When viewed in plan view with reference to FIGS. 2A and 2B, the second dummy channel structures 200c may be arranged to form a column in the second direction D2. For example, the second dummy channel structures 200c may be spaced apart from the stacks 30 and may be arranged in a column in the second direction D2. At least one of the second dummy channel structures 200c may be disposed adjacent to a corresponding one of the stacks 30. In example embodiments, as shown in FIG. 2C, the second dummy channel structures 200c may be arranged to form two columns in the second direction D2. In this case, each of the second dummy channel structures 200c may have a substantially circular or oval shape in plan view. However, inventive concepts are not limited thereto, and the second dummy channel structures 200c may be arranged to form more than three columns in the second direction D2. In example embodiments, as shown in FIG. 7A, the second dummy channel structures 200c, each of which has a bar shape (or a linear shape) in plan view, may be extended in the second direction between the connection region CTA and the peripheral region PR. For example, each of the second dummy channel structures 200c may be spaced apart from the stacks 30 in the first direction D1 and may be extended in the second direction D2. In example embodiments, as shown in FIGS. 7B and 7C, the second dummy channel structures 200c may be disposed around the cell region CR. For example, the second dummy channel structures 200c may be disposed between the connection region CTA and the peripheral region PR in the second direction D2 and between the cell region CR and the peripheral region PR in the first direction D1, in plan view. In example embodiments, the second dummy channel structure 200c may have a loop shaped structure in plan view as shown in FIG. 7D and may surround structures on the cell region CR.

Each of the second dummy channel structures 200c may include a third semiconductor pattern 126c, a third channel pattern 140c, a third data storing pattern 130c, and a third insulating gap-filling pattern 144c. The third channel pattern 140c, the third data storing pattern 130c, and the third insulating gap-filling pattern 144c may be disposed on the third semiconductor pattern 126c and extend in the third direction D3.

The third semiconductor pattern 126c may be in direct contact with the substrate 100 and extend into the substrate 100. For example, a portion of the third semiconductor pattern 126b may be buried in the substrate 100 and the other portion of the third semiconductor pattern 126c may be protruded upwardly from a surface of the substrate 100 to have a pillar shape. In example embodiments, some of the third semiconductor patterns 126c may be extended more deeply than the first semiconductor pattern 126a into the substrate 100. The third semiconductor pattern 126c may have a fourth height T4 that is a maximum height from the substrate 100 to a top surface of the third semiconductor pattern 126c. The fourth height T4 may be smaller than the first height T1 of the first semiconductor pattern 126a and the second and third heights T2, T3 of the second semiconductor pattern 126b. In example embodiments, the fourth height T4 may be greater than the second height T2 and smaller than the first and third heights T1, T3 as shown in FIG. 5. The third semiconductor pattern 126c may include or be formed of the same material as the first and second semiconductor patterns 126a, 126b.

The gate dielectric layer 156 may not be disposed or not be formed on a sidewall 126cs of the third semiconductor pattern 126c. The sidewall 126cs of the third semiconductor pattern 126c may not have a concave portion. For example, at least a portion of the sidewall 126cs of the third semiconductor pattern 126c may have a flat sectional profile. The third semiconductor pattern 126c may be in direct contact with the mold insulating layer 118.

Top surfaces of the first, second and third semiconductor patterns 126a, 126b, 126c may have various shapes, respectively. For example, the top surfaces of the first, second and third semiconductor patterns 126a, 126b, 126c may have a flat shape, a shape slanted with respect to the substrate 100, or a shape like spire The third channel pattern 140c may be in contact with the third semiconductor pattern 126c. The third channel pattern 140c may be disposed between the third data storing pattern 130c and the third insulating gap-filling pattern 144c. The third channel pattern 140c may include or be formed of the same material as the first and second channel pattern 140a, 140b. The third channel pattern 140c may have the substantially same structure or shape as the first channel pattern 140a and/or the second channel pattern 140b in sectional view.

The third data storing pattern 130c may be disposed between the mold insulating layer 118 and the third channel pattern 140c. The third data storing pattern 130c may include or be formed of the same materials as the first data storing pattern 130a and the second data storing pattern 130b. The third data storing pattern 130c may have the substantially same structure or shape as the first data storing pattern 130a and the second data storing pattern 130b in sectional view. As shown in FIG. 6C, the third data storing pattern 130c may include a first blocking insulating layer 132 in contact with the mold insulating layer 118, a tunnel insulating layer 136 in contact with the third channel pattern 140c, and a charge storing layer 134 therebetween.

The third insulating gap-filling pattern 144c may be disposed on the third semiconductor pattern 126c and extend in the third direction D3. The third insulating gap-filling pattern 144c may be configured to fill an inner space of the third channel pattern 140c. The third insulating gap-filling pattern 144c may include or be formed of the same material as the first insulating gap-filling pattern 144a and the second insulating gap-filling material 144b. The third insulating gap-filling pattern 144c may have the substantially same structure or shape as the first insulating gap-filling pattern 144a and the second insulating gap-filling pattern 144b in sectional view.

Conductive pads 128 may be provided on the cell channel structures 200a and the first and second dummy channel structures 200b, 200c, respectively. Each of the conductive pads 128 may include conductive material. Each of the conductive pads 128 may include an impurity region doped with dopants. In example embodiments, an end portion of the cell channel structure 200a in contact with the conductive pad 128 may serve as a drain region.

The common source region 152 may be formed in the substrate 100 exposed by the trench 150 separating the stacks 30 from each other in the second direction D2. For example, the common source region 152 may be disposed in the substrate between the stacks 30 and may extend along the first direction D1. The common source region 152 may be doped with n-type dopants (e.g., arsenic (As) or phosphorus (P)).

A common source plug 166 may be provided in the trench 150 and may be connected to the common source region 152. The common source plug 166 may extend parallel to the first direction D1 or the common source region 152. An insulating isolation spacer 162 may be provided between the stacks 30 and the common source plug 166. The insulating isolation spacer 162 may be provided to cover the sidewalls of the stacks 30. In example embodiments, the insulating isolation spacer 162 may be provided to fill a gap between adjacent ones of the stacks 30, and the common source plug 166 may be provided to penetrate the insulating isolation spacer 162 and be in contact with a portion of the common source region 152. The insulating isolation spacer 162 may include or be formed of at least one of silicon oxide, silicon nitride, silicon oxynitride, or low-k material. The common source plug 166 may include or be formed of metal (e.g., tungsten, copper, or aluminum). The common source plug 166 may further include a barrier metal layer. For example, the barrier metal layer for the common source plug 166 may be include or be formed of at least one of transition metal (e.g., titanium or tantalum) and/or conductive metal nitride (e.g., titanium nitride or tantalum nitride).

A capping insulating layer 148 and a first interlayer insulating layer 170 may be provided on the stacks 30 and the mold insulating layer 118. The first interlayer insulating layer 170 may cover the common source plug 166. Sub bit line contacts 168 penetrating the first interlayer insulating layer 170 and the capping insulating layer 148 may be provided on the cell array region CAA to be in contact with the conductive pads 128, respectively. Sub bit lines SBL may be provided on the cell array region CAA to be in contact with the sub bit line contacts 168, respectively. The sub bit lines SBL may be provided on the first interlayer insulating layer 170 and may electrically connect adjacent two cell channel structures 200a which are separated from each other by trench 150.

A second interlayer insulating layer 174 may be disposed on the first interlayer insulating layer 170 to cover the sub bit lines SBL. The capping insulating layer 148 and the first and second interlayer insulating layers 170, 174 may include or be formed of, for example, silicon nitride, or silicon oxide.

Gate contacts 180 may be provided on the connection region CTA to be in contact with the pad parts GEP of the gate electrodes GE. The gate contacts 180 may penetrate the first and second interlayer insulating layers 170, 174, the capping insulating layer 148, the mold insulating layer 118, and the second blocking insulating layer 158. In example embodiments, the gate contacts 180 may penetrate the first and second interlayer insulating layers 170, 174, the capping insulating layer 148, the mold insulating layer 118, the insulating layer 110, and the second blocking insulating layer 158. A height of each of the gate contacts 180 may be increased in a direction close to the boundary region BR.

Peripheral contacts 182 may be provided on the peripheral region PR. The peripheral contacts 182 may penetrate the first and second interlayer insulating layers 170, 174, the capping insulating layer 148, and the peripheral protection layer 109 and may be in contact with at least the source/drain regions 107 of the peripheral circuit device PT Bit lines BL, first and second interconnection layers M1, M2 may be disposed on the second interlayer insulating layer 174. The bit lines BL may be provided on the cell array region CAA, the first interconnection layer may be provided on the connection region CTA, and the second interconnection layer may be provided on the peripheral region PR. The bit lines BL may extend along the second direction D2. Each bit line BL may be connected to a corresponding one of the sub bit lines SBL through a corresponding one of the sub bit line contacts 176. As a result, the bit lines BL may be electrically connected to the cell channel structures 200a, respectively. The first interconnection layers M1 may be electrically connected to the gate contacts 180, respectively. The first interconnection layers M1 may electrically connect the gate electrodes which are positioned at the same level, respectively. In example embodiments, the first interconnection layers M1 connecting to the lowermost gate electrodes GE may not be connected to one another. The second interconnection layers M2 may be electrically connected to the peripheral contacts 182, respectively. The second interconnection layers M2 may be electrically connected to the first interconnection layer M1 and/or the bit lines BL.

Each of sub bit line contacts 168, each of the sub bit line SBL, each of bit line contacts 176, each of the gate contacts 180, and each of the peripheral contacts 182 may include or be formed of metallic material (e.g., tungsten, copper, or aluminum). In addition, Each of sub bit line contacts 168, each of the sub bit lines SBL, each of bit line contacts 176, each of the gate contacts 180, and each of the peripheral contacts 182 may further include a barrier metal layer, which may include or be formed of at least one of transition metal (e.g., titanium or tantalum) and/or conductive metal nitride (e.g., titanium nitride or tantalum nitride). Each of the bit lines BL and each of the first and second interconnection layers M1, M2 may include or be formed of metallic material (e.g., aluminum or copper).

The first and second dummy channel structures 200*b*, 200*c* may not be electrically connected to the bit lines BL and the first and second interconnection layers M1, M2. Thus, the first and second dummy channel structures 200*b*, 200*c* may be electrically isolated.

FIGS. 8A through 18A and FIGS. 8B through 18B are sectional views illustrating a method for fabricating a semiconductor memory device according to example embodiments of inventive concepts. FIGS. 8A through 18A are sectional views corresponding to line I-I' of FIG. 2, and FIGS. 8B through 18B are sectional views corresponding to line II-II' of FIG. 2. FIGS. 19A through 19C are enlarged sectional views of a portion B1 of FIG. 12A, a portion B2 of FIG. 12B and a portion B3 of FIG. 12B, respectively.

Figure 8A:
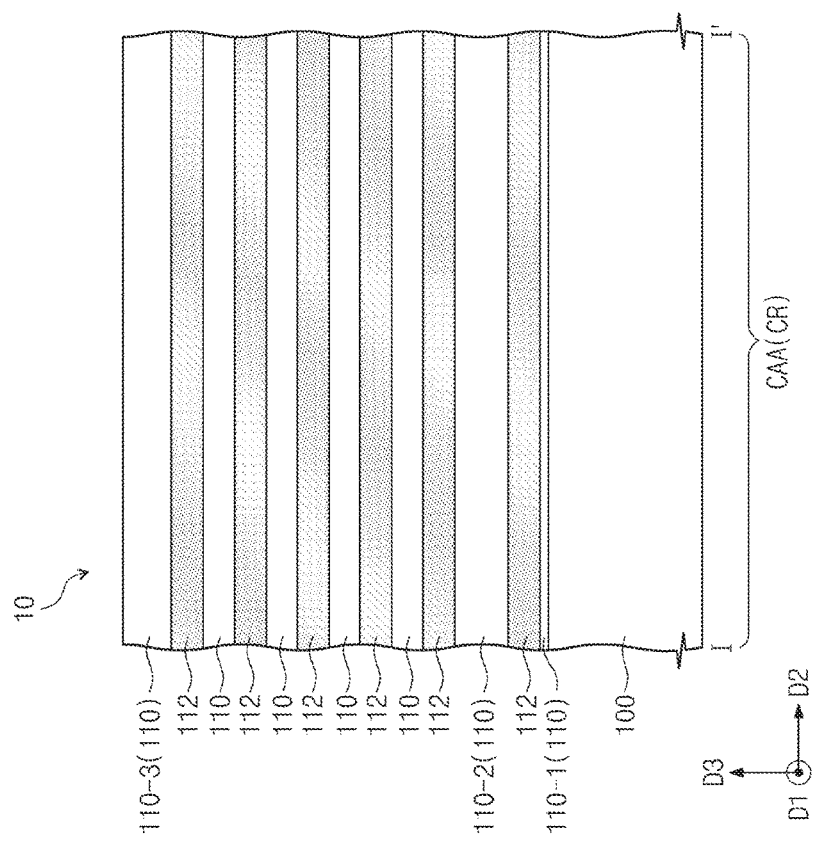
Figure 8B:
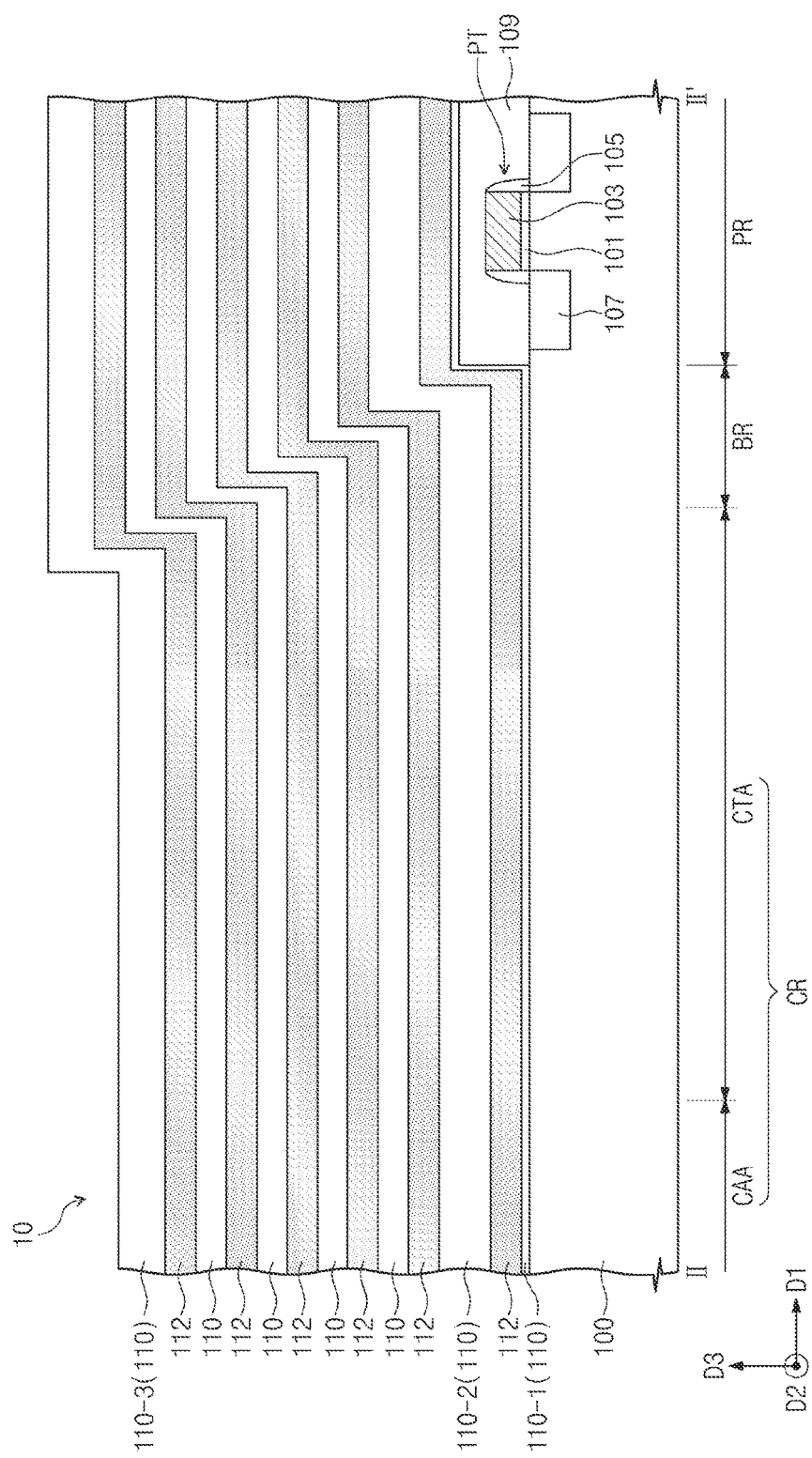

Referring to FIGS. 8A and 8B, a peripheral circuit device PT and a mold structure 10 may be formed on the substrate 100. The substrate 100 may include a cell region CR including a cell array region CAA and a connection region CTA, a peripheral region PR and a boundary region BR between the connection region CTA and the peripheral region PR The substrate 100 may be formed of or include a semiconductor material. For example, the substrate 100 may be a single-crystalline silicon wafer, a single-crystalline germanium wafer, or a single-crystalline silicon-germanium wafer. In example embodiments, the substrate 100 may be SOI (Semiconductor on Insulator) wafer. For example, the substrate 100 may include a semiconductor substrate, an insulating layer that is disposed on the semiconductor substrate to cover transistors provided on the semiconductor substrate, and a semiconductor layer (e.g., a silicon layer, a silicon-germanium layer, germanium layer) disposed on the insulating layer. The substrate 100 may be, for example, a semiconductor substrate with the first conductivity type (e.g., p-type). A well region (not shown) may be formed in the substrate 100.

The peripheral circuit device PT may be formed on the peripheral region PR. The peripheral circuit device PT may include the peripheral gate insulating layer 101 and the peripheral gate electrode 103 that are stacked on the substrate 100 and the source/drain regions 107 formed in the substrate 100 adjacent to both sidewalls of the peripheral gate electrode 103. Peripheral gate spacers 105 may be formed on both sidewalls of the peripheral gate electrode 103. The formation of the peripheral circuit device PT may include, for example, sequentially forming the peripheral gate insulating layer 101 and the peripheral gate electrode 103 on the substrate 100, and injecting impurities into the substrate 100 adjacent to both sidewalls of the peripheral gate electrode 103 to form the source/drain regions 107. The peripheral circuit device PT may be formed to serve as, for example, a high or low voltage transistor. A peripheral protection layer 109 may be formed on the substrate 100 to cover the peripheral circuit device PT and expose the substrate 100 of the cell region CR and the boundary region BR.

The peripheral gate insulating layer 101 may be formed of or include oxide (e.g., silicon oxide) or high-k dielectric material. The peripheral gate electrode 103 may be formed of or include at least one of silicon (e.g., polysilicon), metal silicide (e.g., tungsten silicide (WSi), nickel silicide (NiSi), cobalt silicide (CoSi), or titanium silicide (TiSi), or tantalum silicide (TaSi)), metal (e.g., tungsten or aluminum), and/or a combination thereof. The peripheral protection layer 109 may be formed of or include, for example, silicon oxide or silicon nitride.

The mold structure 10 may be formed on the cell region CR, boundary region BR and the peripheral protection layer 109. The mold structure 10 may include the insulating layers 110 and sacrificial layers 112 that are alternately and repeatedly stacked on the substrate 100. In other words, the mold structure 10 may include a plurality of insulating layers 110 and a plurality of sacrificial layers 112. The sacrificial layers 112 may be formed of material having an etch selectivity with respect to the insulating layers 110. For example, the sacrificial layers 112 may be formed of material having much higher etch rate than the insulating layers 110 in a wet etching process using chemical etchants for removing the sacrificial layers 112. For example, each of the insulating layers 110 may be a silicon oxide layer, and each of the sacrificial layers 112 may be a silicon nitride layer. In example embodiments, each of the insulating layers 110 may be a silicon oxide layer, and each of the sacrificial layers 112 may be formed of one of a silicon nitride layer, a silicon carbide layer, a silicon layer, or a silicon germanium layer. In example embodiments, each of the insulating layers 110 may be formed of a silicon nitride layer, and each of the sacrificial layers 112 may be formed of one of the silicon oxide layer, a silicon carbide layer, a silicon layer, or a silicon germanium layer.

The insulating layers 110 and the sacrificial layers 112 may be formed using a thermal chemical vapor deposition (Thermal CVD) process, a plasma enhanced CVD process, or an atomic layer deposition (ALD) process.

The sacrificial layers 112 may be formed to have the substantially same thickness. In example embodiments, a lowermost insulating layer 110-1 in contact with the substrate 100 may be a silicon oxide layer formed by a thermal oxidation process or a deposition process and may be thinner than the others of the insulating layers 110 provided thereon. In example embodiments, a second insulating layer 110-2 from the substrate 100 and an uppermost insulating layer 110-3 may be formed to be thicker than the others of the insulating layers 110 or the sacrificial layers 112.

Figure 9B:
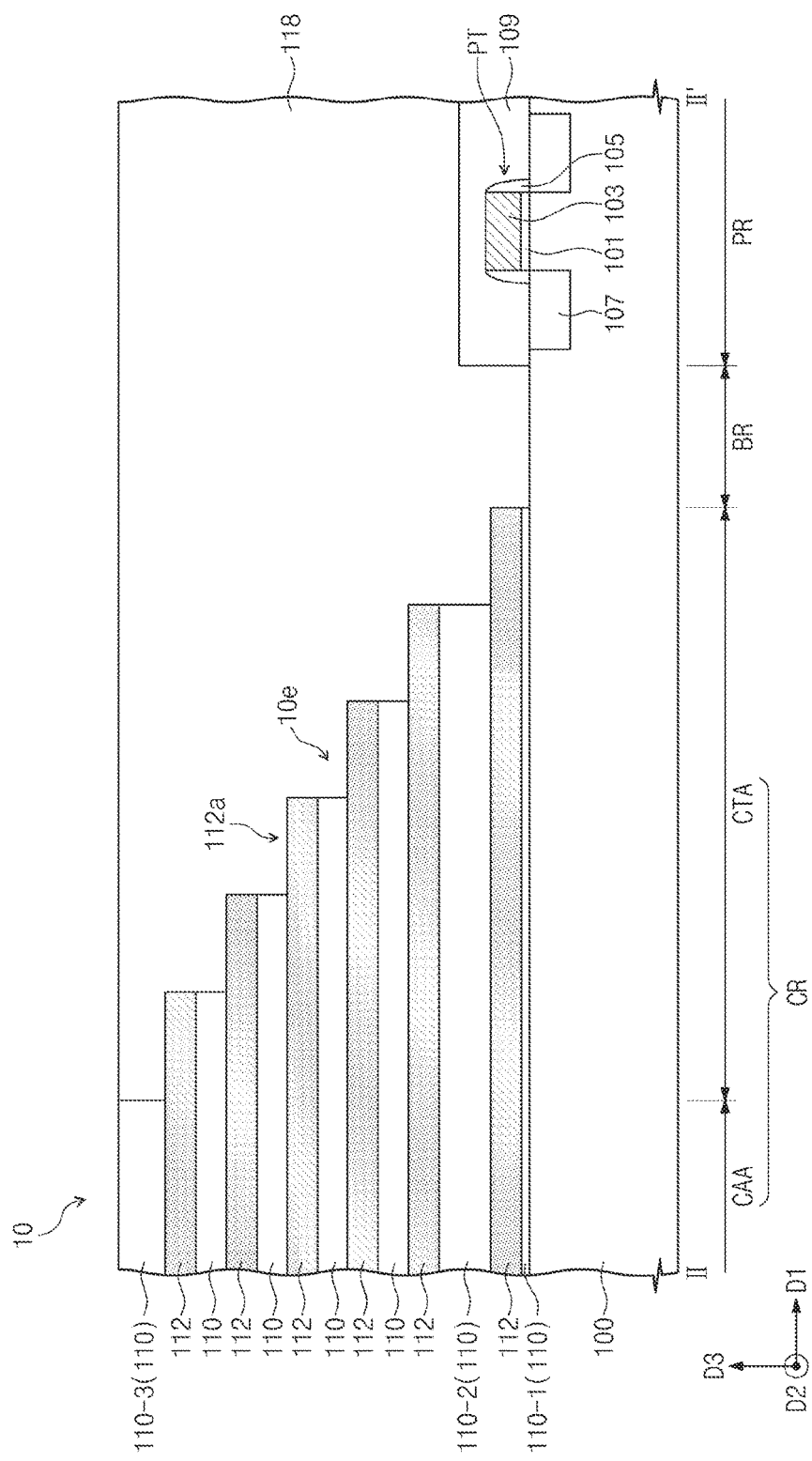

Referring to FIGS. 9A and 9B, the mold structure 10 may be patterned to have a stepwise profile on the connection region CTA. In other words, the mold structure 10 may be patterned to have an edge part 10*e* with stepwise structure. For example, the sacrificial layers 112 may have pad parts 112*a* which form a stepwise structure. A portion of each of the pad parts 112*a* of the sacrificial layers 112 may be formed to be exposed. In example embodiments, the mold structure 10 may be patterned to have a stepwise structure such that top surfaces of the pad parts 112*a* of the sacrificial layers 112 are covered by the insulating layers 110 and are not exposed. On the connection region CTA, a vertical height of the mold structure 10 may decrease stepwise in a direction away from the cell array region CAA.

The mold insulating layer 118 may be formed on the connection region CTA, the boundary region BR, and the peripheral region PR. The mold insulating layer 118 may cover the edge part 10*e* of the mold structure 10. The mold insulating layer 118 may cover the pad parts 112*a* of the sacrificial layers 112. The mold insulating layer 118 may be in contact with the substrate 100 of the boundary region BR. The mold insulating layer 118 may be formed of or include, for example, oxide or low-k dielectric material.

Figure 10A:
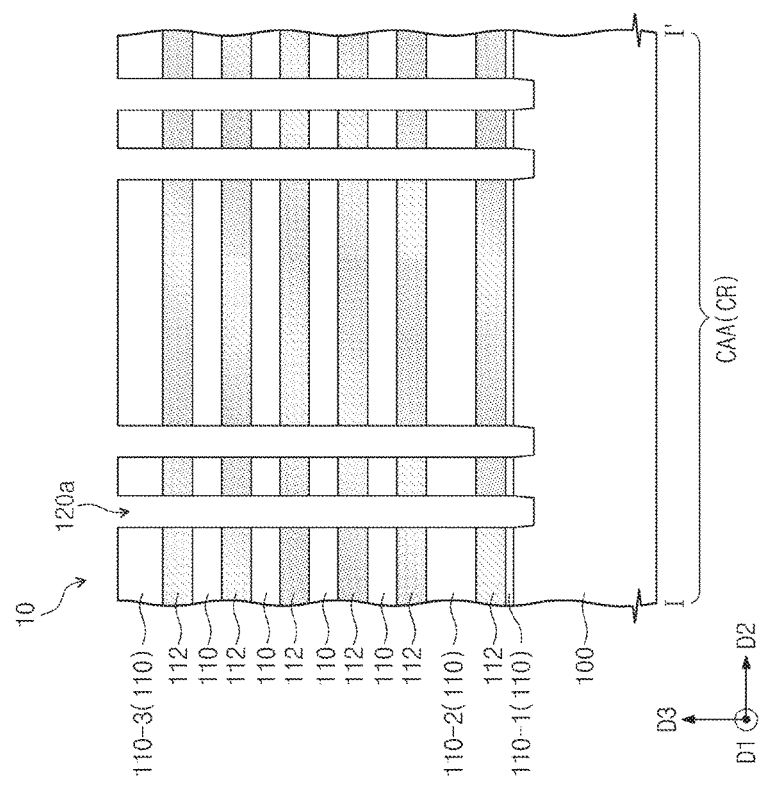
Figure 10B:
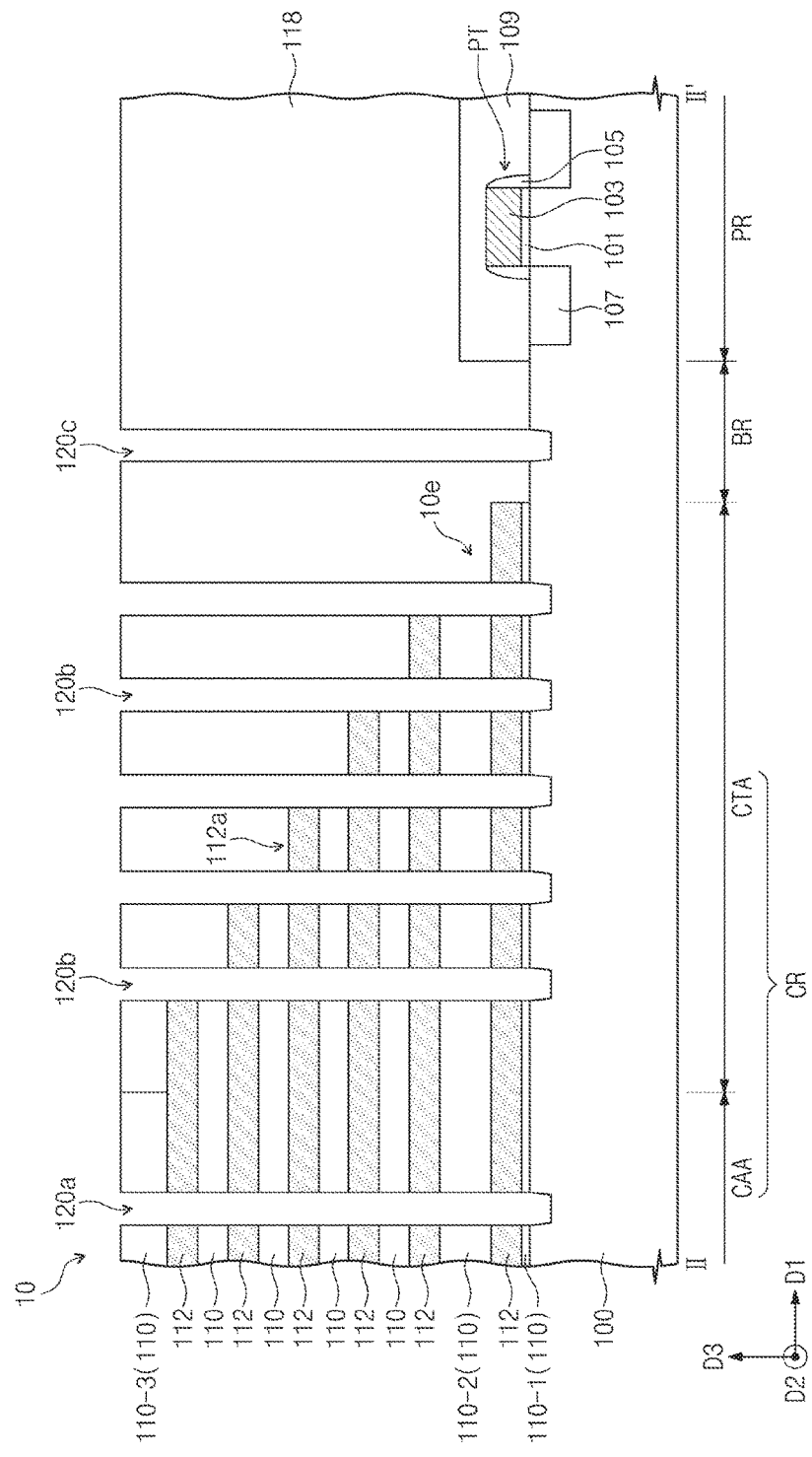

Referring to FIGS. 10A and 10B, first channel holes 120a, second channel holes 120b and a third channel opening 120c may be formed on the cell array region CAA, the connection region CTA and the boundary region BR, respectively.

On the cell array region CAA, the first channel holes 120a may be formed to penetrate the mold structure 10 and expose the substrate 100. For example, the first channel holes 120a may be formed by anisotropically etching the mold structure 10. When the first channel holes 120a may be formed, the substrate 100 may be over-etched to be recessed. When viewed in plan view, the first channel holes 120a may be formed to have the same arrangement as that of the cell channel structures 200a of FIG. 2A On the connection region CTA, the second channel holes 120b may be formed to penetrate the mold insulating layer 118 and the edge part 10e and expose the substrate 100. The second channel holes 120b may be formed by anisotropically etching the mold insulating layer 118 and the mold structure 10. For example, the second channel holes 120b may be formed by etching edge portion of the pad part 112a of a corresponding one of the sacrificial layers 112, at least one of other sacrificial layers 112 under the corresponding one of the sacrificial layers 112, and at least one of the insulating layers 110 under the corresponding one of the sacrificial layers 112. When the second channel holes 120b may be formed, the substrate 100 may be over-etched to be recessed. When viewed in plan view, the second channel holes 120b may be formed to have the same arrangement as the first dummy channel structures 200b of FIG. 2A On the boundary region BR, the third channel opening 120c may formed by etching the mold insulating layer 118, and then the substrate 100 may be etched to be recessed. The third channel opening 120c may have a hole shape. The third channel opening 120c may have, for example, a substantially circular or oval shape in plan view. A plurality of the third channel openings 120c may be arranged to form a column parallel to the second direction D2 in the same arrangement as the second dummy channel structures 200c of FIG. 2A. In example embodiments, a plurality of the third channel openings 120c may be arranged to form a plurality of columns parallel to the second direction D2 in the same as an arrangement of the second dummy channel structures 200c of FIG. 2C. In example embodiments, a plurality of the third channel openings 120c, each of which has the hole shape, may be arranged along the first and second direction D1, D2 to surround the cell region CR in the same arrangement as the second dummy channel structures 200c of FIG. 7B. In example embodiments, the third channel opening 120c may have a trench shape (or slit shape). For example, the third channel opening 120c may have a bar shape (or a linear shape) in plan view. A plurality of the third channel openings 120c may be arranged to form a column parallel to the second direction D2 in the same arrangement as the second dummy channel structures 200c of FIG. 2B. In example embodiments, the third channel opening 120c having the trench shape may be extended in the second direction D2 in the same arrangement as the second dummy channel structure 200c of FIG. 7A. In example embodiments, the third channel openings 120c, each of which has the hole shape, may be extended in the first and second direction D1, D2 in the same arrangement as the second dummy channel structure 200c of FIG. 7C, and the third channel opening 120c may surround the cell region CR in the same loop shape as the second dummy channel structure 200c of FIG. 7D.

Figure 11B:
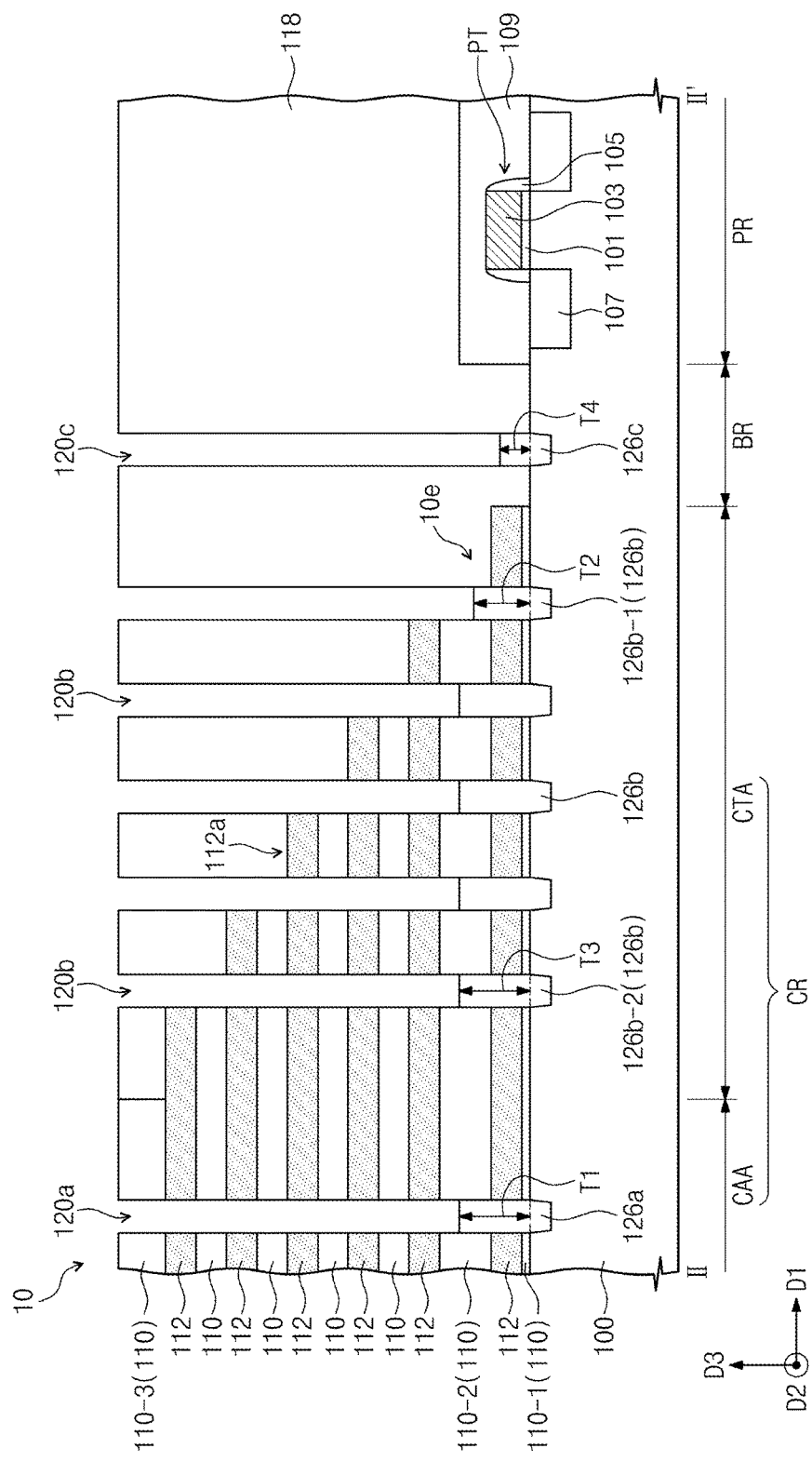
Figure 12A:
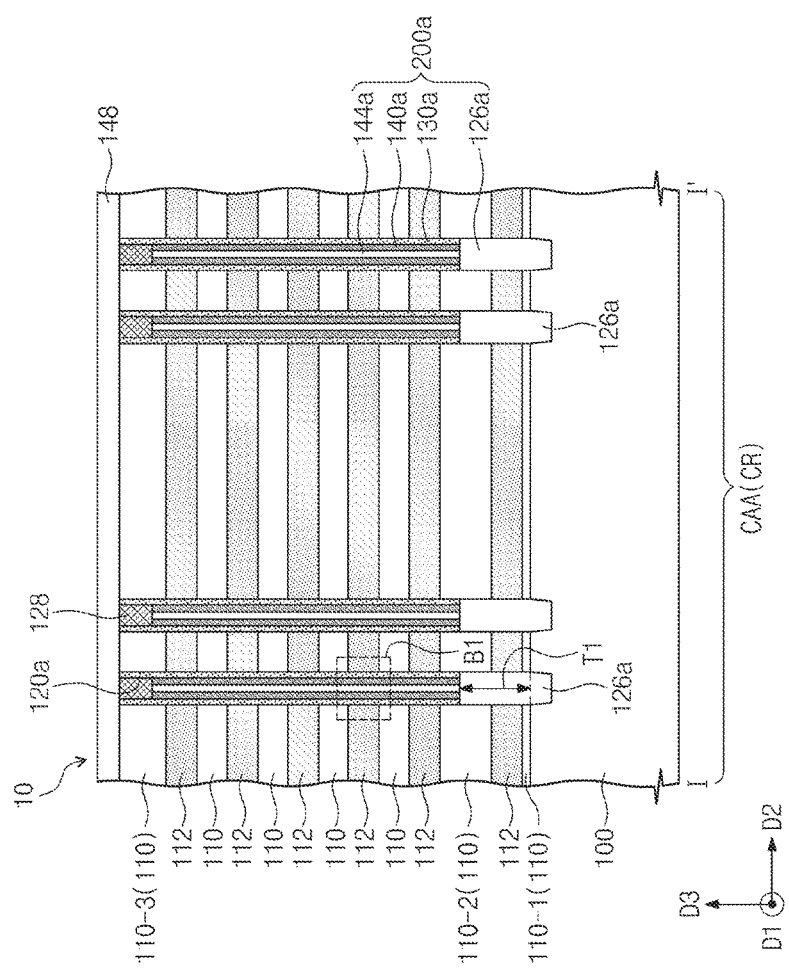
Figure 12B:
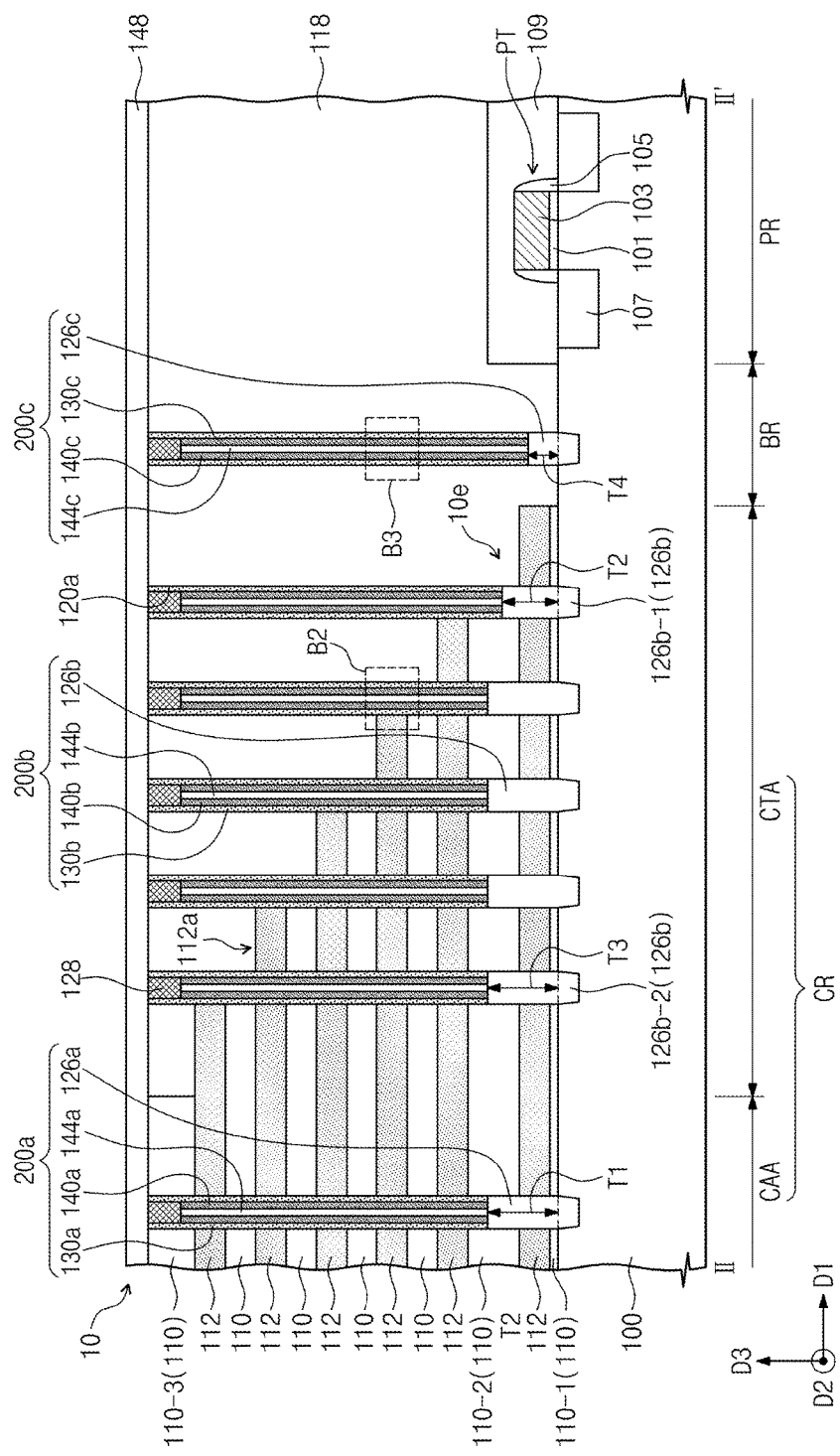

Referring to FIGS. 11A and 11B, the first, second and third semiconductor patterns 126a, 126b, 126c may be formed in the first, second and third channel holes 120a, 120b, 120c, respectively. The first through third semiconductor patterns 126a, 126b, 126c may be in contact with the substrate 100. A portion of each of the first through third semiconductor patterns 126a, 126b, 126c may be buried in the substrate 100 and the other portion of each of the first through third semiconductor patterns 126a, 126b, 126c may be protruded upwardly from a surface of the substrate 100 to have a pillar shape. The first and second semiconductor patterns 126a, 126b may have top surfaces which are positioned at a level higher than a top surface of a lowermost one of sacrificial layers 112 and lower than a top surface of the second insulating layer 110-2 from the semiconductor 100. Each of the top surfaces of the first through third semiconductor patterns 126a, 126b, 126c may have various shapes. For example, the top surfaces of the first, second and third semiconductor patterns 126a, 126b, 126c may have a flat shape, a shape slanted with respect to the substrate 100, or a shape like spire.

Each of the first semiconductor patterns 126a may have a first height T1. The first height T1 may be a maximum height from the surface of the substrate 100 to the top surface of the first semiconductor pattern 126a. The second semiconductor pattern 126b may include a first sub-semiconductor pattern 126b-1 and a second sub-semiconductor pattern 126b-2. The first sub-semiconductor pattern 126b-1 may be the closest to the boundary region BR (e.g., a third semiconductor pattern 126c), and may be farthest from the cell array region CAA (e.g., the first semiconductor patterns 126a). The second sub-semiconductor pattern 126b-2 may be closest to the cell array region CAA (e.g., the first semiconductor patterns 126a). The first sub-semiconductor pattern 126b-1 may have a second height T2 that is a maximum height from the substrate 100 to a top surface of the first sub-semiconductor pattern 126b-1. The second sub-semiconductor pattern 126b-2 may have a third height T3 that is a maximum height from the substrate 100 to a top surface of the second sub-semiconductor pattern 126b-2. The third semiconductor pattern 126c may have a fourth height T4. The fourth height T4 may be a maximum height from the surface of the semiconductor 100 to the top surface of the third semiconductor substrate 126c. The fourth height T4 may be smaller than the first through third heights T1, T2, T3. The third height T3 may be substantially equal to the first height T1. The second height T2 may be smaller than the first and third heights T1, T3. In example embodiments, the fourth height T4 may be greater than the second height T2 and smaller than the first and third heights T1, T3 as shown in FIG. 5

The first through third semiconductor pattern 126a, 126b, 126c may formed by the same selective epitaxial growth process. Each of the first through third semiconductor patterns 126a, 126b, 126c may be an epitaxial pattern including silicon. The first through third semiconductor pattern 126a, 126b, 126c may be an epitaxial pattern formed of single-crystalline silicon or poly-crystalline silicon.

The selective epitaxial growth process for formations of the first through third semiconductor patterns 126a, 126b, 126c may be performed using, for example, dichlorosilane ($SiH_2Cl_2$) at a high temperature ranging from 700° C. to 1000° C. Thus, impurities (e.g., hydrogen, carbon, or nitrogen) generated from the mold insulating layer 118 may be outgassed through the third channel opening 112c. The first sub-semiconductor pattern 126b-1 formed in the second channel holes 120b located closest to boundary region BR may be properly grown due to the third channel opening

120c. Thus, the first sub-semiconductor pattern 126b-1 has the top surface higher than the top surface of a lowermost sacrificial layer 112.

Without the third channel opening 120c, an amount of impurities outgassing through the second channel holes 120b adjacent to the boundary region BR might be increased during the selective epitaxial growth process. Accordingly, a growth of the second semiconductor pattern 126b adjacent to the boundary region BR may be suppressed. As a result, the top surface of the first sub-semiconductor pattern 126b-1 may be lower than the top surface of the lowermost sacrificial layer 112. Therefore, a leakage current through the first sub-semiconductor 126b-1 may be generated, and a reliability of the semiconductor device may be deteriorated According to example embodiments of inventive concepts described above, since the third channel opening 120c may serve as a path of outgassing the impurities from the mold insulating layer 118, the second semiconductor patterns 126b (e.g., the first sub-semiconductor pattern 126b-1) may be limited (and/or prevented) from the suppression of the growth.

In example embodiments, each of the first through third semiconductor patterns 126a, 26b, 126c may be formed of at least one of germanium (Ge), silicon germanium (SiGe), III-V compound semiconductor, II-VI compound semiconductor. Each of the first through third semiconductor patterns 126a, 126b, 126c may be formed of undoped semiconductor material, or semiconductor material doped with dopants of which conductivity is the same as that of the substrate 100.

Referring to FIGS. 12A, 12B, 19A, 19B, and 19C, cell channel structures 200a, a first dummy channel structures 200b and the second dummy channel structure 200c may be formed on the cell array region CAA, the connection region CTA and the boundary region BR, respectively. Each of the cell channel structures 200a may be formed in a corresponding one of the first channel holes 120a, each of the first dummy channel structures 200b may be formed in a corresponding one of the second channel holes 120b and the second dummy channel structure 200c may be formed in the third channel opening 120c. The cell channel structures 200a may be arranged to form a plurality of rows parallel to the first direction D1 and a plurality of columns parallel to the second direction D2 as shown in FIG. 2A.

Each of the cell channel structures 200a may include a first semiconductor pattern 126a, a first channel pattern 140a, a first data storing pattern 130a, and the first insulating gap-filling pattern 144a. The first data storing pattern 130a, the first channel pattern 140a, and the first insulating gap-filling pattern 144a may be formed on the first semiconductor pattern 126a. For example, the first data storing pattern 130a, the first channel pattern 140a, and the first insulating gap-filling pattern 144a may be sequentially formed on an inner side surface of each of the first channel holes 120a provided with the first semiconductor pattern 126a.

The first data storing pattern 130a may be formed to cover the inner side surface of each of the first channel holes 120a. For example, the first data storing pattern 130a may be formed in the form of a spacer on the inner side surface of each of the first channel holes 120a and may extend vertically on the first semiconductor pattern 126a. The first data storing pattern 130a may have a top- and bottom-open structure. The first data storing pattern 130 a may be in contact with the insulating layers 110 and the sacrificial layers 112 of the mold structure 10. The first data storing pattern 130a may include a thin layer in which data can be stored. For example, the first data storing pattern 130a may be configured in such a way that data therein can be changed using a Fowler-Nordheim tunneling effect caused by such a voltage difference. However, inventive concepts are not limited thereto. In example embodiments, the first data storage pattern 130a may include a thin layer capable of storing data based on another operation principle (e.g., a thin layer used for a phase change memory device or a thin layer used for a variable resistance memory device).

As illustrated in FIG. 19A, the first data storing pattern 130a may include a first blocking insulating layer 132, a charge storing layer 134, and a tunnel insulating layer 136. For example, the first blocking insulating layer 132, the charge storing layer 134 and the tunnel insulating layer 136 may be sequentially formed on the inner side surface of each of the first channel holes 120a. The first blocking insulating layer 132 may be formed of or include a silicon oxide and/or a high-k dielectric material (e.g., aluminum oxide or hafnium oxide). The first blocking insulating layer 132 may be provided in the form of a single layer or a plurality of layers. In example embodiments, the first blocking insulating layer 132 may be a single layer made of silicon oxide. In example embodiments, the first blocking insulating layer 132 may be provided to have a multi-layered structure including an aluminum oxide layer and/or a hafnium oxide layer.

The charge storing layer 134 may be a trap insulating layer or an insulating layer with conductive nano dots. The trap insulating layer may be formed of or include, for example, silicon nitride. The tunnel insulating layer 136 may formed of or include, for example, silicon oxide. The first blocking insulating layer 132 and the charge storing layer 134 may be formed using a plasma enhanced CVD process or an atomic layer deposition (ALD) process. The tunnel insulating layer 136 may be formed using a plasma enhanced CVD process, an atomic layer deposition (ALD) process, or a thermal oxidation process. The tunnel insulating layer 136 may be in contact with the first channel pattern 140a.

The first channel pattern 140a may be in contact with the first data storing pattern 130a and may be conformally formed in each of the first channel holes 120a to be a linear structure vertically standing on the first semiconductor pattern 126a. The first channel pattern 140a may be in contact with the first semiconductor pattern 126a. The first channel pattern 140a may have a top-open structure. In example embodiments, the first channel pattern 140a may be a top- and bottom-open structure, a hollow cylindrical structure, or a macaroni-shaped structure. In example embodiments, the first channel pattern 140a may be provided in the form of a solid pillar, and in this case, the first insulating gap-filling pattern 144a may not be provided in each of the first channel holes 120a. The first channel pattern 140a may be formed of or include a poly-crystalline, amorphous, or single-crystalline semiconductor material. The first channel pattern 140a may be formed of or include at least one of silicon (Si), germanium (Ge), silicon germanium (SiGe), gallium arsenic (GaAs), indium gallium arsenic (InGaAs), aluminum gallium arsenic (AlGaAs), and/or a combination thereof. The first channel pattern 140a may be formed of or include an undoped semiconductor material or a doped semiconductor material having the same conductivity type as the substrate 100. The first channel pattern 140a may be formed using an ALD process, a CVD process, or an epitaxial growth process.

The first insulating gap-filling pattern 144a may be formed to fill each of the first channel holes 124 provided with the first channel pattern 140a. The first insulating gap-filling pattern 144a may be formed of or include silicon oxide or silicon nitride.

Each of the first dummy channel structures 200b may include a second semiconductor pattern 126b, a second channel pattern 140b, a second data storing pattern 130b, and a second insulating gap-filling pattern 144b. The second data storing pattern 130b, the second channel pattern 140b, and the second insulating gap-filling pattern 144b may be formed on the second semiconductor pattern 126b. For example, the second data storing pattern 130b, the second channel pattern 140b, and the second insulating gap-filling pattern 144b may be sequentially formed on the inner side surface of each of the second channel holes 120b provided with the second semiconductor pattern 126b.

The second data storing pattern 130b may be formed to cover the inner side surface of each of the second channel holes 120b. For example, the second data storing pattern 130b may be formed in the form of a spacer in each of the second channel holes 120b and may extend vertically on the second semiconductor pattern 126b. The second data storing pattern 130b may have the substantially same structure or shape as the first data storing pattern 130a of the first channel structure 200a in sectional view. The second data storing pattern 130b may include the same materials as the first data storing pattern 130a. For example, the second data storing pattern 130b may include the first blocking insulating layer 132, the charge storing layer 134, and the tunnel insulating layer 136 which are sequentially formed on the inner side surface of each of the second channel holes 120b, as illustrated in FIG. 19B.

The second channel pattern 140b may be in contact with the second data storing pattern 130b and may be conformally formed in each of the second channel holes 120b to be a linear structure vertically standing on the second semiconductor pattern 126b. The second channel pattern 140b may be in contact with the second semiconductor pattern 126b. The second channel pattern 140b may have the substantially same structure or shape as the first channel pattern 140a in sectional view. The second channel pattern 140b may be formed of or include the same material as the first channel pattern 140a. The second insulating gap-filling pattern 144b may be formed to fill each of the second channel holes 120b provided with the second channel pattern 140b. The second insulating gap-filling pattern 144b may have the substantially same structure or shape as the first insulating gap-filling pattern 144a in sectional view. The second insulating gap-filling pattern 144b may be formed of or include the same material as the first insulating gap-filling pattern 144a.

Each of the second dummy channel structures 200c may include a third semiconductor pattern 126c, a third channel pattern 140c, a third data storing pattern 130c, and a third insulating gap-filling pattern 144c. The third data storing pattern 130c, the third channel pattern 140c, and the third insulating gap-filling pattern 144c may be formed on the third semiconductor pattern 126c. For example, the third data storing pattern 130c, the third channel pattern 140c, and the third insulating gap-filling pattern 144c may be sequentially formed on the inner side surface of the third channel opening 120c provided with the third semiconductor pattern 126c. The second dummy channel structure 200c may be in contact with the mold insulating layer 118.

The third data storing pattern 130c may be formed to cover the inner side surface of the third channel opening 120c. For example, the third data storing pattern 130c may be formed in the form of a spacer in the third channel opening 120c and may extend vertically on the third semi-conductor pattern 126c. The third data storing pattern 130c may be in contact with the mold insulating layer 118. The third data storing pattern 130c may have the substantially same structure or shape as the first and second data storing patterns 130a, 130b in sectional view. The third data storing pattern 130c may include the same materials as the first and second data storing pattern 130a, 130b. For example, the third data storing pattern 130c may include the first blocking insulating layer 132, the charge storing layer 134, and the tunnel insulating layer 136 which are sequentially formed on the inner side surface of the third channel opening 120c, as illustrated in FIG. 19C. The first through third data storing patterns 130a, 130b, 130c may be formed using the same process.

The third channel pattern 140c may be in contact with the third data storing pattern 130c and be conformally formed in the third channel opening 120c to be a linear structure vertically standing on the third semiconductor pattern 126c. The third channel pattern 140c may be in contact with the third semiconductor pattern 126c. The third channel pattern 140c may have the substantially same structure or shape as the first and second channel patterns 140a, 140b in sectional view. The third channel pattern 140c may be formed of or include the same material as the first and second channel patterns 140a, 140b. The first through third channel patterns 140a, 140b, 140c may be formed using the same process.

The third insulating gap-filling pattern 144c may be formed to fill the third channel opening 120c provided with the third channel pattern 140c. The third insulating gap-filling pattern 144c may have the substantially same structure or shape as the first and second insulating gap-filling patterns 144a, 144b in sectional view. The third insulating gap-filling pattern 144c may be formed of or include the same material as the first and second insulating gap-filling patterns 144a, 144b. The first through third insulating gap-filling pattern 144a, 144b, 144c may be formed using the same process.

When viewed in plan view, the second dummy channel structure 200c may have a substantially circular shape or an oval shape as shown in FIG. 2A, or may have a bar shape (or linear shape) as shown in FIG. 2B. When viewed in plan view with reference to FIGS. 2A and 2B, a plurality of the second dummy channel structures 200c may be arranged to form a column in the second direction D2. For example, the second dummy channel structures 200c may be spaced apart from the mold structure 10 (e.g., stacks 30 of FIG. 16B) and may be arranged to form a column in the second direction D2. In example embodiments, as shown in FIG. 2C, the second dummy channel structures 200c may be arranged to form two columns in the second direction D2. In this case, each of the second dummy channel structures 200c may have a substantially circular or oval shape in plan view. However, inventive concepts are not limited thereto, and the second dummy channel structures 200c may be arranged to form more than three columns in the second direction D2. In example embodiments, as shown in FIG. 7A, the second dummy channel structures 200c, each of which has a bar shape (or a linear shape) in plan view, may be extended in the second direction between the connection region CTA and the peripheral region PR. For example, each of the second dummy channel structures 200c may be spaced apart from the mold structure 10 (e.g., the stacks 30 of FIG. 16B) in the first direction D1 and may be extended in the second direction D2. In example embodiments, as shown in FIGS. 7B and 7C, the second dummy channel structures 200c may be disposed around the cell region CR. For example, the second dummy channel structures may be disposed between the connection region CTA and the peripheral region PR in the second direction D2 and between the cell region CR and the peripheral region PR in the first direction D1, in plan view. In example embodiments, the second dummy channel structure 200c may have a loop shaped structure in plan view as shown in FIG. 7D and may surround structures on the cell region CR.

Conductive pads 128 may be formed on the cell channel structures 200a, and the first and second dummy channel structures 200b, 200c, respectively. In example embodiments, the conductive pads 128 may not be formed on the first and/or second dummy channel structures 200b, 200c except for the cell channel structures 200a. Each of the conductive pads 128 may be formed of or include conductive material. Each of the conductive pads 128 may include an impurity region doped with dopants. In example embodiments, an end portion of the cell channel structure 200a in contact with the conductive pad 128 may serve as a drain region. A capping insulating layer 148 may be formed on the mold structure 10 and mold insulating layer 118 to cover the conductive pads 128. The capping insulating layer 148 may formed of or include oxide or nitride.

Figure 13A:
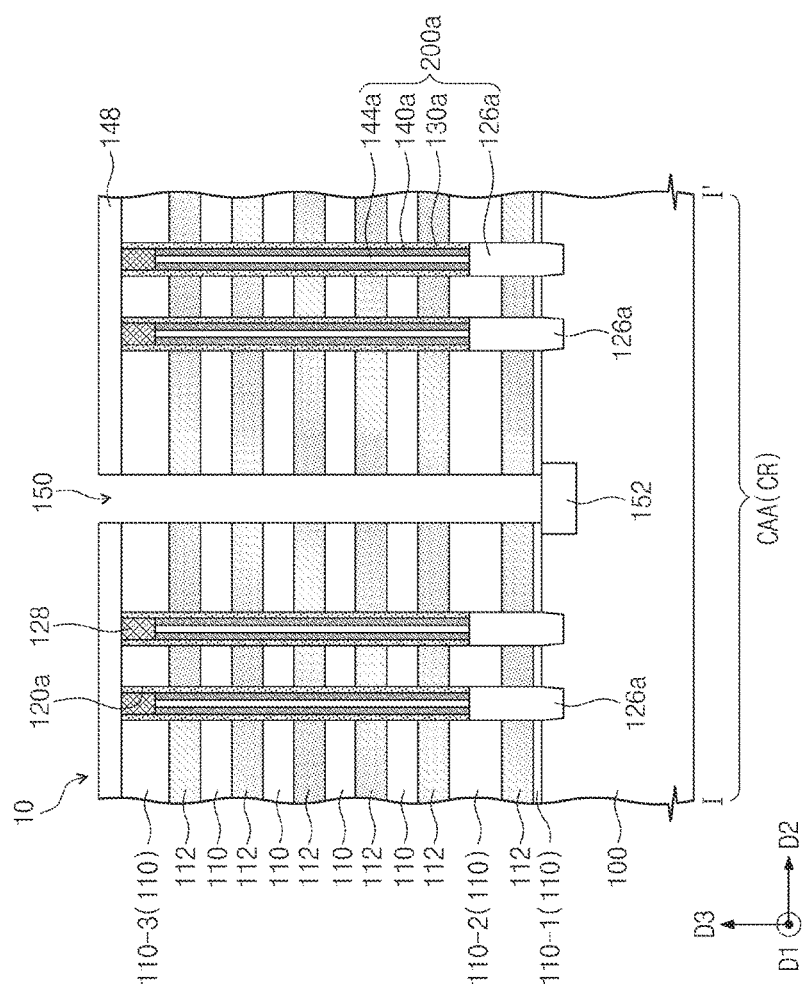
Figure 13B:
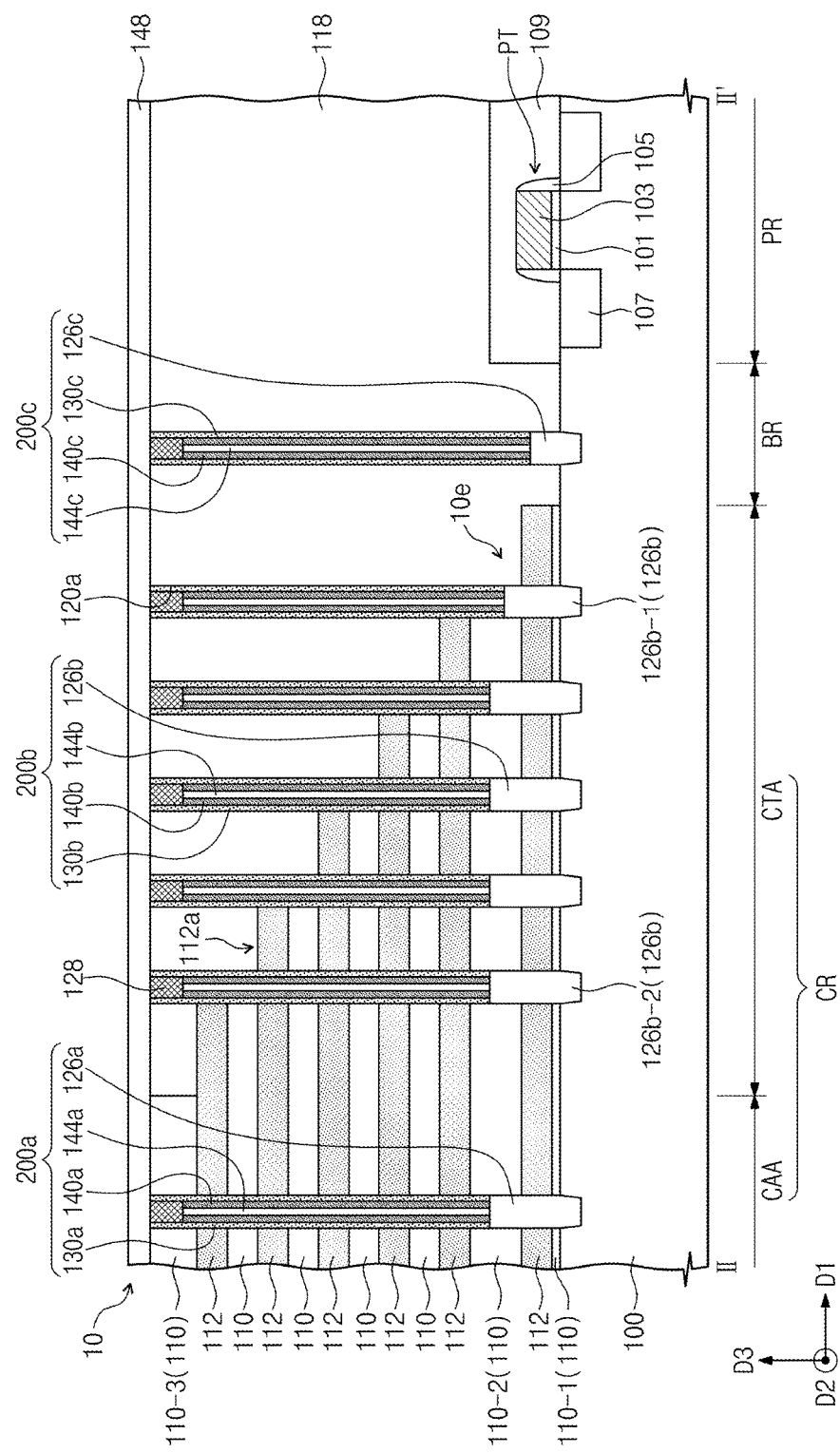

Referring to FIGS. 13A and 13B, a trench 150 may be formed in the mold structure 10 on the cell region CR. The trench 150 may be formed by patterning the mold structure 10 in order to expose the substrate 100. For example, as illustrated in FIG. 2A, the trench 150 may be formed to extend from the cell array region CAA to the connection region CTA in the first direction D1. The trench 150 may be formed to form two rows of the cell channel structures 200a arranged in a zigzag form in the first direction D1, as shown in FIG. 2A. Thus, two rows of the cell channel structures 200a that are arranged in a zigzag form in the first direction D1 may be repeatedly arranged along the second direction D2. In example embodiments, one row or more than three rows of the cell channel structures 200a that are arranged in a zigzag form in the first direction D1 may be repeatedly arranged along the second direction D2. In addition, as shown in FIG. 2A, the trench 150 may be formed between the first dummy channel structures 200b in such way that the first dummy channel structures 200b may be arranged to form two rows parallel to the first direction D1. In example embodiments, the trench 150 may be formed between the first dummy channel structures 200b in such way that the first dummy channel structures 200b may be arranged to form one or more than three rows parallel to the first direction D1.

A common source region 152 may be formed in the substrate 100 exposed by the trench 150. For example, the common source region 152 may be formed by injecting n-type impurities (e.g., phosphorus (P) or arsenic (As)) in the substrate 100 exposed by the trench 150.

Figure 14A:
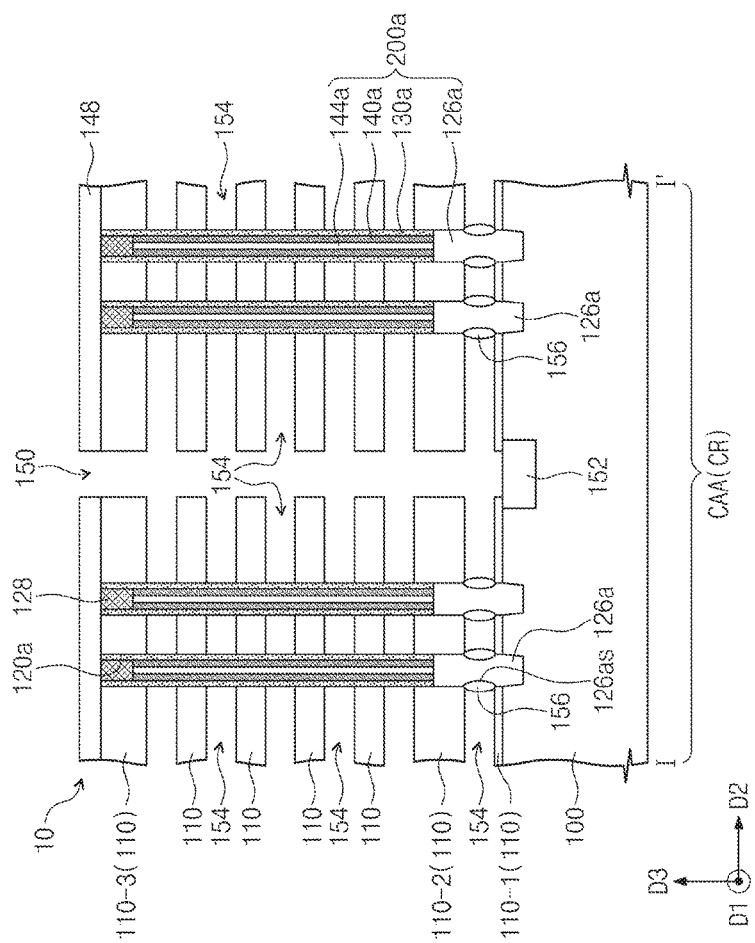
Figure 14B:
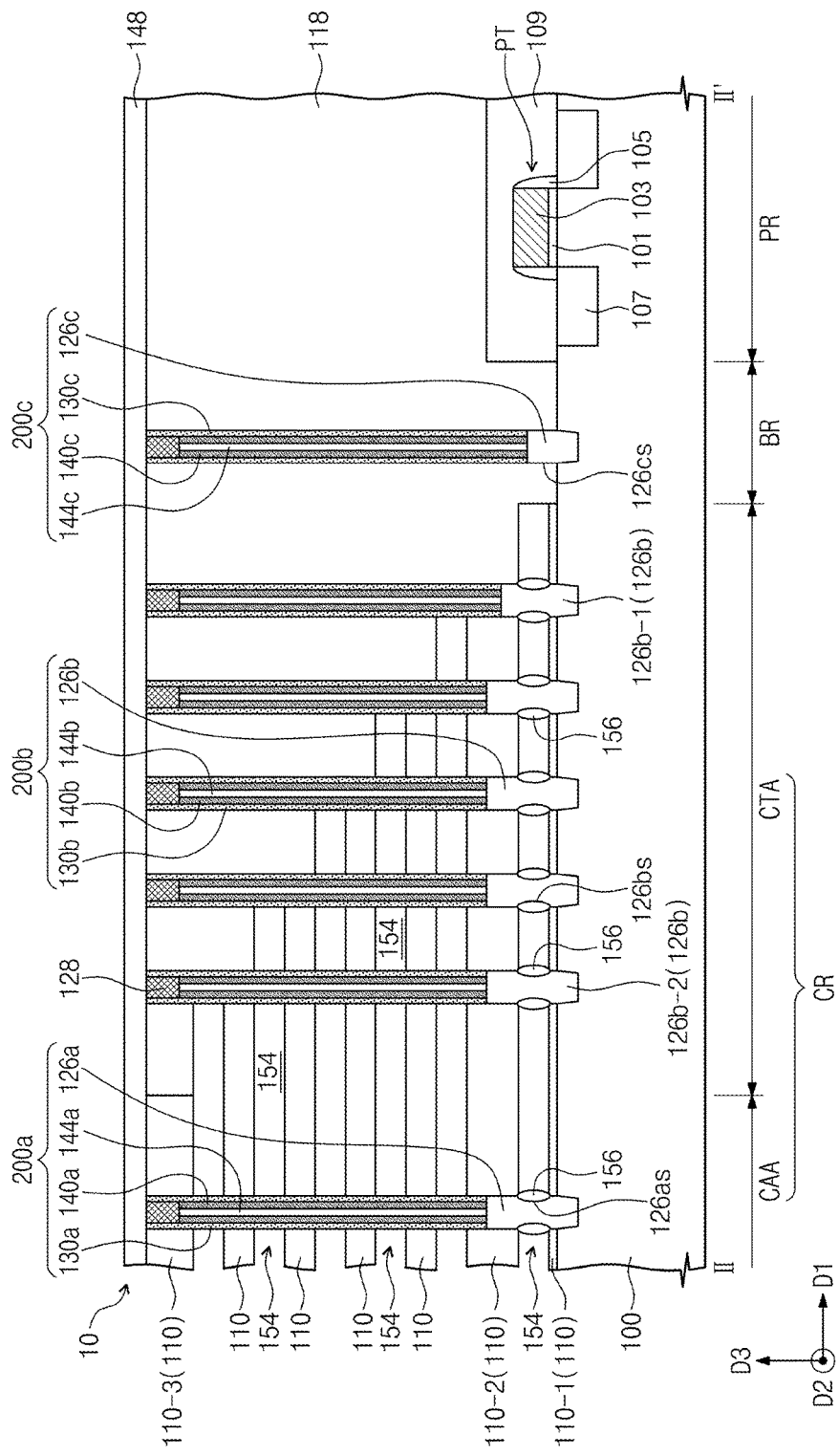

Referring to FIGS. 14A and 14B, openings 154 may be formed in the mold structure 10 on the cell array region CAA and the connection region CTA. For example, openings 154 may be formed by removing the sacrificial layers 112 from the mold structure 10 exposed by the trench 150. The formation of the openings 154 may include selectively removing the sacrificial layers 112 using an isotropic etching technique. The openings 154 may be formed to expose a portion of a sidewall of each of the cell channel structure 200a and a portion of a sidewall of each of the first dummy channel structure 200b.

A gate dielectric layer 156 may be formed on a sidewall 126as of the first semiconductor pattern 126a and a sidewall 126bs of the second semiconductor pattern 126b. The gate dielectric layer 156 may be formed of, for example, oxide.

For example, the gate dielectric layer 156 may be formed by thermally oxidizing sidewalls 126as, 126bs of the first and second semiconductor pattern 126a, 126b exposed by the openings 154. The gate dielectric layer 156 may have a convex shape on the cell region CR and be formed properly on the sidewalls 126as, 126bs of the first and second semiconductor pattern 126a, 126b. The gate dielectric layer 156 may have a maximum thickness ranging for example, from 40 Å to 200 Å. Since the gate dielectric layer 156 may be formed by the thermal oxidation process, a portion of each of the sidewalls 126as, 126bs of the first and second semiconductor patterns 126a, 126b may be concave. For example, a maximum concave depth of each of the sidewall 126as of the first semiconductor pattern 126a and the sidewall 126bs of the second semiconductor pattern 126b may be in a range from about 20 Å to about 100 Å.

The gate dielectric layer 156 may not be formed on a sidewall 126cs of the third semiconductor pattern 126c in contact with the mold insulating layer 118, since the third semiconductor pattern 126c may not be exposed by the openings 150. Thus, the sidewall 126cs of the third semiconductor pattern may not have a concave portion. For example, at least a portion of the sidewall 126cs of the third semiconductor pattern may have a flat sectional profile.

Figure 15A:
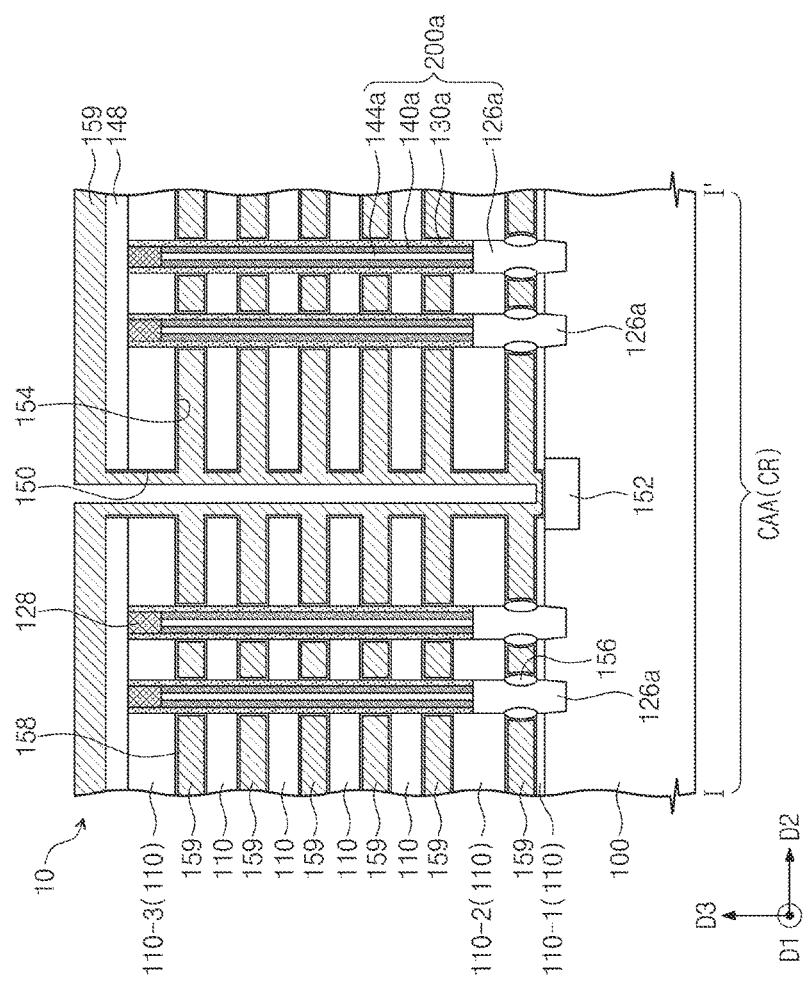

Referring to FIGS. 15A and 15B, a gate conductive layer 159 may be formed on the substrate 100 to fill the openings 154. The gate conductive layer 159 may be formed of or include at least one of a semiconductor layer, a metal silicide layer, a metal layer, a metal nitride layer, and/or a combination thereof. In example embodiments, the semiconductor layer for the gate conductive layer 159 may be a doped silicon layer. The metal silicide layer for the gate conductive layer 159 may be formed of or include cobalt silicide, titanium silicide, tungsten silicide, or tantalum silicide. The metal layer for the gate conductive layer 159 may be formed of or include tungsten, nickel, cobalt, titanium, or tantalum. The metal nitride layer for the gate conductive layer 159 may be formed of or include titanium nitride, tungsten nitride, or tantalum nitride.

A second blocking insulating layer 158 may be formed in the openings 154 prior to the formation of the gate conductive layer 159. Thus, the second blocking insulating layer 158 may cover a top, bottom, and side surfaces of the gate conductive layer 159 and be in contact with the first blocking insulating layer 132. The second blocking insulating layer 158 may be formed in the form of a single layer or a plurality of layers. Furthermore, the second blocking insulating layer 158 may be formed of or include a high-k dielectric material (e.g., aluminum oxide or hafnium oxide). In example embodiments, the formation of the second blocking insulating layer 158 may be omitted.

Figure 16A:
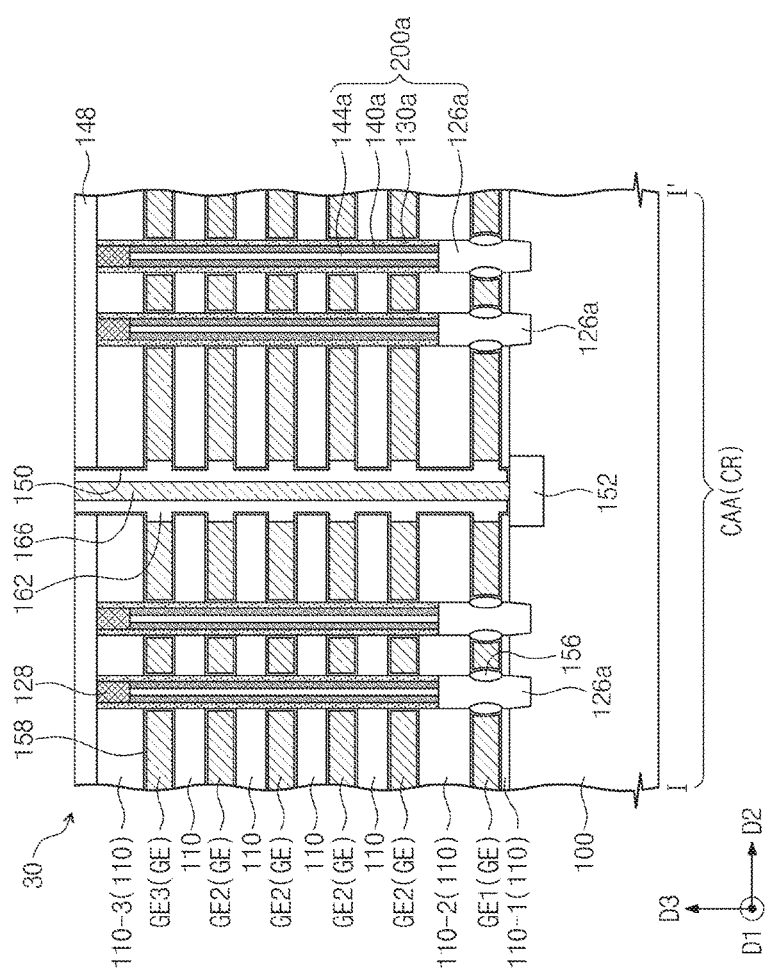
Figure 16B:
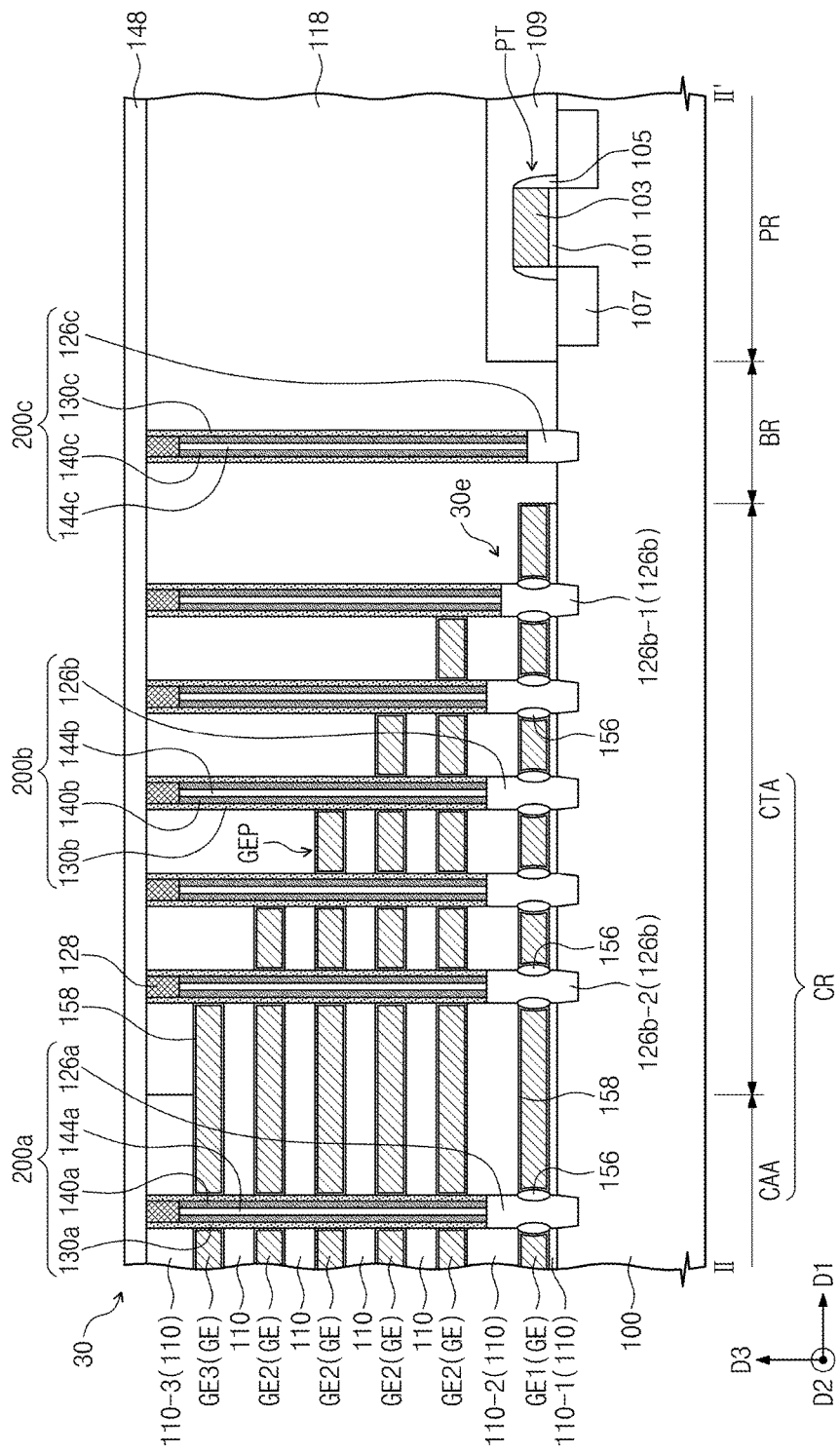

Referring to FIGS. 16A and 16B, gate electrodes GE may be formed by patterning the gate conductive layer 159. For example, a portion of the gate conductive layer 159 formed in the trench 150 and on the capping insulating layer 148 may be removed by performing an isotropic etching process, and thus the gate conductive layer 159 may be separated from each other in the third direction D3 by the insulating layers 110 to form the gate electrodes GE remaining in the openings 154. The gate electrodes GE may extend from the cell array region CAA to the connection region CTA and have pad parts GEP with a stepwise structure. A horizontal length of the gate electrodes GE may decrease in the third direction D3 away from the substrate 100.

As a result, stacks 30, each of which includes gate electrodes GE and insulating layers 110 that are alternately and repeatedly stacked on the cell region CR, may be formed. As illustrated in FIG. 2A, stacks 30 may be extended in a first direction D1 and be spaced apart from one another in a second direction D2 by the trench 150. The cell channel structures 200a may penetrate stacks 30. The gate electrodes GE may surround the cell channel structures 200a. The first dummy channel structures 200b may penetrate a portion of the stacks 30. As a result, the cell channel structures 200a and the first and dummy channel structures 200b may be arranged in each of stacks 30 as described with respect to FIGS. 2A and 2B. The gate electrodes GE may surround a portion of the first dummy channel structures 200b. Each of the stacks 30 may have an edge part 30e that has a stepwise structure on the connection region CTA. The second dummy channel structure 200c may be disposed to be spaced apart from the stacks 30. In example embodiments, at least one of the second dummy channel structures 200c may be disposed adjacent to a corresponding one of the stacks 30.

The gate electrodes GE may be coupled with the cell channel structures 200a to constitute memory cells. Vertical memory cell strings, each of which includes vertically-stacked memory cells, may be provided on the cell array region CAA. Lowermost and uppermost gate electrodes GE1, GE2 may be used as gate electrodes for ground and string selection transistors GST, SST The gate electrodes GE2, except for the uppermost and lowermost gate electrodes GE3, GE1, may be used as the control gate electrodes of the memory cells.

A common source plug 166 and an insulating isolation spacer 162 may be formed on the common source region 152 to fill the trench 150. The insulating isolation spacer 162 may formed to cover sidewalls of the gate electrodes GE and separate the gate electrodes GE electrically from the common source plug 166. The insulating isolation spacer 162 may be formed of at least one of silicon oxide, silicon nitride, silicon oxynitride, or low-k material. The common source plug 166 may be formed in the trench 150 provided with the insulating isolation spacer 162 to be electrically connected to the common source region 152. The common source plug 166 may extend parallel to the common source region 152 or the first direction D1. In example embodiments, the common source plugs 166 may be formed to fill a hole that is formed in the insulation isolation spacer 162, thus the common source plugs 166 may penetrate the insulation isolation spacer 162 and be in contact with the common source region 152. The common source plug 166 may be formed of or include a metallic material (e.g., tungsten, copper or aluminum). In addition, the common source plug 166 may further include a barrier metal layer. For example, the barrier metal layer for the common source plug 166 may be formed of or include at least one of transition metals (e.g., titanium or tantalum) or conductive metal nitrides (e.g., titanium nitride or tantalum nitride). In example embodiments, before forming the common source plug 166, the common source region 152 may be heavily doped with impurities (e.g., n-type impurities).

Figure 17A:
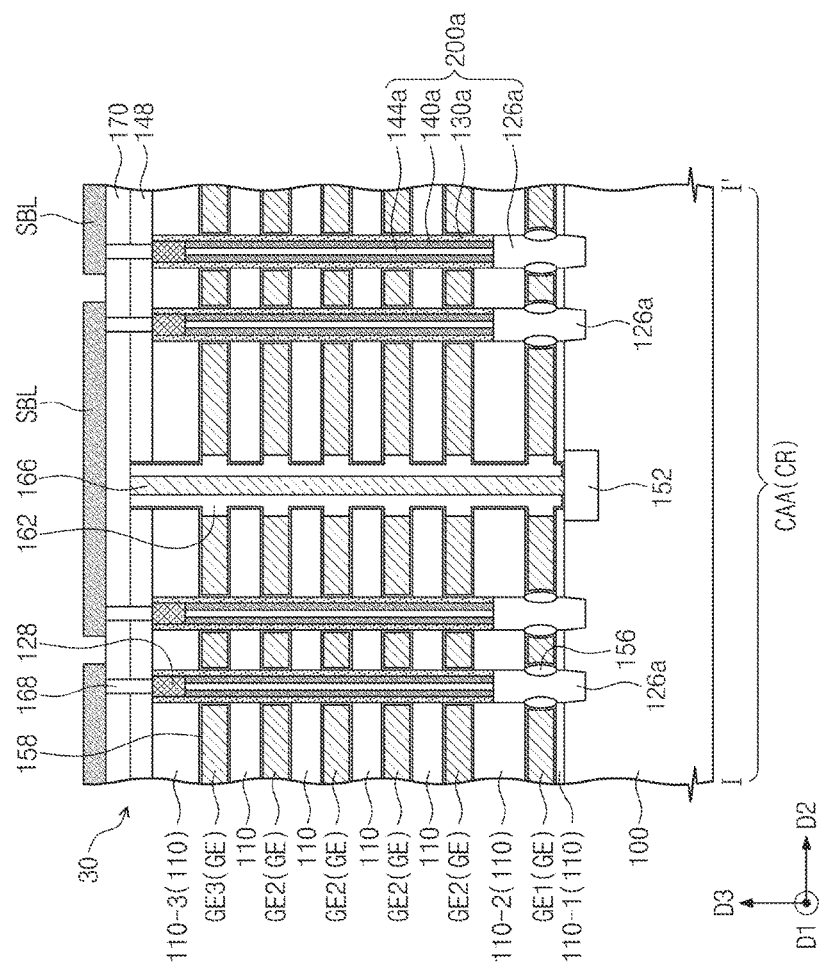
Figure 17B:
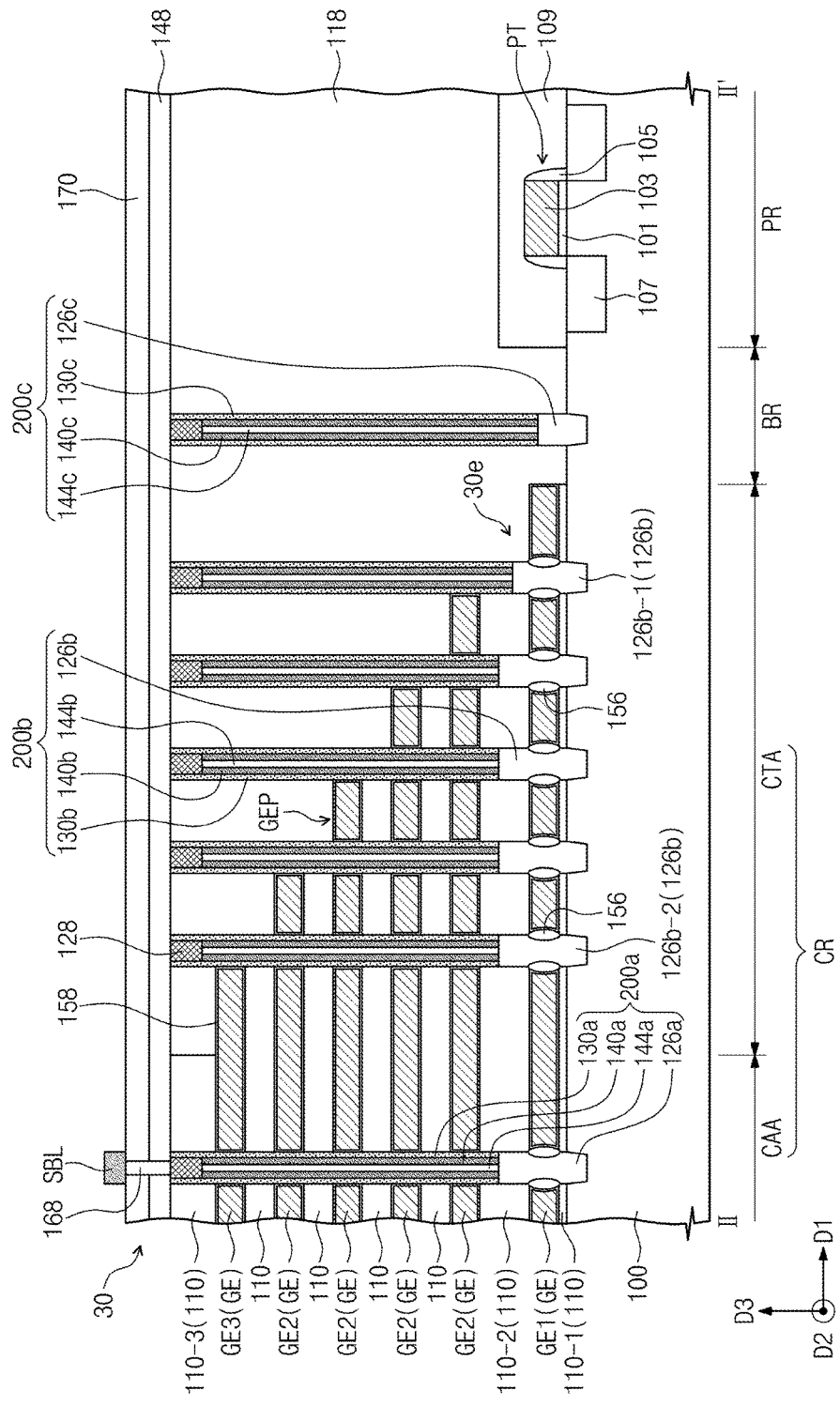

Referring to FIGS. 17A and 17B, sub bit line contacts 168 and sub bit line SBL may be formed on the cell array region CAA. The sub bit line contacts 168 may be formed to be electrically connected to the cell channel structures 200a, and the sub bit line SBL may be formed to be electrically to the sub bit line contacts 168.

A first interlayer insulating layer 170 may be formed on the capping insulating layer 148. The first interlayer insulating layer 170 may be formed of, for example, oxide, a low-k dielectric material, or nitride. The sub bit line contacts 168 may be formed to penetrate the first interlayer insulating layer 170 and the capping insulating layer 148 and be in contact with the conductive pads 128.

The formation of the sub bit line contacts 168 may include forming contact holes in the first interlayer insulating layer 170 and the capping insulating layer 148 to expose the conductive pads 128, depositing a conductive layer in the contact holes, and then planarizing the conductive layer.

The sub bit lines SBL electrically connected to the sub bit line contacts 168 may be formed on the first interlayer insulating layer 170. Each of the sub bit lines SBL may connect a pair of sub bit line contacts 168 connected to a pair of the cell channel structures 200a that are opposed to each other in the second direction D2 and are separated from each other by the trench 150 as illustrated in FIG. 2A. Each of the sub bit lines SBL may extend in the second direction D2. Each of the sub bit lines SBL and each of the sub bit line contacts 168 may be formed of conductive material (e.g., silicon, tungsten, or copper). In addition, each of the sub bit lines SBL and each of the sub bit line contacts 168 may further include barrier metal layer. which may be include or formed of at least one of transition metal (e.g., titanium, or tantalum) and/or conductive metal nitride (e.g., titanium nitride, or tantalum nitride)

Figure 18A:
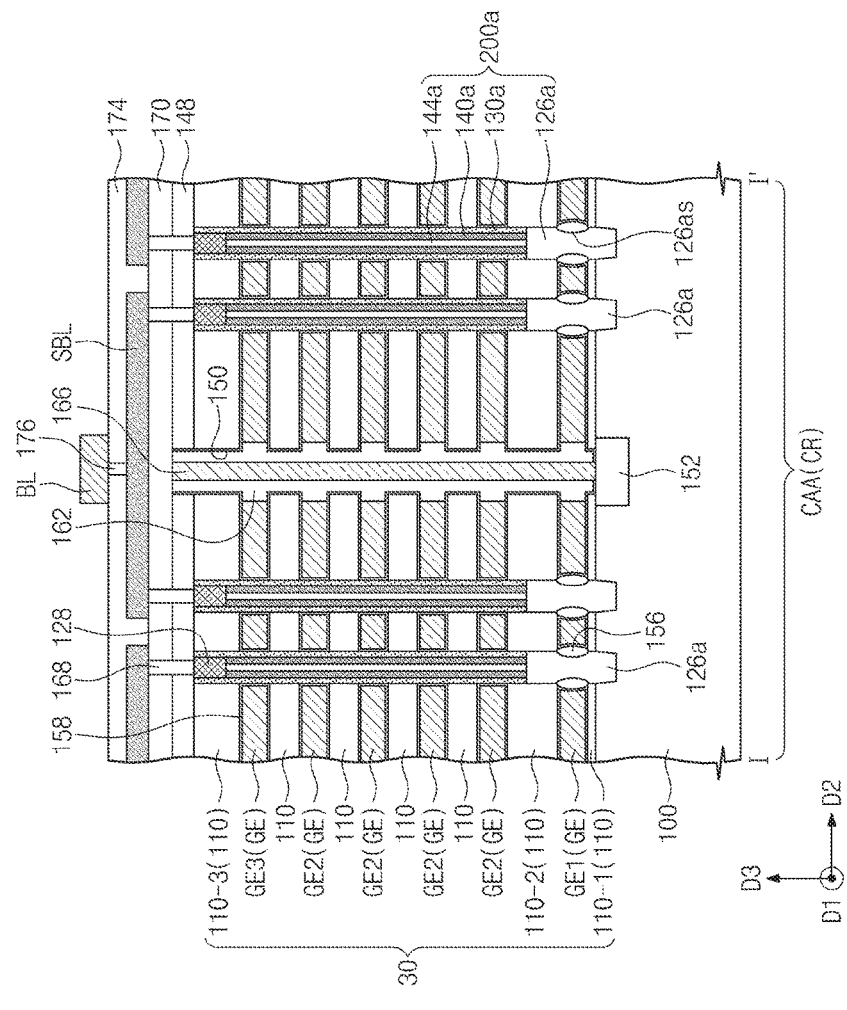
Figure 18B:
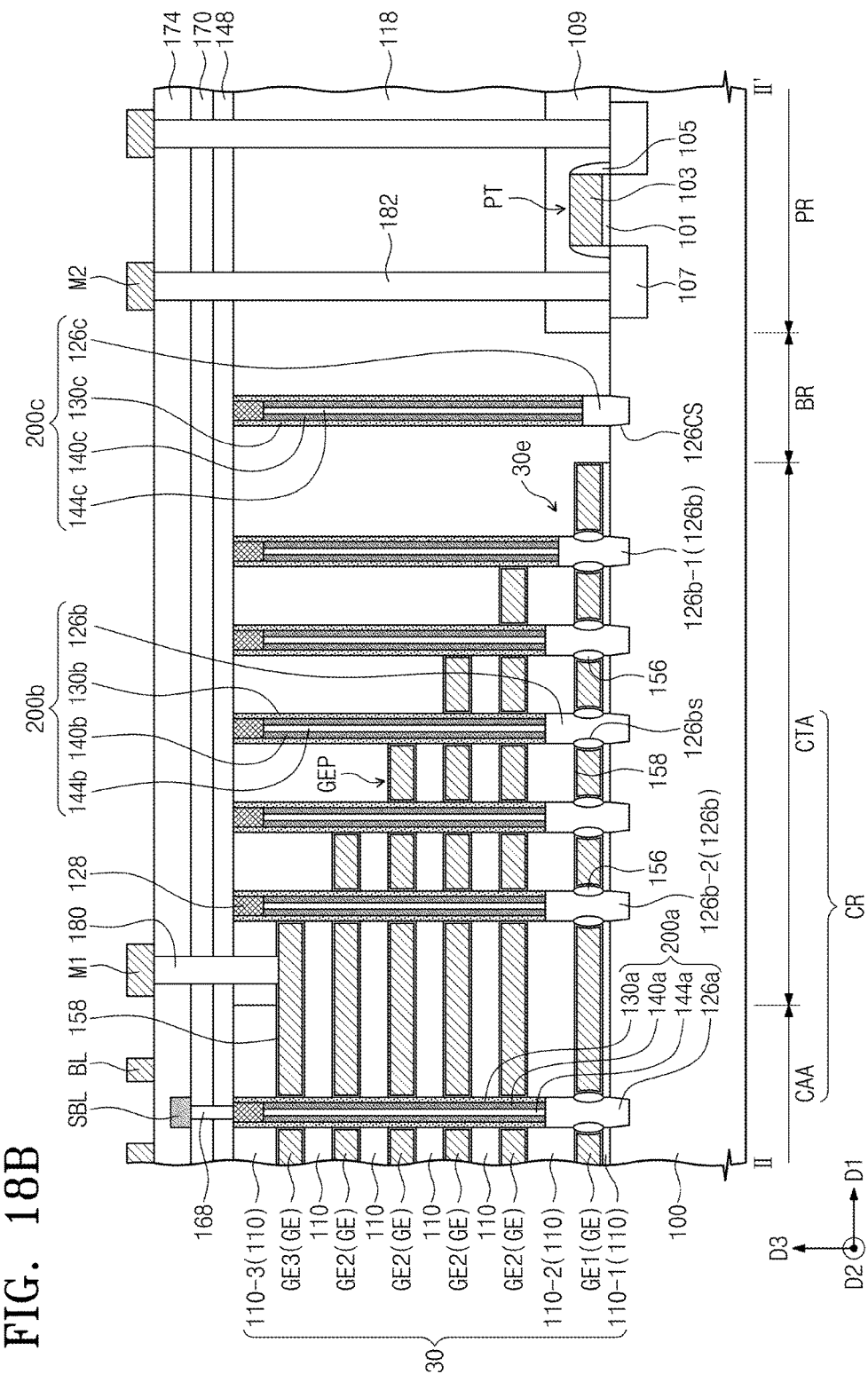
Figure 19A:
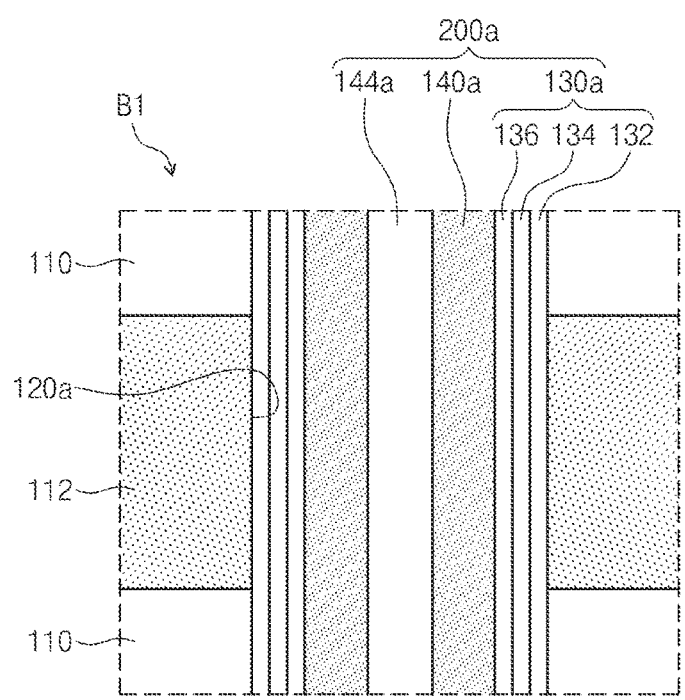
FIGS. 19A through 19C are enlarged sectional views of a portion B1 of FIG. 12A, a portion B2 of FIG. 12B, and a portion B3 of FIG. 12B, respectively.
Figure 19B:
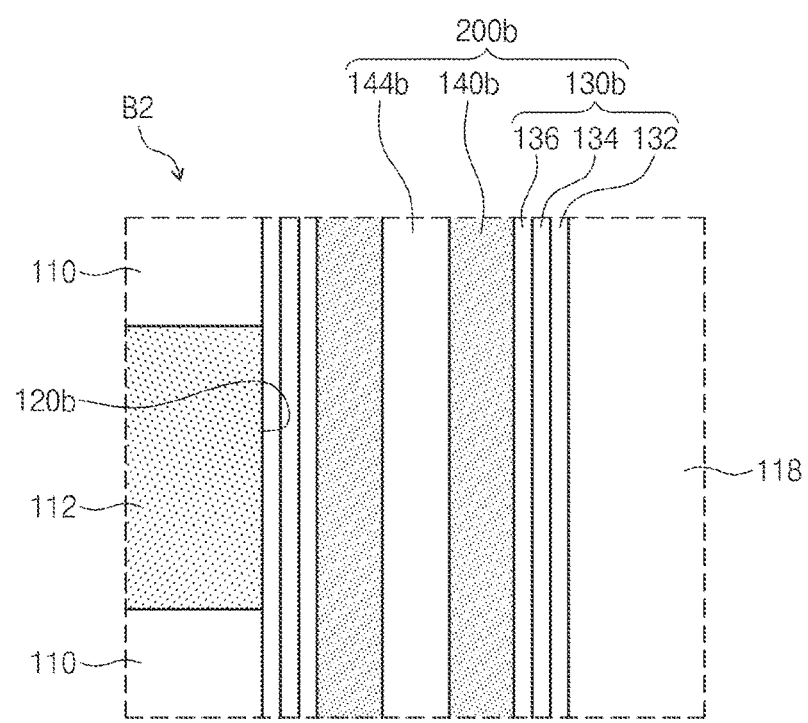
Figure 19C:
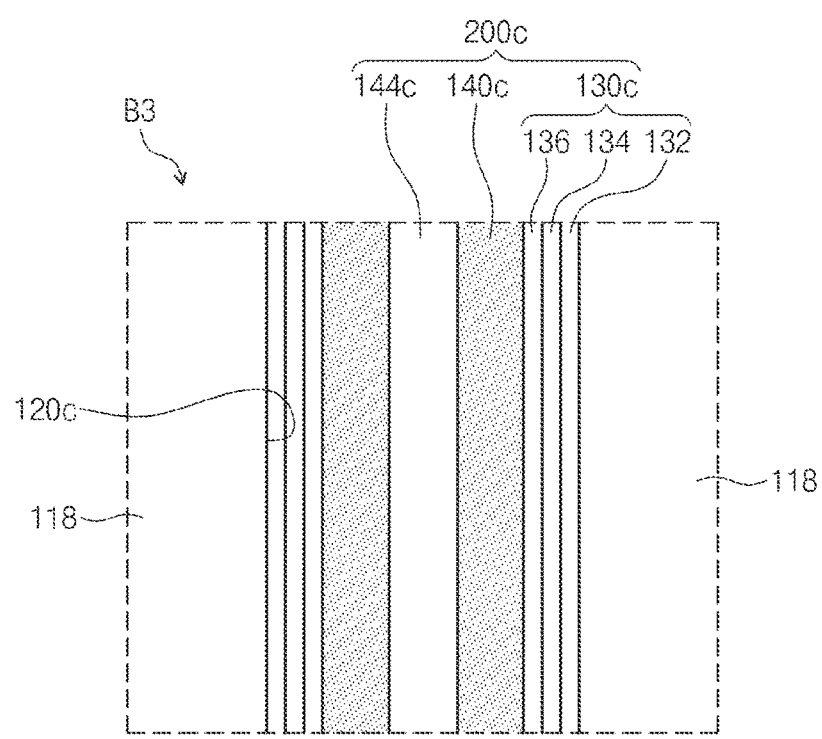

Referring to FIGS. 18A and 18B, the bit line contacts 176 may be formed on the cell array region CAA. The gate contacts 180 and first interconnection layers M1 may be formed on the connection region CTA. The peripheral contacts 182 and second interconnection layers M2 may be formed on the peripheral region PR.

A second interlayer insulating layer 174 may be formed on the first interlayer insulating layer 170 to cover the sub bit lines SBL. The second interlayer insulating layer 174 may be formed of, oxide, low-k dielectric material, or nitride. The gate contacts 180 may be formed on the connection region CTA to penetrate the second interlayer insulating layer 174, the first interlayer insulating layer 170, the mold insulating layer 118, and the second blocking insulating layer 158. In example embodiments, the gate contacts 180 may be formed on the connection region CTA to penetrate the second interlayer insulating layer 174, the first interlayer insulating layer 170, the mold insulating layer 118, the insulating layer 110, and the second blocking insulating layer 158. Each of the gate contacts 180 may be in contact with the pad part GEP of a corresponding one of the gate electrodes GE. A height of each of the gate contacts 180 may increase in a direction close to the boundary region BR in the first direction D1.

The peripheral contacts 182 may be formed on the peripheral region PR to penetrate the second interlayer insulating layer 174, the first interlayer insulating layer 170, the mold insulating layer 118, and the peripheral protection layer 109. The peripheral contacts 182 may be in contact with the source/drain regions 107 of the peripheral circuit device PT.

Each of the gate contacts 180 and each of the peripheral contacts 182 may be formed of conductive material (e.g., silicon, tungsten, or copper). In addition, each of the gate contacts 180 and each of the peripheral contacts 182 may include barrier metal layer, which may be include or formed of at least one of transition metal (e.g., titanium, or tantalum) and/or conductive metal nitride (e.g., titanium nitride, or tantalum nitride)

Bit lines BL may be formed on the second interlayer insulating layer 174. The bit lines BL may be in contact with bit line contacts 176 which may be formed to penetrate the second interlayer insulating layer 174 and to be in contact with the sub bit lines SBL. The bit lines BL may extend in the second direction D2, respectively. The bit lines BL may be electrically connected to the cell channel structures 200a.

The first interconnection layers M1 may be formed on the connection region CTA to electrically connect the gate contacts 180. The first interconnection layers M1 may electrically connect the gate electrodes GE which are positioned at the same level. In example embodiments, the first interconnection layers M1 electrically connected to the lowermost gate electrodes GE may not be connected to each other.

The second interconnection layers M2 may be formed on the peripheral region PR to be electrically connected to the peripheral contacts 182. The second interconnection layers M2 may be electrically connected to the first interconnection layers M1 and/or the bit lines BL. The bit lines BL and the first and second interconnection layers M1, M2 may be formed of or include metal (e.g., aluminum, or copper)

The first and second dummy channel structures 200b, 200c may not be electrically connected to the bit lines BL and the first and second interconnection layers M1, M2. That is, the first and second dummy channel structures 200b, 200c may be electrically isolated.

Figure 20:
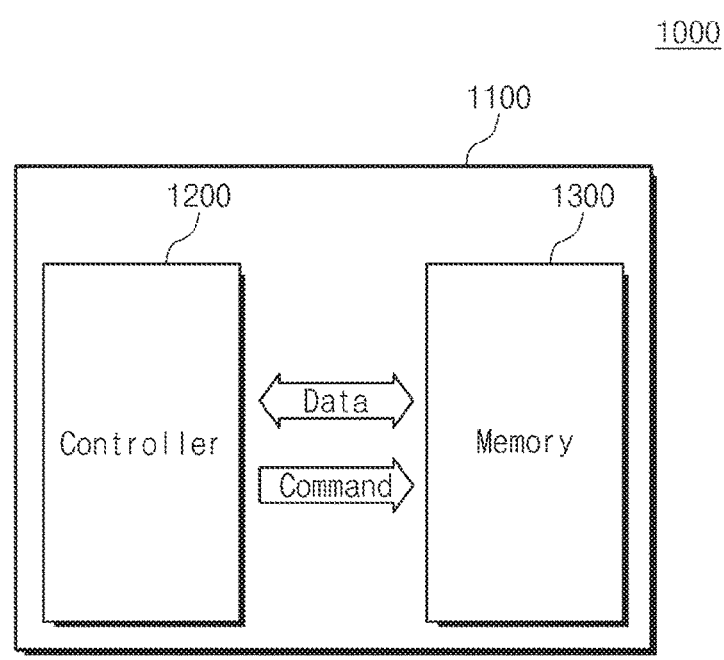
FIG. 20 is a schematic block diagram illustrating an example of memory systems including a memory device according to example embodiments of inventive concepts.

FIG. 20 is a schematic block diagram illustrating an example of memory system including a semiconductor memory device according to example embodiments of inventive concepts.

Referring to FIG. 20, a memory system 1000 may be configured to store data in at least one semiconductor device. For example, the memory system 1000 may be provided in the form of a memory card or a solid state drive (SSD). The memory system 1000 may include a controller 1200 and a memory device 1300 provided in a housing 1100. The memory system 1000 may be configured to allow electric signals to be exchanged between the controller 1200 and the memory device 1300. For example, an operation of exchanging data between the memory device 1300 and the controller 1200 may be executed in response to commands from the controller 1200. In other words, the memory system 1000 may be configured to store data in the memory device 1300 or send data stored in the memory device 1300 to the outside thereof. The memory device 1300 may include the semiconductor memory device according to example embodiments of inventive concepts.

Figure 21:
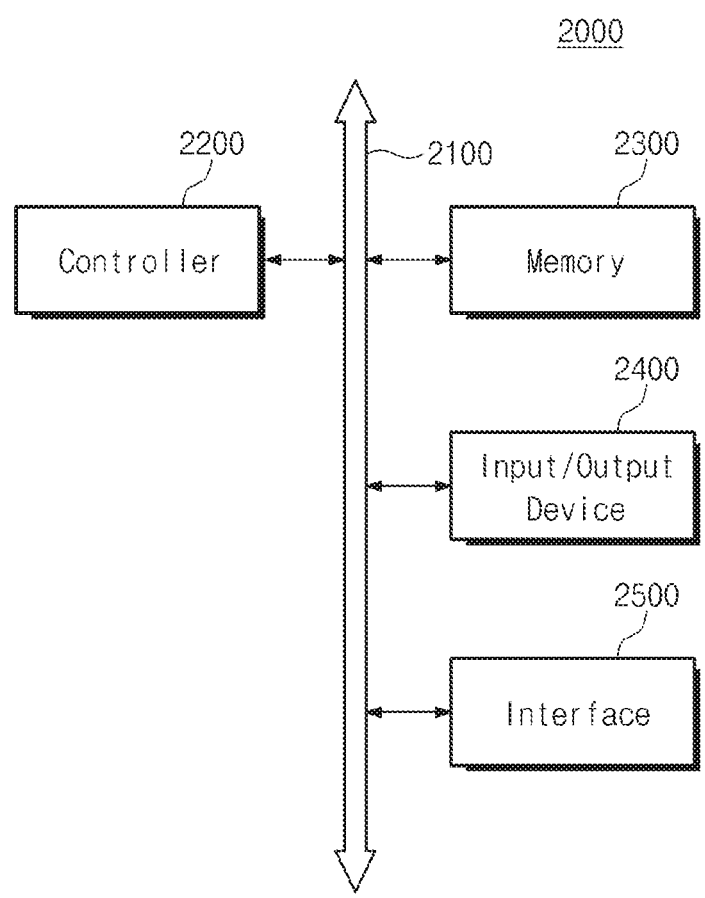
FIG. 21 is a schematic block diagram illustrating an example of electronic systems including a semiconductor memory device according to example embodiments of inventive concepts.

FIG. 21 is a schematic block diagram illustrating an example of electronic systems including a semiconductor memory device according to example embodiments of inventive concepts.

Referring to FIG. 21, an electronic system 2000 may include a controller 2200, a memory device 2300, and an input-output device 2400. The controller 2200, the memory device 2300, and the input-output device 2400 may be electrically coupled or connected to each other via a bus 2100. The bus 2100 may correspond to a path through which electrical signals or data are transmitted. The controller 2200 may include at least one of a microprocessor, a digital signal processor, a microcontroller, or a logic device. The logic device may have a similar function to any one of the microprocessor, the digital signal processor and the microcontroller. The input-output device 2400 may include at least one of a keypad, a keyboard, or a display device. The memory device 2300 may store data and/or commands executed by the controller 2200. The memory device 2300 may include a volatile memory device and/or a nonvolatile memory device. For example, the memory device 2300 may include a FLASH memory device. Alternatively, the memory device 2300 may include a solid state drive (SSD) including, for example, at least one FLASH memory device, and in this case, the electronic system 2000 may stably store a large capacity of data. In certain embodiments, the memory device 2300 may include the semiconductor memory device according to example embodiments of the inventive concept. The electronic system 2000 may further include an interface unit 2500 for transmitting or receiving data to or from a communication network through a wireless or wired way. For example, the interface unit 2500 may include an antenna for wireless communication or a transceiver for wired communication.

According to example embodiments of the inventive concept, first semiconductor patterns of cell channel structures may be formed on a cell array region, second semiconductor patterns of first dummy channel structures may be formed on a connection region, and third semiconductor pattern of second dummy channel structures may be formed on a boundary region. The first through third semiconductor patterns may be formed by epitaxial growth process. Growth of the second semiconductor pattern closest to the third semiconductor pattern may be less affected by impurities outgassing from a mold insulating layer due to a channel hole in which the third semiconductor pattern may be formed. That is, the channel hole for the third semiconductor pattern may serve as an outgassing path of the impurities generated from the mold insulating layer. As a result, the second semiconductor pattern closest to the boundary region may be formed to have a top surface at a level higher than that of a lowermost one of gate electrodes stacked on a substrate. The gate dielectric layer may be properly formed on a sidewall of the second semiconductor pattern without defects. Accordingly, isolation property between the second semiconductor pattern and the lowermost gate electrode may be secured, and thus a leakage current through the second semiconductor pattern may be limited (and/or prevented). Therefore, it is possible to realize a semiconductor memory device with improved reliability and increased integration density.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments of inventive concepts have been particularly shown and described, it will be understood by one of ordinary skill in the art that variations in form and detail may be made therein without departing from the spirit and scope of the attached claims.

What is claimed is:

1. A method of fabricating a semiconductor memory device, comprising:

forming a stack including gate electrodes and insulating layers that are alternately and repeatedly stacked on a cell region of a substrate, the substrate including the cell region, a peripheral region, and a boundary region between the cell region and the peripheral region;

forming a cell channel structure penetrating the stack on the cell region, the cell channel structure including a first semiconductor pattern contacting the substrate and a first channel pattern on the first semiconductor pattern, the first channel pattern contacting the first semiconductor pattern, the first semiconductor pattern extending to a first height from a surface of the substrate to a top surface of the first semiconductor pattern;
forming a mold insulating layer on the peripheral region and the boundary region; and
forming a first dummy channel structure penetrating the mold insulating layer on the boundary region,
the first dummy channel structure being spaced apart from the stack,
the first dummy channel structure including a second semiconductor pattern contacting the substrate and a second channel pattern on the second semiconductor pattern,
the second channel pattern contacting the second semiconductor pattern,
the second semiconductor pattern extending to a second height from the surface of the substrate to a top surface of the second semiconductor pattern, and
the first height being greater than the second height.

2. The method of claim 1, wherein the forming a cell channel structure includes forming a first data storing pattern between the stack and the first channel pattern.

3. The method of claim 2, wherein
the forming a first dummy channel structure includes forming a second data storing pattern between the mold insulating layer and the second channel pattern,
the first channel pattern and the second channel pattern include a same channel material,
the first data storing pattern and the second data storing pattern include a same data storing material.

4. The method of claim 1, wherein
the cell region includes a cell array region and a connection region adjacent to the cell array region,
the stack includes an edge part with a stepwise structure on the connection region, and
the mold insulating layer covers the edge part of the stack.

5. The method of claim 4, further comprising:
forming a second dummy channel structure penetrating the edge part of the stack on the connection region,
wherein the forming the second dummy channel structure includes forming a third semiconductor pattern in contact with the substrate and a third channel pattern on the third semiconductor pattern.

6. The method of claim 1, further comprising:
forming a peripheral circuit device on the peripheral region,
wherein the forming a peripheral circuit device includes forming a peripheral gate insulating layer and a peripheral gate electrode stacked on the substrate and source/drain regions in the substrate adjacent to sidewalls of the peripheral gate electrode.

7. The method of claim 1, further comprising:
forming a gate dielectric layer contacting a sidewall of the first semiconductor pattern,
wherein the gate dielectric layer is not formed adjacent to a sidewall of the second semiconductor pattern.

8. A method of fabricating a semiconductor memory device, the method comprising:
forming a mold structure on a cell region of a substrate,
the mold structure including insulating layers and sacrificial layers that are alternately and repeatedly stacked on the cell region,
the substrate including the cell region, a peripheral region, and a boundary region between the cell region and the peripheral region,
the cell region including a cell array region and a connection region;

forming a mold insulating layer on the connection region, the boundary region, and the peripheral region, the mold insulating layer covering a portion of the mold structure;
forming a cell channel structure penetrating the mold structure on the cell region,
the cell channel structure including a first semiconductor pattern contacting the substrate and a first channel pattern on the first semiconductor pattern,
the first channel pattern contacting the first semiconductor pattern;
forming first dummy channel structures penetrating the mold insulating layer and the mold structure on the connection region,
each of the first dummy channel structures including a second semiconductor pattern contacting the substrate and a second channel pattern on the second semiconductor pattern,
the second channel pattern contacting the second semiconductor pattern; and
forming a second dummy channel structure penetrating the mold insulating layer on the boundary region,
the second dummy channel structure including a third semiconductor pattern contacting the substrate and a third channel pattern on the third semiconductor pattern,
the third channel pattern contacting the third semiconductor pattern; and
forming gate electrodes, wherein the forming gate electrodes includes forming a trench penetrating the mold structure, forming openings by selectively removing the sacrificial layers of the mold structure exposed by the trench, forming a gate conductive layer in the openings, and patterning the gate conductive layer.

9. The method of claim 8, wherein
the first semiconductor pattern extends to a first height from a surface of the substrate to a top surface of the first semiconductor pattern,
the second semiconductor pattern of at least one of the first dummy channel structures adjacent to the third semiconductor pattern further includes a first sub-semiconductor pattern,
the first sub-semiconductor pattern extends to a second height from the surface of the substrate to a top surface of the first sub-semiconductor pattern,
the third semiconductor pattern extends to a third height from the surface of the substrate to a top surface of the third semiconductor pattern,
the second height is smaller than the first height, and
the third height is smaller than the first height.

10. The method of claim 9, wherein
the second semiconductor pattern of at least one of the first dummy channel structures adjacent to the first semiconductor pattern further includes a second sub-semiconductor pattern,
the second sub-semiconductor pattern extends to a fourth height from the surface of the substrate to a top surface of the second sub-semiconductor pattern, and
the fourth height is greater than the second and third heights.

11. The method of claim 8, wherein
the forming a cell channel structure further includes forming a first data storing pattern in contact with a sidewall of the first channel pattern,
the forming first dummy channel structures further includes forming second data storing patterns in contact with sidewalls of the second channel patterns, the forming a second dummy channel structure further includes forming a third data storing pattern in contact with a sidewall of the third channel pattern, the first, second, and third channel patterns are formed of a same channel material and the first, second, and third data storing patterns are formed of a same data storing material.

12. The method of claim 8, further comprising:

forming a plurality of second dummy channel structures, wherein the forming a plurality of second dummy channel structures includes the forming a second dummy channel structure, and the forming a plurality of second dummy channel structures includes forming the plurality of second dummy channel structures arranged in a direction, and the forming a plurality of second dummy channel structures includes forming the second dummy channel structures such that each of the second dummy channel structures has one of a circular shape and an oval shape.

13. The method of claim 8, further comprising:

forming a plurality of second dummy channel structures, wherein the forming the plurality of second dummy channel structures includes the forming a second dummy channel structure, the forming the plurality of second dummy channel structures includes forming the plurality of second dummy channel structures arranged in a direction, and the forming a plurality of second dummy channel structures includes forming the second dummy channel structures such that each of the second dummy channel structures has a bar shape.

14. The method of claim 8, further comprising:

forming a peripheral circuit device on the peripheral region; and forming a peripheral protection layer covering the peripheral circuit device, wherein the forming a peripheral circuit device includes forming a peripheral gate insulating layer on the substrate, forming a peripheral gate electrode on the peripheral gate insulating layer, and forming source/drain regions in the substrate adjacent to both sidewalls of the peripheral gate electrode, and the forming a mold insulating layer includes forming the mold insulating layer such that the mold insulating layer covers the peripheral protection layer.

15. The method of claim 8, further comprising:

forming a gate dielectric layer contacting sidewalls of the first and second semiconductor patterns, wherein the gate dielectric layer is not adjacent to a sidewall of the third semiconductor pattern.

* * * * *